United States Patent [19]
Noguchi et al.

[11] Patent Number: 5,793,316
[45] Date of Patent: Aug. 11, 1998

[54] DIGITAL SIGNAL PROCESSING METHOD AND APPARATUS

[75] Inventors: Masayoshi Noguchi, Chiba; Gen Ichimura, Tokyo, both of Japan

[73] Assignee: Sony Corporation, Tokyo, Japan

[21] Appl. No.: 770,042

[22] Filed: Dec. 19, 1996

[30] Foreign Application Priority Data

| Dec. 27, 1995 | [JP] | Japan | 7-341965 |
| Mar. 14, 1996 | [JP] | Japan | 7-057999 |
| Jul. 5, 1996 | [JP] | Japan | 7-176901 |

[51] Int. Cl.$^6$ .................................................. H03M 7/32
[52] U.S. Cl. .............................. 341/77; 341/143; 341/141
[58] Field of Search .................................... 341/143, 141, 341/77

[56] References Cited

U.S. PATENT DOCUMENTS

| 5,231,636 | 7/1993 | Rasmussen | 370/100.1 |
| 5,345,233 | 9/1994 | Nagata et al. | 341/76 |
| 5,627,536 | 5/1997 | Ramirez | 341/141 |

Primary Examiner—Jeffrey A. Gaffin
Assistant Examiner—Jason L. W. Kost
Attorney, Agent, or Firm—Jay H. Maioli

[57] ABSTRACT

A digital signal processing method and apparatus in which no noise is produced when switching between an original sigma-delta modulated signal and a sigma-delta re-modulated signal obtained on sigma-delta modulation of the original sigma-delta modulated signal. In a digital signal processing device 1a, delay line 3 delays the original sigma-delta modulated signal from an input terminal 2 by a pre-set number of samples. A sigma-delta modulator 6 sets the first-stage feedback loop to next stage feedback loop gain ratio to an integer and outputs a sigma-delta re-modulated signal. A bit length converter 5 matcthes the amplitude level of the original sigma-delta modulated signal entering the sigma-delta modulator 6 to the amplitude level of a feedback signal to a first-stage integrator employed in the sigma-delta modulator 6. On reception of a switching control signal $S_D$ from an input terminal 7, the digital signal processing device 1 causes a pattern coincidence detector 28 to detect pattern coincidence between the original 1-bit signal $S_A$ delayed by the delay line 3, having a number of taps corresponding to the gain ratio, and a sigma-delta re-modulated 1-bit signal $S_B$, to output a detection signal $S_T$. This allows a switching controller 29 to control switching of a changeover switch 4 to output a signal changed over from $S_A$ to $S_B$ at an output terminal 8.

39 Claims, 48 Drawing Sheets

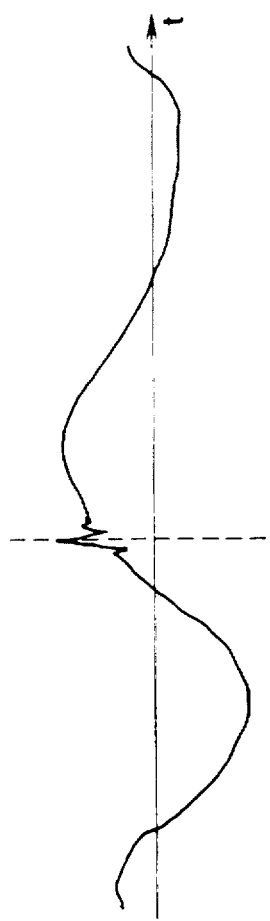
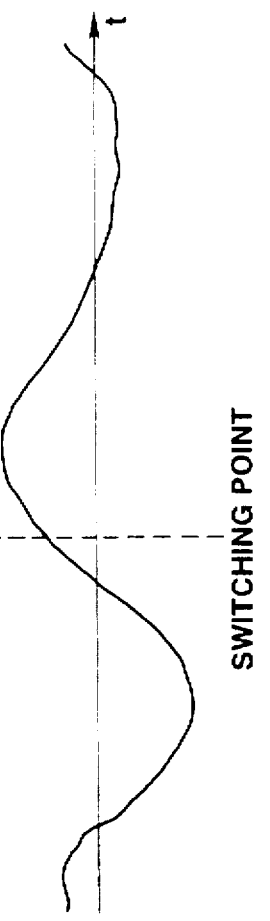
FIG.11A ANALOG DEMODULATED WAVEFORM
FIG.11B ANALOG DEMODULATED WAVEFORM
SWITCHING POINT 5,793,316

1

DIGITAL SIGNAL PROCESSING METHOD AND APPARATUS

BACKGROUND OF The INVENTION

1. Field of the Invention

This invention relates to a digital signal processing method and apparatus for switching between a sigma-delta modulation signal as an input signal produced by sigma-delta modulation, and sigma-delta re-modulated signal obtained on sigma-delta re-modulation of the input signal.

2. Description of the Related Art

For example, a method of digitizing speech signals for recording, reproduction and transmission is implemented in a recording/reproducing apparatus for a disc-shaped recording medium, including an optical disc, such as a compact disc (CD), or a digital audio tape (DAT), or in digital broadcasting, such as satellite broadcasting. In such digital audio transmission apparatus, the format has conventionally been set for the sampling frequency of 48 kHz or 44.1 kHz and the number of quantization bits of 16 or 24 bits for digitization.

In such conventional digital-audio transmission apparatus, the number of quantization bits of digital audio data prescribes the dynamic range of demodulated audio signals. Thus, for transmitting the audio signals of higher signal quality, the number of quantization bits needs to be expanded from 16 bits for the current system to 20 or 24 bits. However, once the format has been set, the number of quantization bits can hardly be increased, so that it has been difficult to take out audio signals of higher quality from the conventional digital-audio transmission apparatus.

As a method for digitizing speech signals, a method termed sigma-delta (ΣΔ) conversion has been proposed (see Yoshio Yamazaki, "AD/DA converter and Digital Filter", Journal of Japan Society of Acoustics, Vol.46, No.3 (1990), pp.251–257).

FIG. 1 shows, in a block diagram, a ΣΔ modulation circuit for ΣΔ modulation of, for example, 1-bit digital data. In FIG. 1, an input audio signal from an input terminal 181 is supplied via an adder 182 to an integrator 183. A signal from the integrator 183 is supplied to a comparator 184 where it is compared to, for example, a neutral point potential of the input audio signal for effecting one-bit quantization every sampling period. Meanwhile, the frequency of the sampling period (sampling frequency), conventionally employed is 64 or 128 times 48 kHz or 44.1 kHz.

The quantized data is supplied to a 1-sample delay unit 185 so as to be delayed one sampling period. This delayed data is converted by, for example, a one-bit D/A converter 186 into analog signals which are then sent to an adder 182 so as to be added to the input audio signal from the input terminal 181. The comparator 184 outputs quantized data which is outputted at an output terminal 187. Thus, with the ΣΔ modulation performed by the ΣΔ modulation circuit, a high dynamic range audio signal can be obtained with a smaller number of bits, such as 1 bit, by sufficiently raising the sampling frequency, as explained in the above publication. Moreover, a broad transmission frequency can be realized. In addition, the ΣΔ modulation circuit has a circuit structure that is suited to integration, and high precision in A/D conversion can be realized relatively easily, so that it has hitherto been used widely in an A/D converter. The ΣΔ modulated signal can be restored to the analog audio signal by being passed through a simple analog low-pass filter. By exploiting these characteristics, the ΣΔ modulation circuit can be applied to a recorder handling high-quality data or to data transmission.

Meanwhile, with the digital audio transmission apparatus employing the above-described ΣΔ modulation circuit, signal processing in the amplitude direction, as a sort of the amplitude control operation, such as fading, equalizing, filtering, cross-fading or mixing, that has been possible with the aforementioned digital audio transmission apparatus handling multi-bit digital signal, such as a 16-bit digital signal (multi-bit digital audio transmission apparatus), cannot be realized with the original bit length, such that favorable properties, such as broad range and high dynamic range, cannot be used advantageously.

Among the fading operations, there are a fade-out operation of gradually lowering the reproduced signal level as time elapses, and a fade-in operation of gradually raising the audio signal level from a zero level. These fading operations are customary as signal processing in the direction of the amplitude of the audio signal.

Referring to FIG. 2, the above fading operation, carried out on the above multi-bit digital audio transmission apparatus, is explained by referring to FIG. 2. Referring to FIG. 2, the multi-bit digital audio signal, such as 16-bit signal, from an input terminal 191, is outputted at an output terminal 193 via a multiplier 192. If a control signal designating the fading start timing or the fading speed is supplied to a control terminal 194, this control signal is fed to a control circuit 195 for generating a desired fading signal. This fading signal is fed to a coefficient generator 196 for generating a coefficient which gradually lowers the audio signal level to zero. This coefficient is supplied to the multiplier 192.

Thus the digital speech signal, supplied to the input terminal 191, has its signal level gradually lowered at a designated speed by a control signal as from the timing designated until it is muted to a zero level, so as to be outputted at the output terminal 193, by way of performing the fade-out operation. The fade-in operation of gradually raising the speech signal level from the zero level may also be effected by reversing the sequence of generation of the coefficients.

However, this processing cannot be performed on the ΣΔ-modulated digital speech signal. That is, with the ΣΔ-modulated 1-bit signal, the amplitude information is also represented as a 1-bit pattern on the time axis, such that it has been difficult to multiply the amplitude by the multiplier 192 and to perform amplitude processing on the 1-bit basis.

It may be contemplated to convert the ΣΔ signal into signals of the CD or DAT format, using a low-pass filter, and to perform the above fading operation on the converted signal. That is, in FIG. 3, a 1-bit ΣΔ signal, for example, is fed via an input terminal 201 to a low-pass filter 202 for conversion into, for example, 16-bit multi-bit speech signal. This converted digital speech signal is sent to a multiplier 203.

Also a control signal designating the fading starting timing or fading speed is fed to a control input terminal 204 and thence supplied to a control circuit 205 for generating a desired fading signal. By this fading signal supplied to a coefficient generator 206, there is generated a coefficient gradually lowering the speech signal level to zero. This coefficient is sent to the multiplier 203.

In this manner, the multi-bit digital audio signal from the low-pass filter 202, the signal level of which has been controlled by the coefficient from the coefficient generator 206, is taken out at the multiplier 203. This digital audio signal is further sent to a ΣΔ modulator 207 for re-conversion into, for example, a 1-bit ΣΔ signal which is outputted at an output terminal 208.

Thus, the ΣΔ signal from the input terminal 201, the level of which has been gradually lowered to the zero level at the designated speed from the timing designated by the control signal, is outputted at the output terminal 208 by way of performing the fade-out operation. The fade-in operation of gradually raising the speech signal level from the zero level may also be performed by reversing the sequence of coefficient generation. Thus it is possible with the present device to perform fading by the same method as the conventional method.

Meanwhile, if such device is used, the ΣΔ signal, supplied to the input terminal 201, is converted at all times into, for example, a 16-bit multi-bit digital speech signal by the low-pass filter 202. That is, with the above device, the ΣΔ signal is passed through the low-pass filter 202 and the ΣΔ modulator 207 even if the signal has not been processed with fading. Thus the signal characteristics become the same as those with the conventional CD or DAT, such that it becomes impossible to exploit characteristics proper to ΣΔ modulation, such as broad band and high dynamic range.

The fading operation can be done by directly supplying the ΣΔ signal supplied to the input terminal 201 to the ΣΔ modulator 207, without passing the ΣΔ signal through the low-pass filter 202. However, in this case, the signal is passed through the ΣΔ modulator 207 if it is not processed with fading, such that it becomes similarly impossible to exploit characteristics proper to ΣΔ modulation, such as broad band and high dynamic range.

Thus, as shown in FIG. 4 it has been contemplated to take out the original ΣΔ signal supplied to a fixed terminal A of a switch 217 at an output terminal 218 and to take out the ΣΔ signal modulated by a ΣΔ modulator 216 and thence supplied to a fixed terminal B of the switch 217 at the output terminal 218 when the amplitude processing such as fading is not done and when the amplitude processing is done, respectively.

However, the above two ΣΔ signals, switched by the switch 217, are signals modulated on the time axis by different ΣΔ modulators, even though the two signals have substantially the same analog audio signal components, so that, if the signals are switched directly, significant noise is generated at the switching point, thus rendering the device practically unusable.

SUMMARY OF THE INVENTION

It is therefore an object of the present invention to provide a digital signal processing method and apparatus whereby the noise can be suppressed at the time of switching between the original sigma-delta modulated signal and the sigma-delta re-modulated signal obtained on sigma-delta re-modulating the original sigma-delta modulated signal.

In one aspect, the present invention provides a digital signal processing apparatus for switching between a delayed sigma-delta modulated signal, obtained on delaying a sigma-delta modulated signal, as an input signal obtained by sigma-delta modulation, and a sigma-delta re-modulated signal obtained on sigma-delta re-modulation the input signal. The device includes input signal delaying means for delaying the sigma-delta modulated signal, as the input signal, by a pre-set number of samples, for outputting the delayed sigma-delta modulated signal, sigma-delta modulation processing means having a plurality of integrators for outputting the sigma-delta re-modulated signal, level adjustment means for matching the amplitude level of the sigma-delta modulated signal entering the sigma-delta modulation processing means to the amplitude level of a feedback signal to a first-stage integrator employed in the sigma-delta modulation processing means, and switching control means for controlling the switching by the switching means. This arrangement realizes switching in a manner free from noise.

The signal-delta modulation means sets the first stage feedback loop/second stage feedback loop gain ratio to an integer value. The input signal delaying means determines the pre-set number of samples based on the above gain ratio.

The digital signal processing device also includes pattern coincidence detection means for detection of coincidence of the delayed sigma-delta modulated signal and the sigma-delta re-modulated signal over a plurality of samples. The switching control means controls the switching means based on the result of detection obtained by the pattern coincidence detection means. This realizes switching with more reliable noise suppression.

Also, the digital signal processing device sets the initial value of the integrator of the signal-delta modulation means to zero by the switching control means immediately before input of the input signal and/or during the time the delay signals from the first and second input signal delaying means are selected by switching. This realizes switching with still more reliable noise suppression.

The digital signal processing device also includes amplitude controlling means for controlling the amplitude level of a level adjusted signal having the amplitude level adjusted by the level adjustment means. The switching control means causes the amplitude control means to control the amplitude level of the level-adjusted signal after causing the switching means to switch from the delayed sigma-delta modulated signal from the input signal delaying means to the sigma-delta re-modulated signal obtained on sigma-delta modulation of the level adjusted signal.

The digital signal processing device also includes amplitude controlling means for controlling the amplitude level of the level adjusted signal having its amplitude level adjusted by the level adjustment means, level difference detection means for detecting the difference between the maximum amplitude level of the level-adjusted signal and the amplitude level of the output following amplitude control during the time the amplitude controlling means is controlling the amplitude level of the level-adjusted signal, cumulative addition means for cumulatively adding the level difference from the level difference detection means with a maximum amplitude level width length equal to twice the maximum amplitude level of the level-adjusted signal, and subtraction control means for gradually subtracting the cumulative sum of the cumulative addition means from the maximum amplitude level of the level adjusted signal after the amplitude control in the amplitude controlling means. The switching control means causes the switching means to switch from the sigma-delta modulated signal to the delayed sigma-delta modulated signal after the end of subtraction of the cumulative sum in the subtraction control means.

The digital signal processing device of the present invention also includes error detection means for detecting an uncorrectable burst error in the sigma-delta modulated signal, delaying means provided downstream of the error detection means for delaying the sigma-delta modulated signal, fade-out means for fading out the sigma-delta modulated signal via the delay means, fade-in means for fading in the sigma-delta modulated signal via the delay means, and control means for causing the fade-out means to fade out the sigma-delta modulated signal delayed by the delaying means up to directly before an uncorrectable burst error immediately to a zero level if the detection means detects such uncorrectable burst error in the sigma-delta modulated signal. The control means causes the fade-in means to fade in the sigma-delta modulated signal directly after the burst error up to the maximum amplitude level. This arrangement realizes muting processing in which the signal level on occurrence of burst error may be reduced to zero for noise suppression.

The sigma-delta modulation processing means of the digital signal processing device includes plural stages of serially connected integrators and a local feedback loop for feeding back outputs of the plural stages of the integrators to inputs of preceding stage integrators. This renders it possible to reduce noise components to assure a broad dynamic range in an audible band.

The digital signal processing device according to the present invention also includes a digital signal processing device for causing switching means to switch between two-channel sigma-delta modulated signal, as an input signal obtained by two-channel sigma-delta modulation processing, and a sigma-delta re-modulated signal derived from the input signal. The digital signal processing device includes sigma-delta modulation processing means having a plurality of integrators for outputting the sigma-delta re-modulated signal, first input signal delaying means for delaying sigma-delta modulated signal of one of the two channels by a pre-set number of samples for outputting a first delayed sigma-delta modulated signal, first level adjustment means for matching the amplitude level of the sigma-delta modulated signal to the amplitude level of the feedback signal to a first-stage integrator employed in the sigma-delta modulation processing means, sigma-delta modulation processing means having a plurality of integrators for outputting the sigma-delta re-modulated signal, first input signal delaying means for delaying sigma-delta modulated signal of one of the two channels by a pre-set number of samples for outputting a first delayed sigma-delta modulated signal, first level adjustment means for matching the amplitude level of the sigma-delta modulated signal to the amplitude level of the feedback signal to a first-stage integrator employed in the sigma-delta modulation processing means, and second amplitude control means for controlling the amplitude level of the second level-adjusted signal having the amplitude level adjusted by the second level adjustment means, amplitude control output adjustment means for adjusting outputs of the first amplitude control means and the second amplitude control means, and switching control means for controlling the first amplitude control means, second amplitude control means, sigma-delta modulation processing means, amplitude control output adjustment means and the switching means. After switching from the first sigma-delta modulated signal to the delta re-modulated signal, the switching control means causes the first amplitude control means, second amplitude control means and the amplitude control output adjustment means to control amplitude levels of the sigma-delta modulated signal and the other sigma-delta modulated signal. This arrangement enables the sound cross-faded from the original audio signal of the first channel to the original audio signal of the second channel to be produced under effective noise suppression.

The sigma-delta modulation processing means sets the first stage feedback loop/second stage feedback loop gain ratio to an integer. The input signal delaying means determines the pre-set number of the samples based on the above gain ratio.

The digital signal processing device also includes pattern coincidence detection means for detecting the coincidence of the first delayed sigma-delta modulated signal and the sigma-delta re-modulated signal over a plurality of samples and for detecting the coincidence of the second delayed sigma-delta modulated signal and the sigma-delta re-modulated signal over a plurality of samples. The first delayed sigma-delta modulated signal is switched to the sigma-delta re-modulated signal or vice versa based on a control signal obtained by the pattern coincidence detection means, while the second delayed sigma-delta modulated signal is switched to the sigma-delta re-modulated signal or vice versa based on the control signal obtained by the pattern coincidence detection means.

The digital signal processing device causes the switching control means to set the initial value of the integrator of the sigma-delta modulation processing means to zero directly before input of the input signal and/or during the time the delayed signal from the first and second input signal delaying means is selected by switching by the switching means.

The sigma-delta modulation processing means of the digital signal processing device includes plural stages of serially connected integrators and a local feedback loop for feeding back outputs of the plural stages of the integrators to inputs of preceding stage integrators.

The amplitude control output adjustment means of the digital signal processing device also includes subtraction means for subtracting a pre-set value from an output signal obtained by the first and second amplitude control means.

When providing limiter means in the integrator of the sigma-delta modulation processing means for limiting the integrated value, the limiting value of the limiter means is set to an integer number times the maximum amplitude level width.

Muting pattern signal generating means is provided in one of the above-mentioned two channels.

In the digital signal processing method according to the present invention, switching between a delayed sigma-delta modulated signal obtained on delaying a sigma-delta modulated signal as an input signal obtained on sigma-delta modulation processing and a sigma-delta re-modulated signal obtained on second sigma-delta conversion processing on the input signal is done by a switching step. This realizes switching in a manner free from noise generation.

The digital signal processing method according to the present invention includes an amplitude controlling step of controlling the amplitude level of the level-adjusted signal having its amplitude level adjusted by the level adjustment step. The switching control step causes the switching step to switch the sigma-delta modulated signal from the input signal delaying step to the sigma-delta re-modulated signal obtained on sigma-delta modulation of the level-adjusted signal. The switching control step then causes the amplitude control step to control the amplitude of the level-adjusted signal. This realized switching between the amplitude-controlled sigma-delta signal and the original 1-bit signal free from deterioration in the sound quality in through-time.

The digital signal processing method according to the present invention first causes the switching control step to switch from the first delayed input signal to the sigma-delta re-modulated signal and then controls the operation of the first and second amplitude control steps for effecting cross-fading amplitude-control of the sigma-delta modulated signal and the other sigma-delta modulated signal, thus realizing cross-fading with minimum sound quality deterioration and suppression of the switching noise.

BRIEF DESCRIPTION OF THE DRAWINGS

FIGS. 11A, 11B are waveform diagrams for illustrating the effect of the first embodiment of FIG. 5.

DESCRIPTION OF THE PREFERRED EMBODIMENTS

Figure 1:
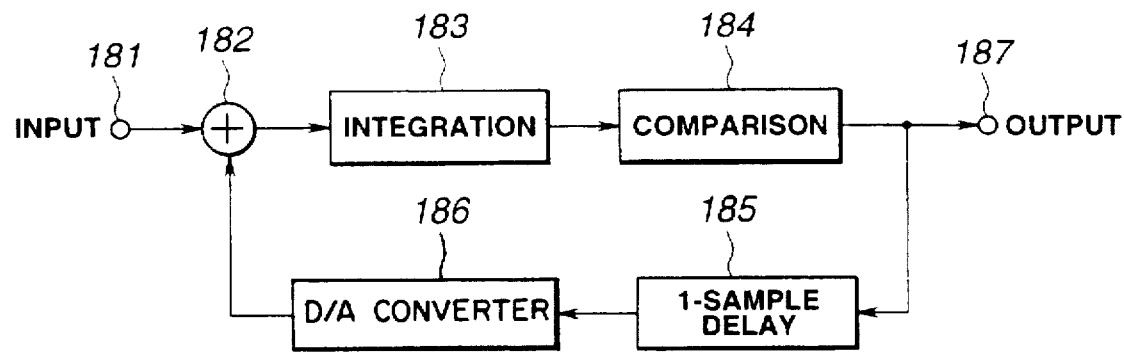
FIG. 1 s a block diagram showing an arrangement of a digital ΣΔ modulator.

Referring to the drawings, certain preferred embodiments of the digital signal processing method and apparatus of the present invention will be explained in detail.

Figure 5:
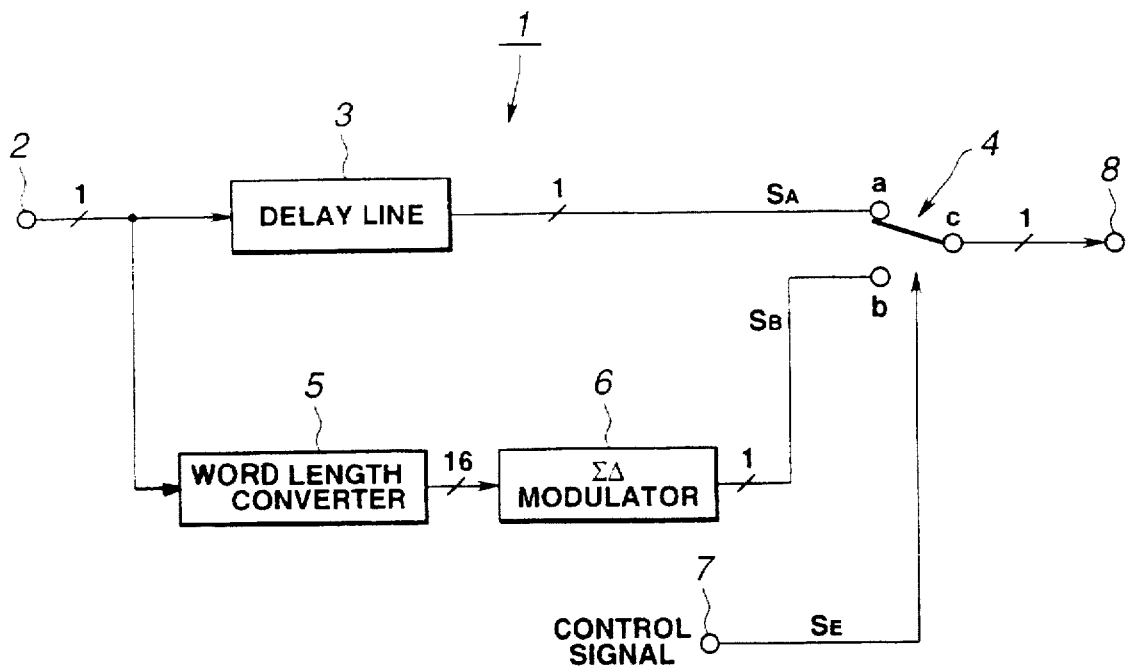
FIG. 5 is a block diagram of a first embodiment of the digital signal processing method and apparatus according to the present invention.

Referring to FIGS. 5 to 11, a first embodiment of the present invention is explained. The present first embodiment is directed to a digital signal processing device 1 configured for switching between a $\Sigma\Delta$ modulated signal $S_A$, as an input signal obtained on sigma-delta ($\Sigma\Delta$) modulation, and a $\Sigma\Delta$ re-modulated signal $S_B$, obtained on $\Sigma\Delta$ re-modulation on the input signal, by a changeover switch 4, as shown in FIG. 5.

The digital signal processing device 1 includes a delay line 3 for delaying the original $\Sigma\Delta$ modulated signal from the input terminal 2 a pre-set number of samples, and a $\Sigma\Delta$ modulator 6 having five integrators and configured for outputting the above $\Sigma\Delta$ re-modulated signal with the gain ratio between the gain of the initial stage feedback loop and the gain of the next stage feedback loop set to 16. The digital signal processing device 1 also includes a word length converter 5 for matching the amplitude level of the original $\Sigma\Delta$ modulated signal entering the $\Sigma\Delta$ modulator 6 to that of the feedback signal to the initial stage integrator employed in the $\Sigma\Delta$ modulator 6. The switching operation of the changeover switch 4 is controlled depending on a changeover control signal SE supplied from a control signal input terminal 7 for outputting the original $\Sigma\Delta$ modulated signal delayed a pre-set number of samples by the delay line 3 (original 1-bit delay signal) $S_A$ or the $\Sigma\Delta$ re-modulated signal ($\Sigma\Delta$ re-modulated 1-bit signal) $S_B$.

Figure 6:
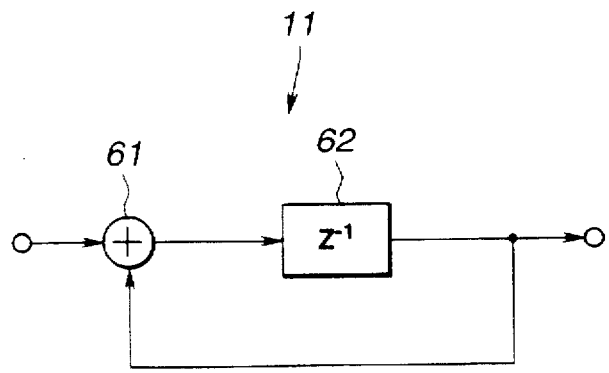
FIG. 6 is a circuit diagram showing an illustrative embodiment of an integrator in a ΣΔ modulator employed in the first embodiment of FIG. 5.

The $\Sigma\Delta$ modulator 6 is configured as a five-order (five-stage) $\Sigma\Delta$ modulator made up of five integrators. For example, a first integrator 11 is configured for shifting an addition output of an adder 61 by a shifter 62 for returning the shifted output to the adder 61, as shown in FIG. 6. The remaining integrators are configured in a similar manner.

Figure 7:
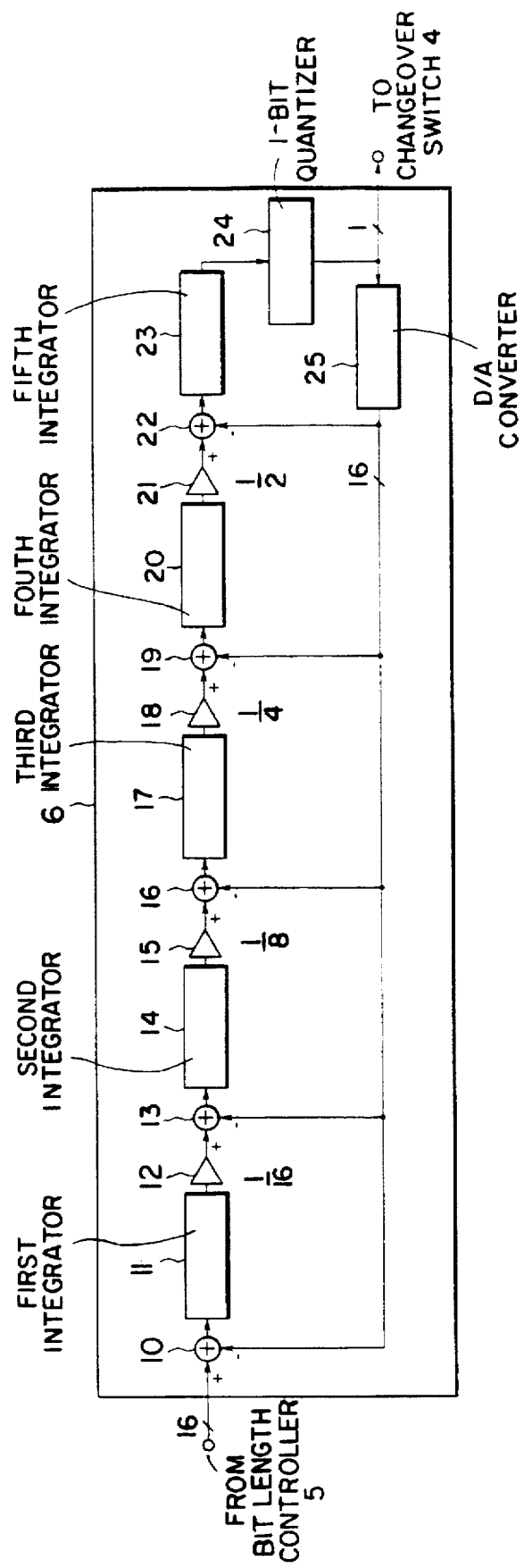
FIG. 7 is a circuit diagram of a ΣΔ modulator employing the illustrative embodiment of the integrator shown in FIG. 6.

The 16-bit signal, having its amplitude level maximized to the maximum amplitude level by adjustment in the word length converter 5, is integrated by the first integrator 11 via an adder 11, as shown in FIG. 7, and is multiplied in a first coefficient multiplier 12 by a coefficient $^{11}\!/\!_{16}$, so as to be then supplied to the second stage. An input signal to the second stage is integrated via an adder 13 by a second integrator 14 and multiplied by a second coefficient multiplier 15 with a coefficient $^{1}\!/\!_{8}$ so as to be supplied to the third stage. An input signal to the third stage is integrated via an adder 16 of the third stage by a third integrator 17 and multiplied by a third coefficient multiplier 18 with a coefficient $\frac{1}{4}$ so as to be supplied to the fourth stage. An input signal to the fourth stage is integrated via an adder 19 by a fourth integrator 20 and multiplied by $\frac{1}{2}$ by a fourth coefficient multiplier 21 so as to be supplied to a fifth stage. An input to the fifth stage is integrated via an adder 22 by a fifth integrator 23 and quantized by a 1-bit quantizer 24 into a 1-bit signal which is supplied to the changeover switch 4. The 1-bit signal is also converted into a 16-bit signal by a D/A converter 25 so as to be fed back to the adders 10, 13, 16, 19 and 22.

In the $\Sigma\Delta$ modulator 6, the gain ratio to the initial stage feedback loop exclusive of the integrator ahead and at back of the 1-bit quantizer 24 of the next-stage feedback loop is set to an integer value of 16, as will now be explained in detail.

The initial-stage feedback loop gain is $$k*(^{11}\!/\!_{16})*(\tfrac{1}{4})*(\tfrac{1}{2})=(k/1024)$$

where k is the gain of the bit length converter 25.

The second-stage feedback loop gain is $$k*(^{1}\!/\!_{8})*(\tfrac{1}{4})*(\tfrac{1}{2})=(k/64).$$

By dividing the second-stage feedback loop gain by the first-stage feedback loop gain, the gain ratio is given as $$((k/64)/(k/1024))=16.$$

Based on this gain ratio, the delay line 3 sets the number of delayed samples to 16.

Figure 8:
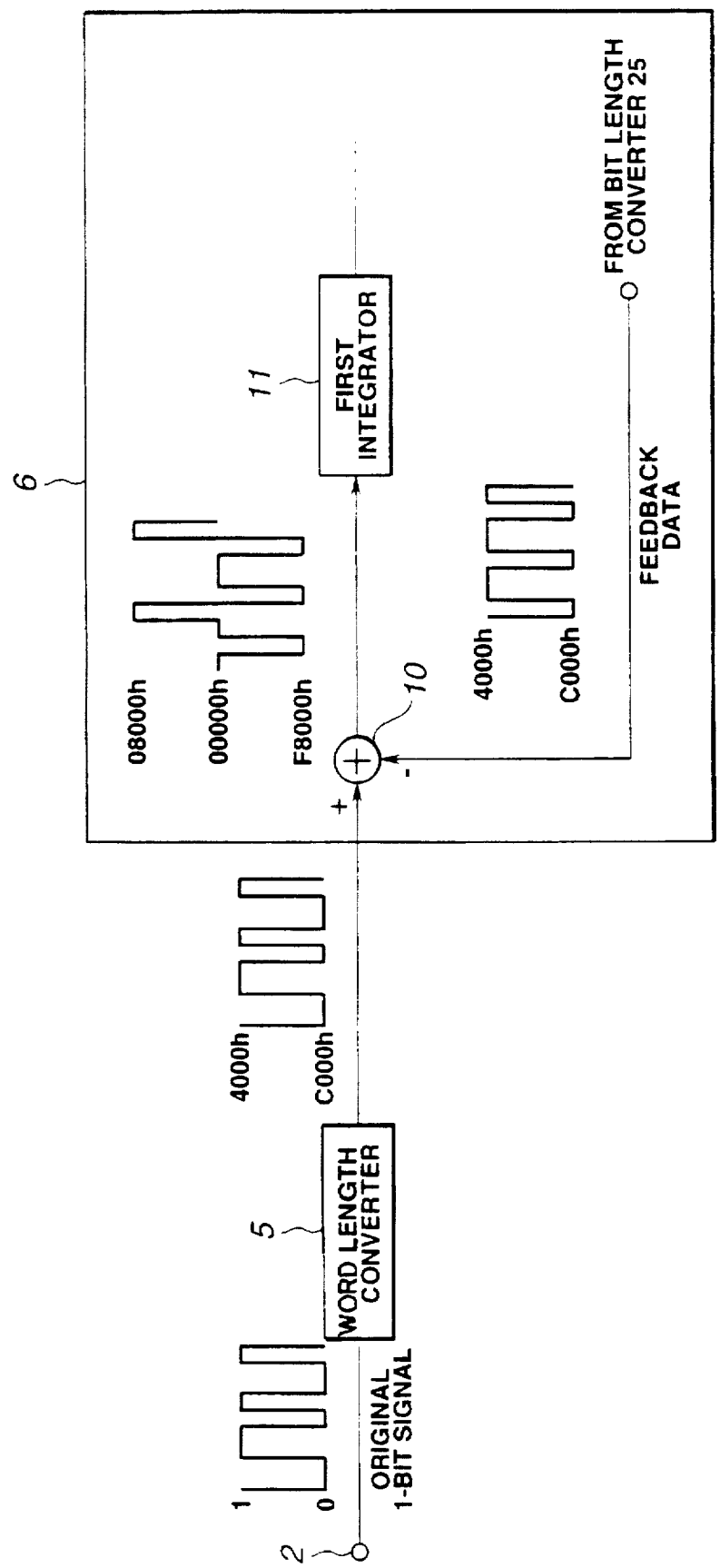
FIG. 8 is an enlarged circuit diagram for illustrating the operation of a bit length converter employed in the first embodiment of FIG. 5.

Referring to FIG. 8, the word length converter 5 converts the original 1-bit signal into 16-bit multiple-bit data so that the amplitude level will be of the same level as the amplitude level of the 16-bit feedback signal fed back from the 1-bit quantizer 24 via the D/A converter 25 to the first integrator 11 as the first-stage integrator.

The changeover switch 4 receives the $\Sigma\Delta$ modulated 1-bit signal $S_B$, obtained on $\Sigma\Delta$ modulation by the $\Sigma\Delta$ modulator 6, at a fixed terminal b, while receiving the original 1-bit signal $S_A$, delayed by 16 samples by the delay line 3, at a fixed terminal a. The changeover switch 4 brings a movable contact c into contact with the fixed terminals a or b depending on the changeover control signal SE supplied from the control signal input terminal 7 for supplying the original 1-bit signal or the $\Sigma\Delta$ modulated 1-bit signal $S_B$.

Figure 9:
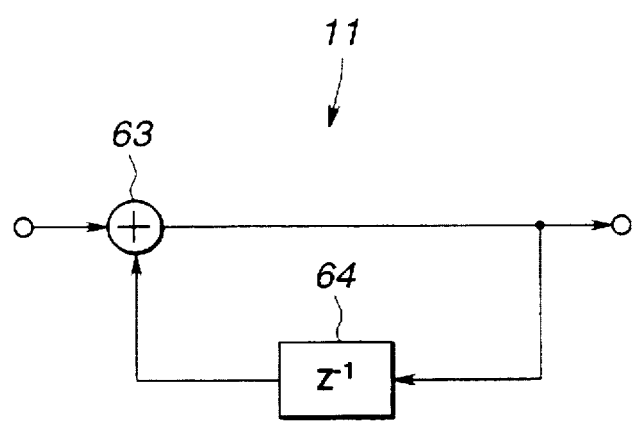
FIG. 9 is a circuit diagram showing another illustrative embodiment of an integrator in the ΣΔ modulator employed in the first embodiment of FIG. 5.

Meanwhile, with the digital signal processing device 1 of the present embodiment, the five integrators used in the $\Sigma\Delta$ modulator 6 may be configured as shown in FIG. 9. For example, the first integrator 11 delays the addition output of an adder 63 by a shifter 64 as the addition output is fed back to the adder 63. The remaining integrators are configured in the similar manner.

Figure 10:
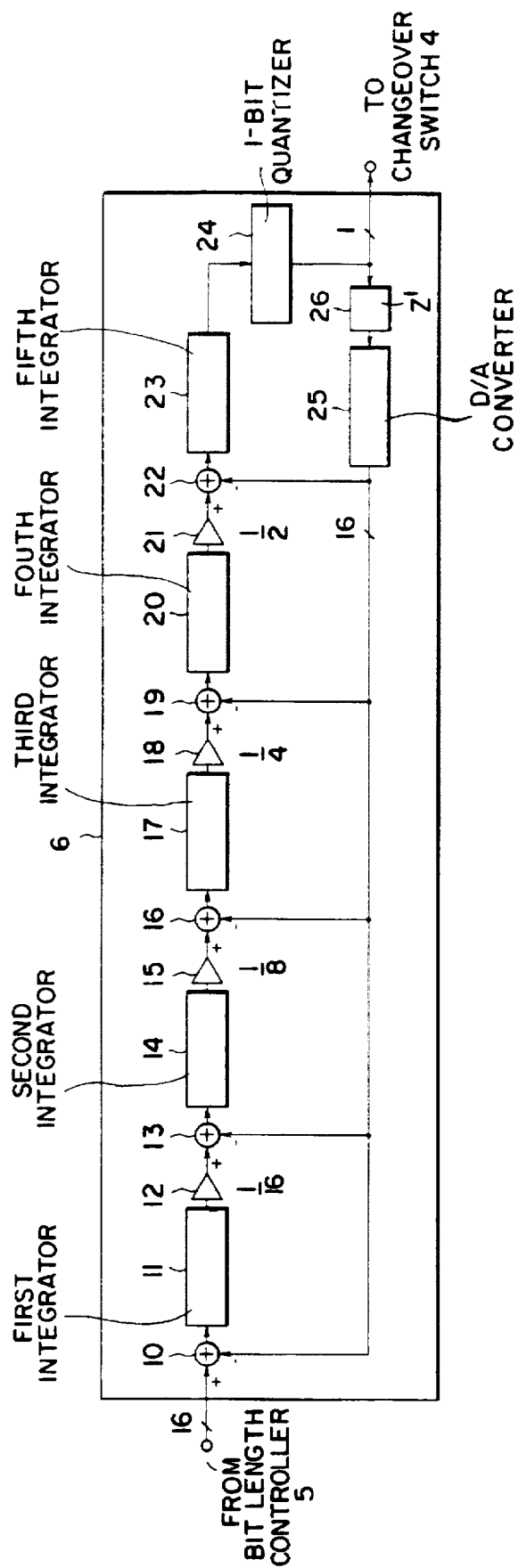
FIG. 10 is a circuit diagram of a ΣΔ modulator employing another illustrative embodiment of the integrator shown in FIG. 6.

In this case, the $\Sigma\Delta$ modulator 6 has its feedback loop structure modified from that shown in FIG. 7, as shown in FIG. 10. That is, a shifter 26 is provided ahead of the D/A converter 25.

The 1-bit quantizer 24 quantizes the integration output of the fifth integrator 23 into 1-bit data. The 1-bit signal of the 1-bit quantizer 24 is supplied via shifter 26 to the D/A converter 25, while being supplied to the fixed terminal b of the changeover switch 4. The D/A converter 25 re-converts the delayed 1-bit signal into a 16-bit signal which is supplied to the adders 10, 13, 16, 19 and 22.

In the case of the ΣΔ modulator 6 having the integrator configured as shown in FIG. 9, the number of delays in terms of the input/output difference becomes smaller by one sample, so that the number of delay samples of the delay line 3 is equal to (gain ratio −1), based on the integer gain ratio of the second stage feedback loop gain to the first stage feedback loop gain, ahead and at back of the 1-bit quantizer 24, excluding the integrator. Thus the number of delay samples of the delay line 3 is 16−1 =15.

At any rate, with the present first embodiment of the digital signal processing device 1 of the present first embodiment, the gain ratio of the second stage feedback loop gain to the first stage feedback loop gain in the ΣΔ modulator 6 is set to an integer, while the number of delay samples of the delay line 3 is determined on the basis of the gain ratio.

With the present digital signal processing device 1, the noise generated at a switching point as shown in FIG. 11A in case an output of the conventional digital signal processing device, such as the device configured as shown in FIG. 1, is converted into an analog audio signal, may be suppressed, as shown in FIG. 11B.

Figure 12:
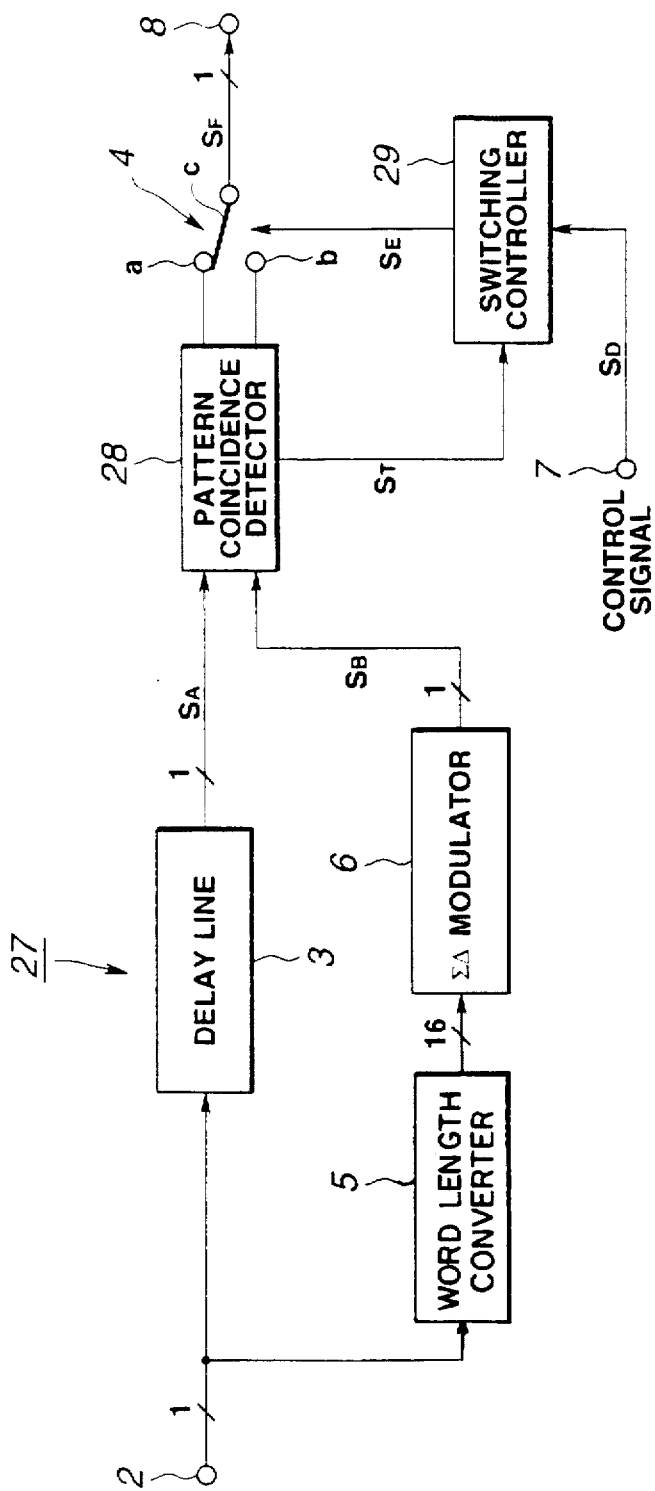
FIG. 12 is a block diagram of a second embodiment of the digital signal processing method and apparatus according to the present invention.
Figure 13:
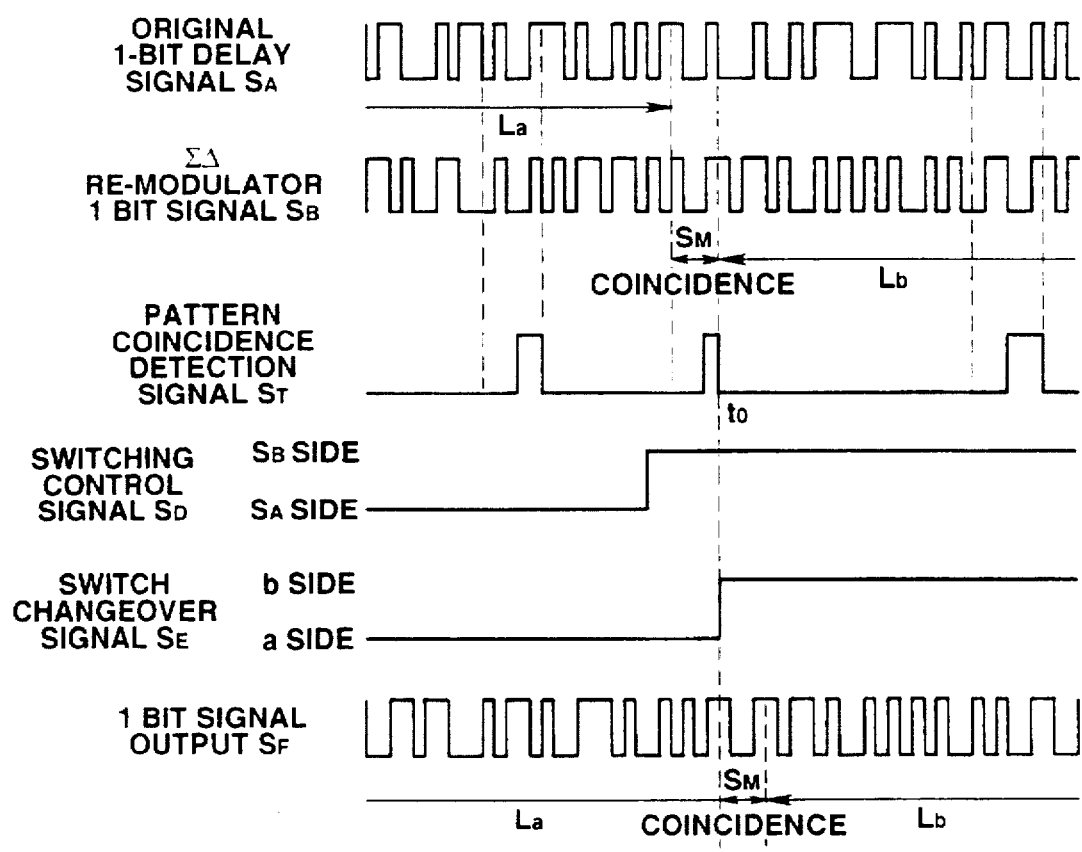
FIG. 13 is a timing chart for illustrating the operation of the second embodiment of FIG. 12.

A second embodiment is now explained by referring to FIGS. 12 and 13. The second embodiment is directed to a digital signal processing device 27 configured for switching between the ΣΔ modulated signal $S_A$, as an input signal obtained on ΣΔ modulation, and a re-modulated signal $S_B$, obtained on ΣΔ re-modulation of the input signal. The digital signal processing device 27, however, is designed for detecting coincidence between the ΣΔ modulated signal $S_A$ and the ΣΔ re-modulated signal $S_B$ over plural samples and switches between the ΣΔ modulated signal $S_A$ and ΣΔ re-modulated signal $S_B$ responsive to the pattern coincidence detection signal.

The digital signal processing device 27 corresponds to the digital signal processing device 1 of the first embodiment shown in FIG. 5 to which are added a pattern coincidence detector 28 and a switching controller 29. The present second embodiment is otherwise the same as the first embodiment so that the corresponding parts are depicted by the same numerals and the corresponding description is not made. The ΣΔ modulator 6 may be configured as shown in FIG. 7 as a five-order ΣΔ re-modulator employing five integrators shown in FIG. 6, or may also be configured as shown in FIG. 10 as a five-order ΣΔ re-modulator employing five integrators shown in FIG. 7.

The pattern coincidence detector 28 monitors the original 1-bit delayed signal SA from the delay line 3 and the ΣΔ re-modulated signal $S_B$ from the ΣΔ modulator 6 and, on detection of pattern coincidence continuing over, for example, four samples, generates a pattern coincidence detection signal $S_T$ which is sent to the switching controller 29.

The switching controller 29 controls the switching of the changeover switch 4 in order to output the original 1-bit delayed signal SA or the ΣΔ re-modulated 1-bit signal $S_B$ at the changeover switch 4.

FIG. 13 illustrates, in a timing chart, the operation of the digital signal processing device 27.

Directly after inversion from the side $S_A$ to the side $S_B$ of a changeover control signal $S_D$ supplied from the control signal input terminal 7, the switching controller 29 generates a switch changeover signal SE from the fixed terminal a to the fixed terminal b, at the next sampling timing t0 of reception of the pattern coincidence detection signal $S_T$ supplied from the pattern coincidence detector 28, and sets the movable contact piece c of the changeover switch 4 from its fixed terminal a to its fixed terminal b.

The digital signal processing device 27 then sums a signal $S_M$ of the four sample pattern coincident portion to the original 1-bit delay signal $S_A$ for a period La and further sums the ΣΔ re-modulated 1-bit signal $S_B$ to the resulting signal to produce a 1-bit signal output $S_F$ which is outputted at the output terminal 8.

Thus, the present digital signal processing device 27 first controls the changeover timing by pattern coincidence detection by the pattern coincidence detector 28 and subsequently switches between the original 1-bit delay signal $S_A$ and the ΣΔ re-modulated 1-bit signal $S_B$, so that switching can be done under more reliable noise suppression.

Figure 14:
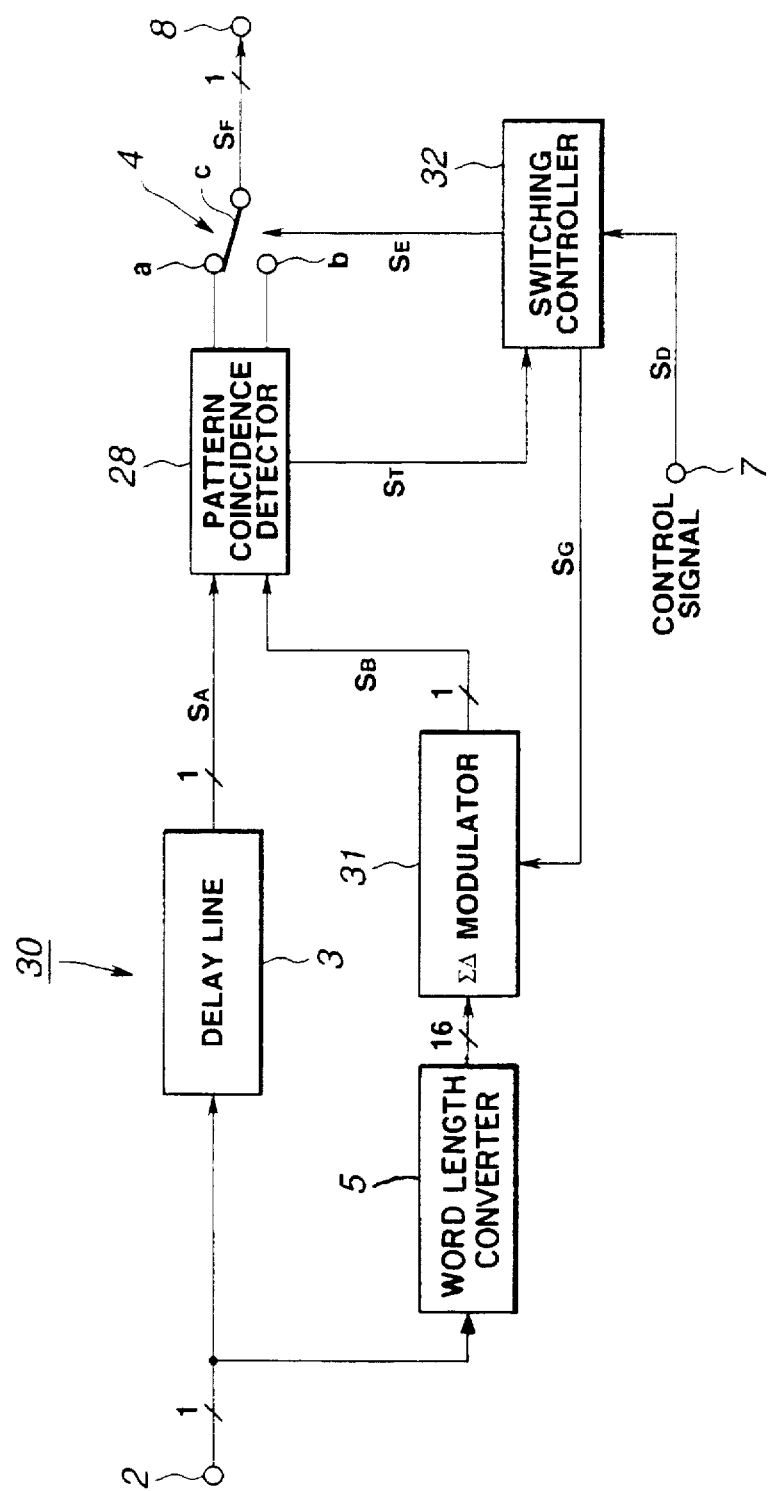
FIG. 14 is a block diagram of a third embodiment of the digital signal processing method and apparatus according to the present invention.
Figure 15:
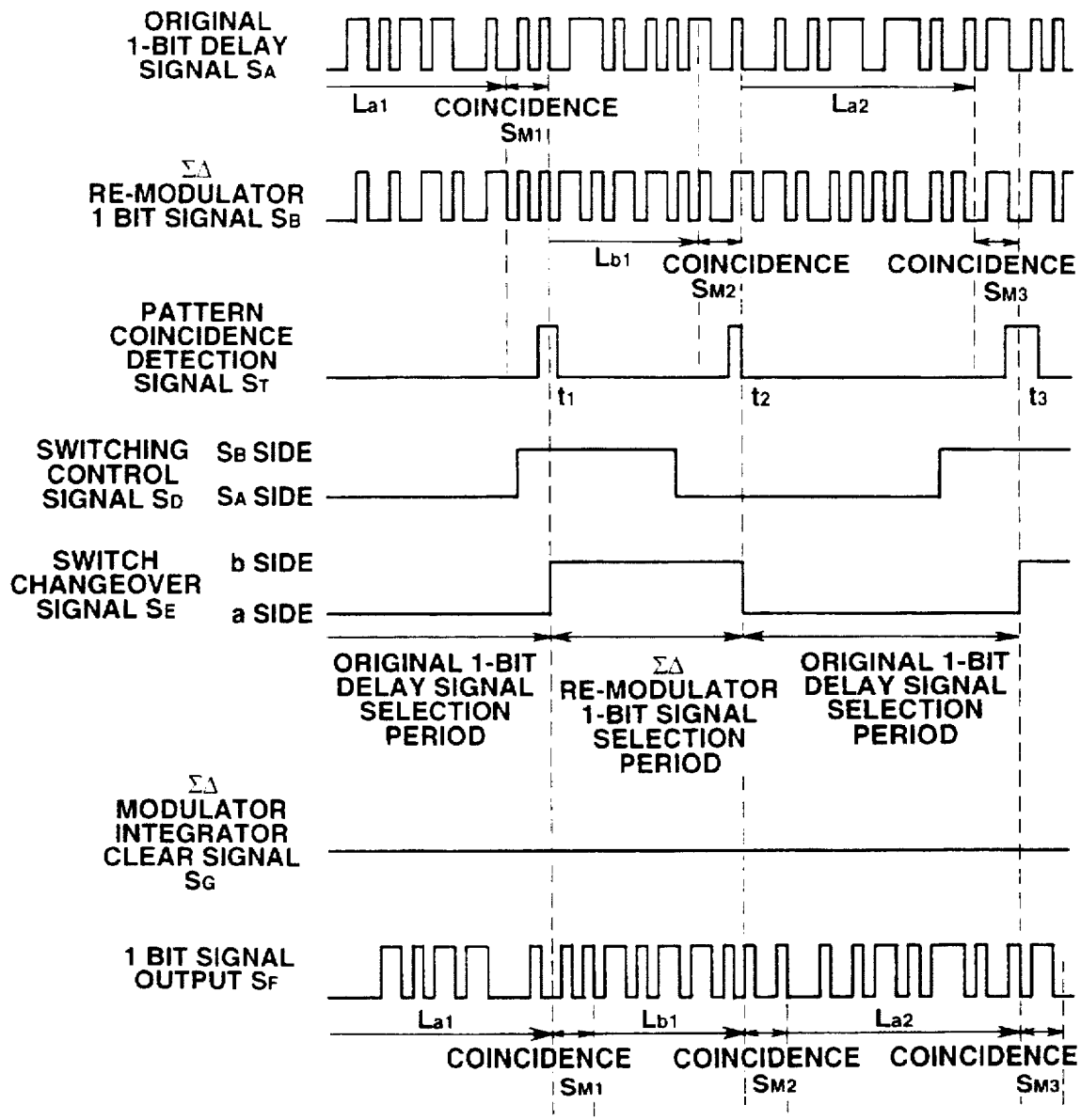
FIG. 15 is a timing chart for illustrating the operation of the third embodiment of FIG. 14.

Referring to FIGS. 14 and 15, a third embodiment will be explained in detail. The present third embodiment is directed to a digital signal processing device 30 which, when switching between the original 1-bit delayed signal $S_A$ and the ΣΔ re-modulated 1-bit signal $S_B$, detects coincidence between these signals $S_A$ and $S_B$ over plural samples and switches between the signals $S_A$ and $S_B$ responsive to the pattern coincidence detection signal. However, the initial value of the integrator in the ΣΔ modulator is cleared to zero directly before inputting of the ΣΔ modulated signal to the input terminal 2 and/or during the time of selection by the changeover switch 4 of the original 1-bit delay signal $S_A$ from the 16-tap delay line 3.

A ΣΔ modulator 31 corresponds to the ΣΔ modulator 6 of the digital signal processing device 27 of the second embodiment of FIG. 12 to which has been added an integrator 0-clear controller designed for clearing the initial value of the integrator to 0 by a ΣΔ modulator integrator clear signal $S_G$ supplied from a switching controller 32. The present digital signal processing device is otherwise the same as the second embodiment so that equivalent parts are denoted by the same numerals and the corresponding description is not made. The ΣΔ modulator 31 may be configured as a five-order ΣΔ modulator employing five integrators shown in FIG. 6, as shown in FIG. 7, or may also be configured as a five-order ΣΔ modulator employing five integrators shown in FIG. 9, as shown in FIG. 10.

FIG. 15 shows, by a timing chart, the operation of the present digital signal processing device 30. The pattern coincidence detector 28 monitors the original 1-bit delay signal $S_A$ from the delay line 3 and the ΣΔ re-modulated 1-bit signal $S_B$ from the ΣΔ modulator 6, every sampling period, and generates a pattern coincidence detection signal $S_T$ if 1-bit data coincide for four samples on end. Here, four patterns coincide at three pattern coincident portions SM1, SM2 and SM3.

Directly after inversion to the side $S_A$ or to the side $S_B$ of the switching control signal $S_D$ entering the control signal input terminal 7, the switching controller 32 inverts the switch changeover signal SE to the fixed terminal a or to the fixed terminal b at the sampling timings t1, t2 and t3 next to the reception of the pattern coincidence detection signal $S_T$ supplied from the pattern coincidence detector 28. Also, during the time the delayed original 1-bit signal $S_A$ is selected by the changeover switch 4, the switching controller 32 sends the ΣΔ re-modulator integrator clear signal $S_G$ to the ΣΔ modulator 31. Thus the integrated value accumulated in the integrator in the ΣΔ modulator 31 is cleared to zero before an output of the word length converter 5 is supplied to the ΣΔ modulator 31.

The digital signal processing device 30 then connects the original 1-bit delay signal $S_A$ over a period $L_{a1}$ to the $\Sigma\Delta$ modulated 1-bit signal $S_B$ over a period $L_{b1}$ with tie interposition of the pattern coincident portion $S_{M1}$ and further connected to the resulting signal the original 1-bit delay signal $S_A$ over a period $L_{a2}$ With the interposition of the four-pattern coincident portion $S_{M2}$ to produce a 1-bit signal output $S_F$ which is outputted at the output terminal 8.

With the present digital signal processing device 30, switching under more reliable noise suppression may be realized since the original $\Sigma\Delta$ modulated signal is supplied to the integrator in the $\Sigma\Delta$ modulator 31 from the state of the zero integrated value.

Figure 16:
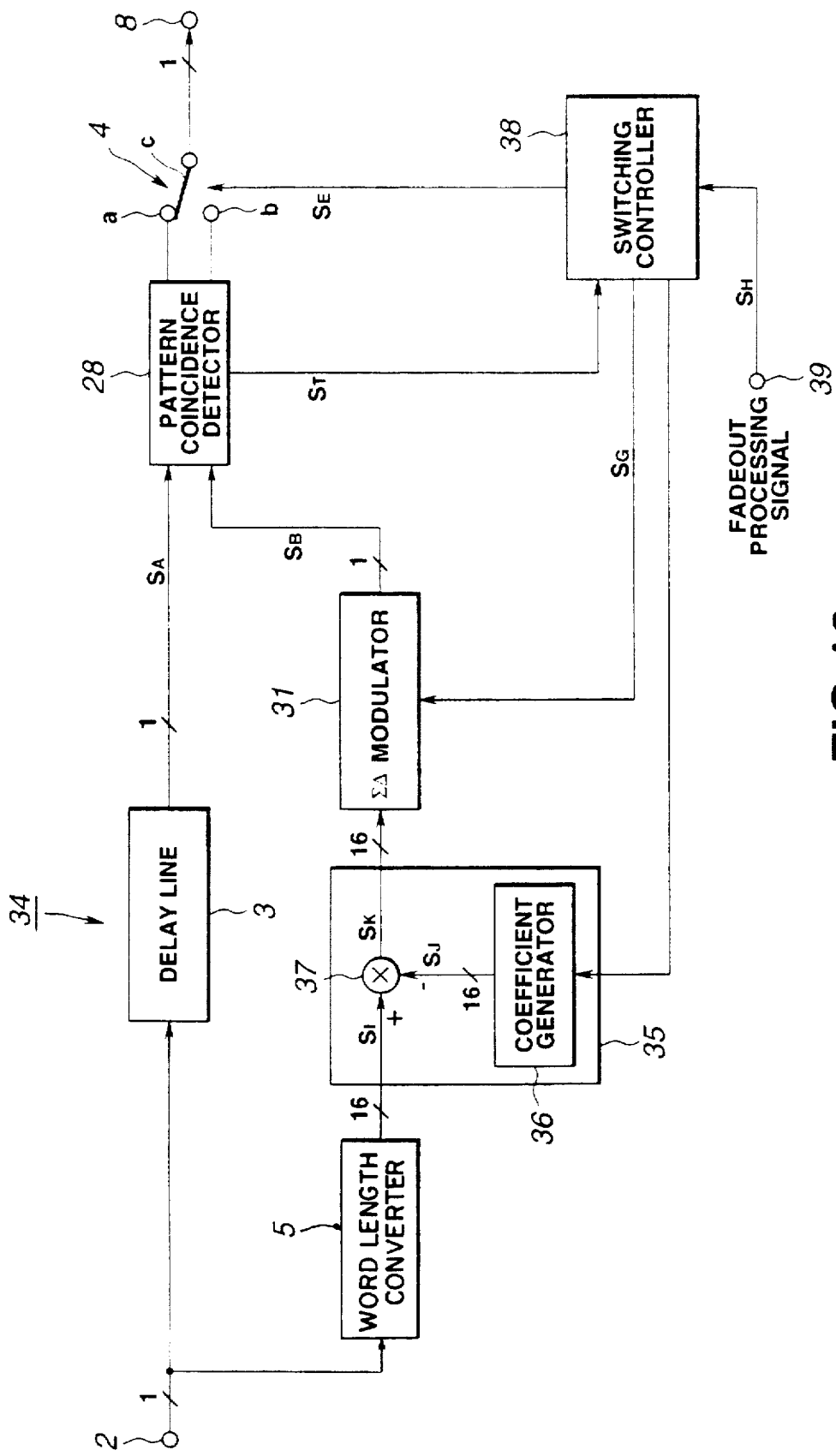
FIG. 16 is a block diagram of a fourth embodiment of the digital signal processing method and apparatus according to the present invention.
Figure 17:
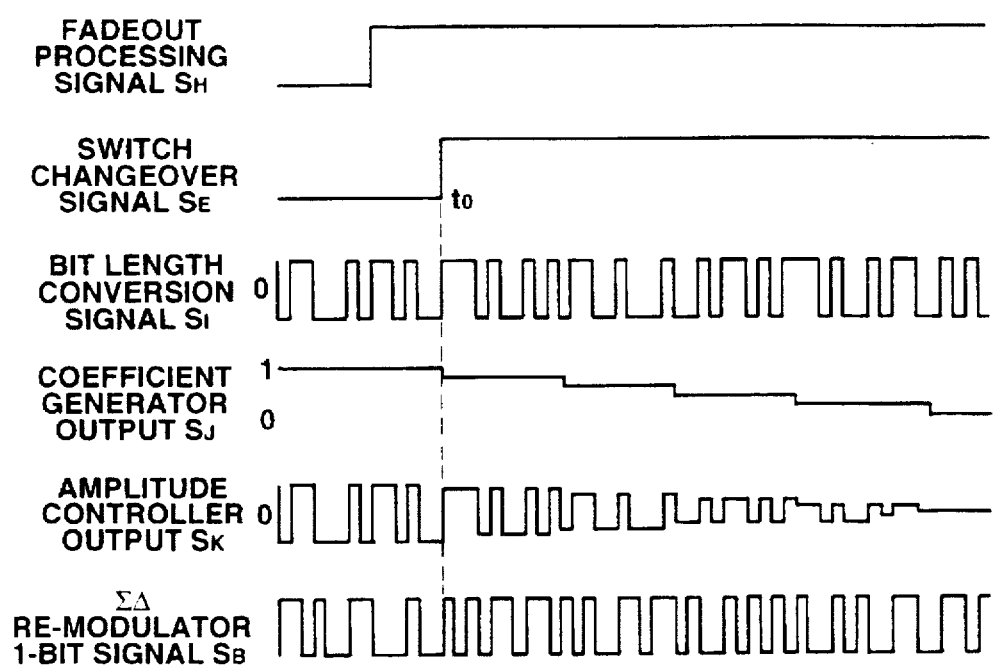
FIG. 17 is a timing chart for illustrating the operation of the fourth embodiment of FIG. 16.

Referring to FIGS. 16 and 17, a fourth embodiment is now explained. The present fourth embodiment is directed to a digital signal processing device 34 switching between the delayed original 1-bit signal $S_A$ and the $\Sigma\Delta$ re-modulated 1-bit signal $S_B$ obtained on clearing the integrated value in the integrator in the $\Sigma\Delta$ modulator 31 as described above to zero, after detection of coincidence of several patterns on end by pattern coincidence detection, as shown in FIG. 16. However, the digital signal processing device 34 converts the $\Sigma\Delta$ re-modulated 1-bit signal $S_B$ into a signal processed with fade-out which is a sort of amplitude control processing.

The amplitude control processing is such signal processing in which signal processing is done in the amplitude direction, such as fade-out in which the reproduced audio signal level is gradually lowered with time, fade-in in which the audio signal level is gradually raised from the zero level, or cross-fade.

A digital signal processing device 34, as a fourth embodiment, is provided with an amplitude controller 35 between the $\Sigma\Delta$ modulator 31 and the word length converter 5 of the digital signal processing device 30 of the third embodiment. The amplitude controller 35 is controlled by a switching controller 38.

The amplitude controller 35 performs amplitude control processing, such as fade-out described above, on a bit-length-converted signal $S_I$, as a level-adjusted signal outputted by the word length converter 5. Before starting the amplitude control by the amplitude controller 35, the switching controller 38 causes the changeover switch 4 to perform switching from the original 1-bit delay signal $S_A$ to the $\Sigma\Delta$ re-modulated 1-bit signal $S_B$ obtained on $\Sigma\Delta$ re-modulation of the bit-length-converted signal $S_I$ by the $\Sigma\Delta$ modulator 31. The amplitude level of the word-length-converted signal $S_I$ at this time is of the maximum amplitude level.

FIG. 17 illustrates in a timing chart, the operation of the present digital signal processing device 34. When a fade-out processing signal $S_H$ is suppled from a control signal input terminal 39 to a switching controller 38, the switching controller 38 sends a switching control signal $S_E$ to the changeover switch 4 after waiting for supply of the four-pattern coincidence detection signal $S_T$ from the pattern coincidence detector 28. In this case, the movable contact c of the changeover switch 4 is changed over from the fixed terminal a to the fixed terminal b. The changeover switch 4 then switches, at a changeover timing t0, from the original 1-bit delay signal $S_A$ to the $\Sigma\Delta$ re-modulated 1-bit signal $S_B$ obtained on directly $\Sigma\Delta$ modulating the bit length conversion signal $S_I$.

During the time the original 1-bit delay signal $S_A$ is selected by the changeover signal 4, the switching controller 38 sends the $\Sigma\Delta$ re-modulator integrator clear signal $S_G$ to the $\Sigma\Delta$ modulator 31.

After the switch 4 is changed over to the signal $S_B$, the switching controller 38 causes transition of a coefficient output SJ of a coefficient generator 36 of the amplitude controller 35 from 1 to 0.

The amplitude controller 35 also includes a multiplier 37 and multiplies the word-length-converted signal $S_I$ with the coefficient output SJ which undergoes transition from 1 to 0 on execution of the fade-out processing. The amplitude controller 35 then causes an amplitude controller output $S_K$ to undergo transition from the maximum amplitude level to the zero level.

The $\Sigma\Delta$ modulator 31 may be configured as a five-order $\Sigma\Delta$ modulator employing five integrators shown in FIG. 6, as shown in FIG. 7, or may also be configured as a five-order $\Sigma\Delta$ modulator employing five integrators shown in FIG. 9, as shown in FIG. 10.

The $\Sigma\Delta$ modulator 31 $\Sigma\Delta$ re-modulates the amplitude controller output $S_K$ and outputs the $\Sigma\Delta$ re-modulated 1-bit signal $S_B$. Thus, if the 1-bit signal obtained at the output terminal 8 is restored to the analog audio signal by a low-pass filter, a fade-out processed signal can be heard, in which the noise otherwise produced on switching from the analog audio signal to a zero-amplitude level is suppressed.

Figure 18:
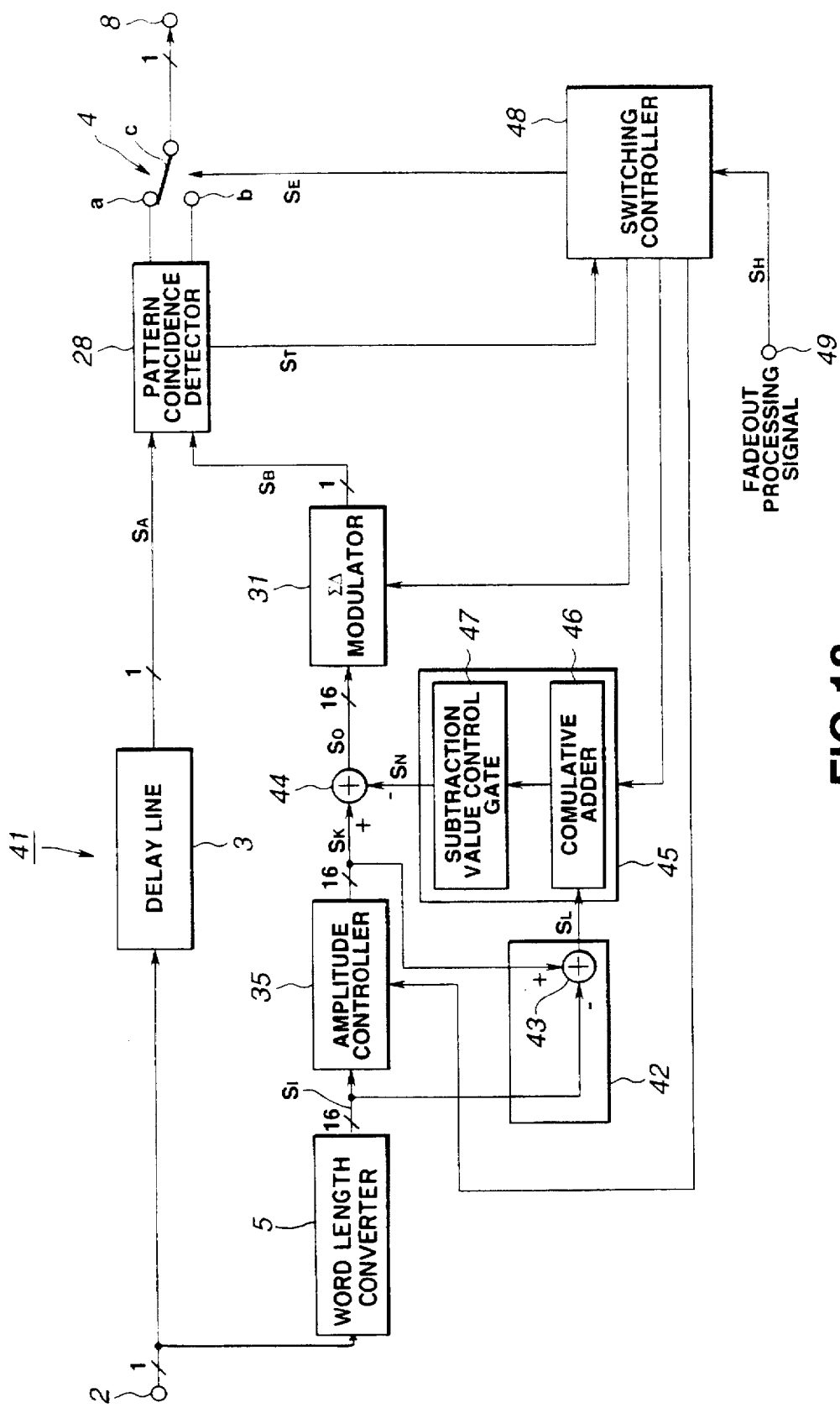
FIG. 18 is a block diagram of a fifth embodiment of the digital signal processing method and apparatus according to the present invention.
Figure 19:
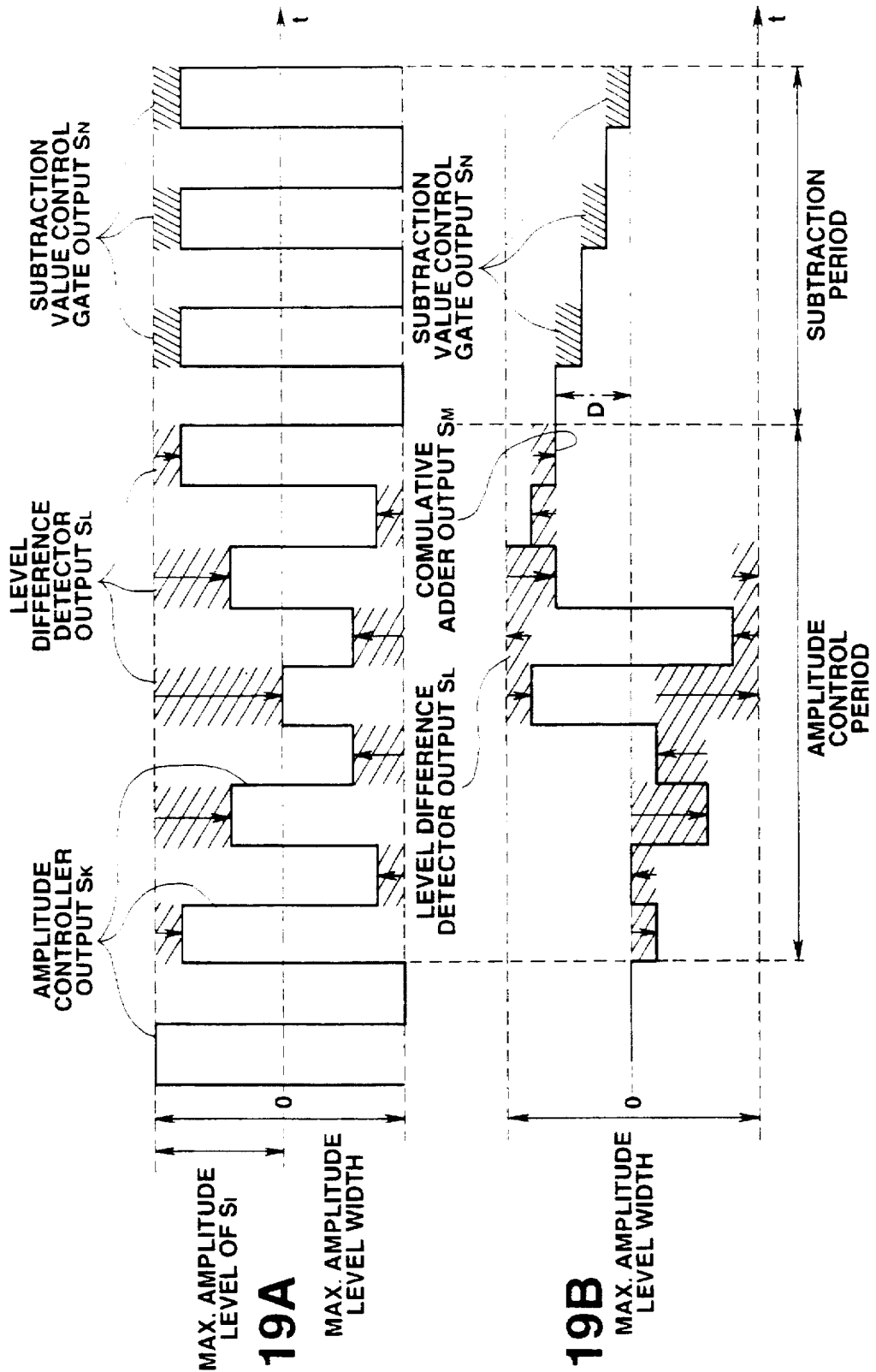
FIGS. 19A and 19B are waveform diagrams of an output signal waveform for illustrating the operation of a level difference detector and a subtraction value processing controller employed in the fifth embodiment of FIG. 18.
Figure 20:
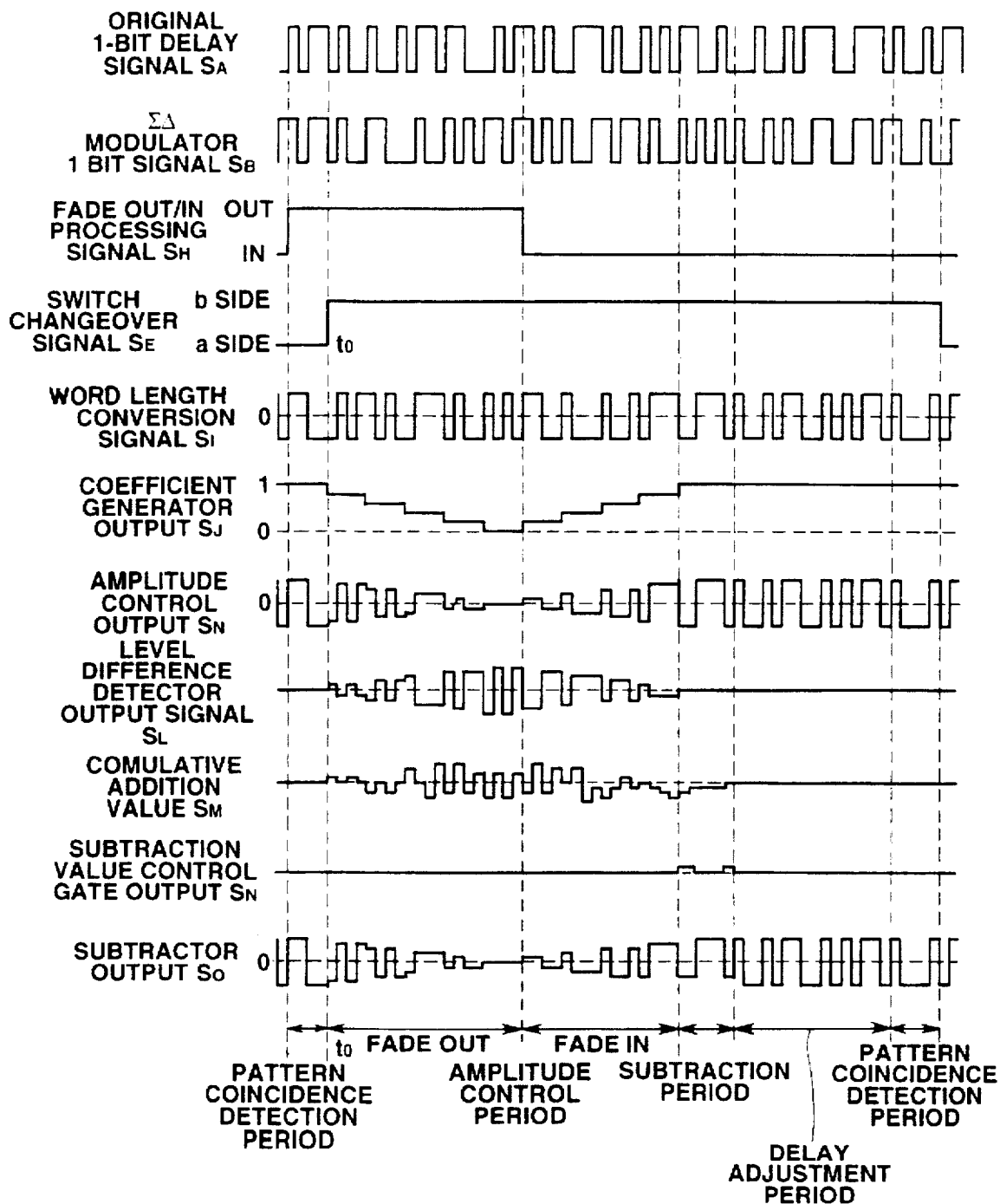
FIG. 20 is a timing chart for illustrating the operation of the fifth embodiment of FIG. 18.

Referring to FIGS. 18 to 20, a fifth embodiment is explained. The present fifth embodiment is directed to a digital signal processing device 41 switching between the delayed original 1-bit signal obtained on $\Sigma\Delta$ modulation and the $\Sigma\Delta$ re-modulated 1-bit signal $S_B$ obtained on clearing the integrated value in the integrator in the $\Sigma\Delta$ modulator to zero after detection of coincidence of several patterns on end by pattern coincidence detection. However, the digital signal processing device 41 sets the $\Sigma\Delta$ re-modulated 1-bit signal $S_B$ into a signal processed with fade-out/in processing and connects the signal $S_B$ to the original 1-bit delay signal $S_A$.

The fade-out/in processing means such processing in which fade-in precessing is performed in succession to the fade-out processing. The present digital signal processing device 41 thus performs amplitude control processing in which the original 1-bit delay signal $S_A$ is, as it were, processed with fade-in and subsequently restored to the original level.

To this end, the digital signal processing device 41 includes, in addition to the delay line 3, pattern coincidence detector 28, word length converter 5, amplitude controller 35 and the $\Sigma\Delta$ modulator 31, a level difference detector 42, a cumulative adder 46, a subtraction value control gate 47 and a switching controller 48, as shown in FIG. 18. The level difference detector 42 detects the difference between the maximum amplitude level of the bit length conversion output $S_I$ entering the $\Sigma\Delta$ modulator 31 during the time the amplitude controller 35 is controlling the amplitude level of the word-length-converted output $S_I$ of the bit length converter 5 and the amplitude level of the amplitude-controlled output. The cumulative adder 46 cumulatively sums the level difference from the level difference detector 42 with the maximum amplitude level width length which is twice as large as the above-described maximum amplitude level. The subtraction value control gate 47 gradually subtracts the cumulative sum value of the cumulative adder 46 from the maximum amplitude level of the amplitude controller output $S_K$ entering the $\Sigma\Delta$ modulator 31 after amplitude control by the amplitude controller 35 using an adder/subtractor 44. The switching controller 48 controls the operation of the amplitude controller 35 as will be explained subsequently. In addition, after end of the subtraction control of the cumulative sum value from the maximum amplitude level by the subtraction value control gate 47, the switching controller causes the changeover switch 4 to switch the output of the $\Sigma\Delta$ modulator 31 to the original 1-bit delay signal $S_A$ after pattern coincidence detection by the pattern coincidence detector 28 and to output the signal $S_A$. The cumulative adder 46 and the subtraction value control gate 47 make up the subtraction value processing controller 45.

The amplitude controller 35 has a configuration shown in FIG. 16, that is, includes the coefficient generator 36 and the multiplier 37. The coefficient generator 36 generates a coefficient output $S_J$ undergoing transition from 1 t 0 and then from 0 to 1, in a manner of executing the fade-out/in processing, under control by the switching controller 48. The multiplier 37 multiplies the bit length conversion signal SL with the above coefficient output SJ.

The level difference detector 42 is configured as shown in FIG. 16, that is, the detector 42 detects the difference between the maximum amplitude level of the word-length-converted output $S_I$ entering the ΣΔ modulator 31 during the time the amplitude controller 35 is controlling the amplitude level of the bit length conversion output $S_I$ of the word length converter 5 and the output $S_K$ of the amplitude controller 35 and sends the level difference detection output SL to the cumulative adder 46 in the subtraction value processing controller 45.

Referring to FIGS. 19 and 20, the operation of the present digital signal processing device 41 is explained. FIG. 19 is an output signal waveform diagram for illustrating the operation of the level difference detector 42 and the subtraction value processing controller 45. FIG. 20 is a timing chart for illustrating the fade-out/in processing performed by the digital signal processing device 41.

When the fade-out/in processing signal $S_H$ is supplied from a control signal input terminal 49 to the switching controller 48, the switching controller 48 first awaits the oncoming of the 4-pattern coincidence detection signal $S_T$ for the pattern coincidence detection circuit 28, and subsequently routes a switch changeover signal $S_E$ to the changeover switch 4. The switching controller 48 then causes the movable contact c of the changeover switch 4 to be changed over from the fixed terminal a to the fixed terminal b. Then, at a switching timing t0, the changeover switch 4 switches the bit length conversion signal $S_I$ from the original 1-bit delayed signal $S_A$ to the ΣΔ re-modulated 1-bit signal $S_B$.

Meanwhile, during the time the original 1-bit delay signal $S_A$ is being selected by the changeover switch 4, the changeover switch 4 is supplying the ΣΔ re-modulator integrator clear signal $S_G$ to the ΣΔ modulator 31.

After the switch 4 is changed over to $S_B$, the switching controller 48 causes transition of the coefficient output SJ of the coefficient generator 36 of the amplitude controller 35 from 1 to 0 and then again to 1. This causes transition of the level of the input signal to the ΣΔ modulator 31, that is the level of the subtractor output $S_O$, to the 0 level, and then again to the maximum amplitude level.

During this time, the level difference detector 42 detects the level difference of the amplitude level of the amplitude controller output $S_K$ relative to the maximum amplitude of the word length converter output $S_I$, and outputs a level difference detector output $S_L$ to the cumulative adder 46 of the subtraction value processing controller 45, as shown in FIG. 19A.

The cumulative adder 46 cumulatively sums the level difference detector output $S_L$ during the amplitude control period. In particular, the cumulative adder 46 is made up of a signed accumulator for the maximum amplitude level width length which is twice as large as the above-described maximum amplitude level. In case of overflow of the cumulative addition, the cumulative adder 46 undergoes cycling and outputs a cumulative ader output $S_M$.

When the amplitude control output $S_K$ of the amplitude controller 35, that is the input signal to the ΣΔ modulator 31, again reaches the maximum amplitude level, data D so far accumulated in the cumulative adder 46 is gradually discharged via the subtraction value control gate 47. The discharged data corresponds to a subtraction value control gate $S_N$ and is subtracted from the maximum amplitude level input signal to the ΣΔ modulator 31 by the adder/subtractor 44 so that a subtractor output $S_O$ is fed to the ΣΔ modulator 31.

When the cumulative sum value $S_M$ reaches zero through the process of subtraction, the switching controller 48 awaits the oncoming of the pattern coincidence signal $S_T$ from the pattern coincidence detector 28, after delay on the delay line 3, and then causes the changeover switch 4 to perform switching from the ΣΔ modulator output signal $S_B$ to the original 1-bit delay signal $S_A$.

Thus, if the 1-bit signal outputted at the output terminal 8 is restored via the low-pass filter to the analog audio signal, fade-out/in processing from the original audio signal through the zero amplitude level to the original audio signal may be realized under noise suppression.

With the present digital signal processing device 41, the ΣΔ modulator 31 may be configured as a five-order ΣΔ modulator employing five integrators shown in FIG. 6, as shown in FIG. 7, or may also be configured as a five-order ΣΔ modulator employing five integrators shown in FIG. 9, as shown in FIG. 10.

Figure 2:
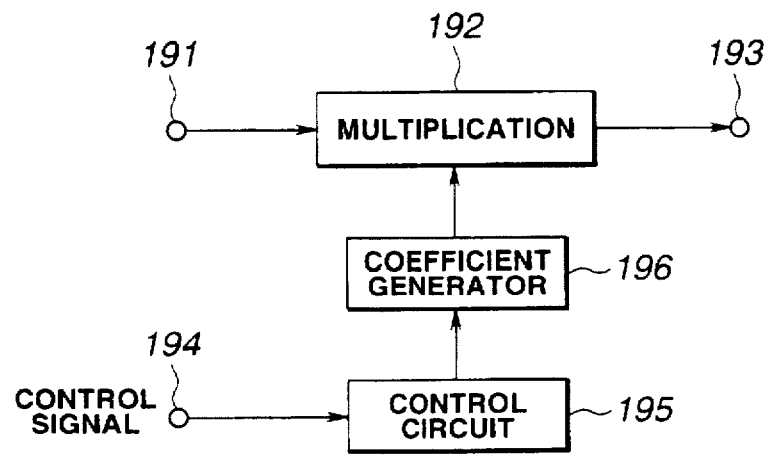
FIG. 2 is a schematic block diagram of a multi-bit signal processing device.
Figure 3:
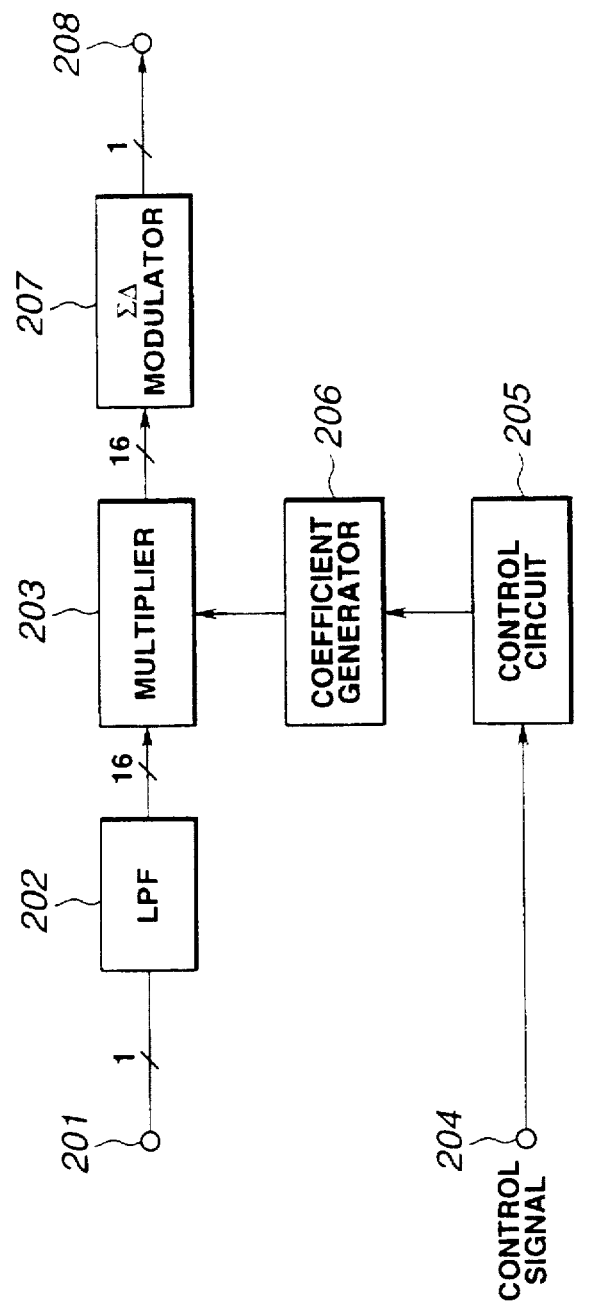
FIG. 3 is a schematic block diagram showing a conventional digital signal processing device handling a digital signal made up of a small number of bits.
Figure 4:
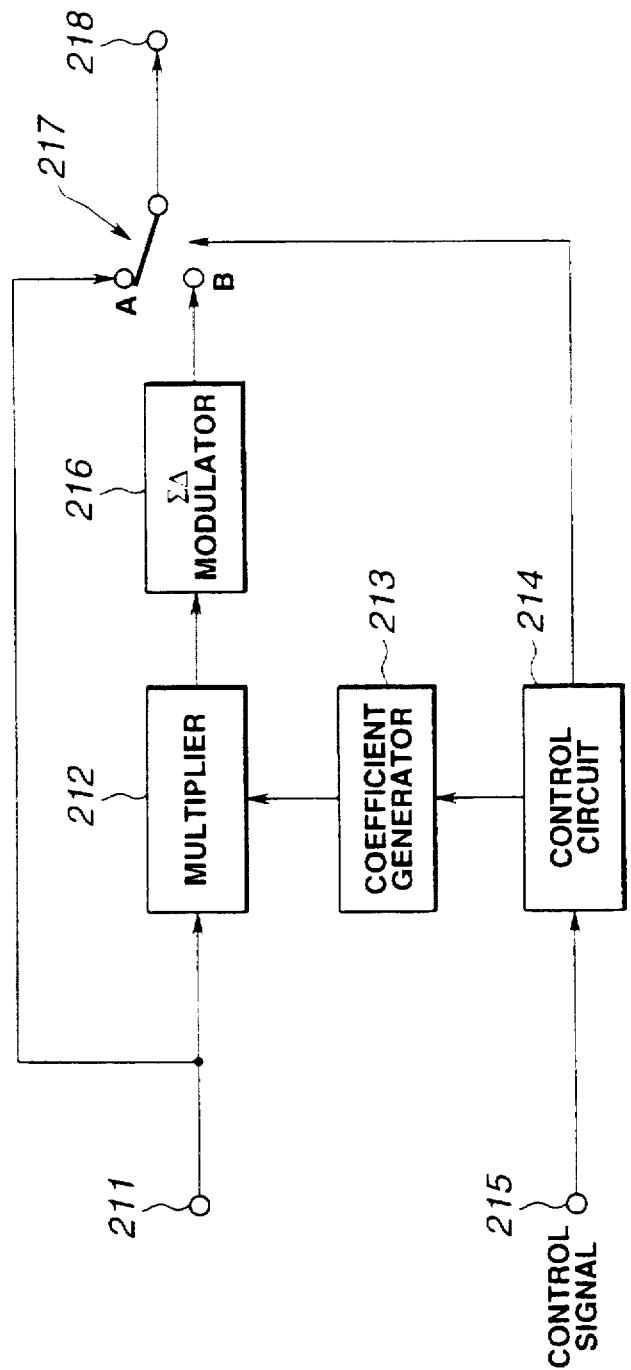
FIG. 4 is a schematic block diagram showing a digital signal processing device configured for switching between an original signal made up of a small number of bits and a signal reconverted into the signal made up of the small number of bits.
Figure 21:
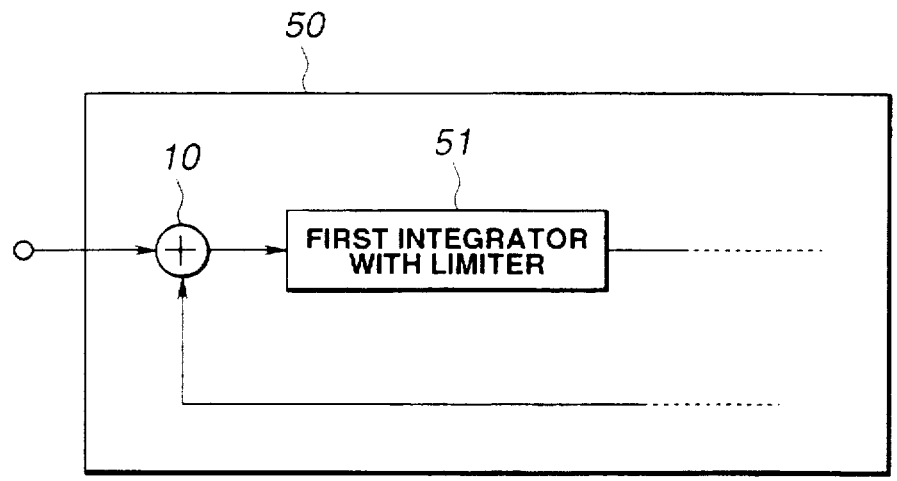
FIG. 21 is a circuit diagram showing a ΣΔ modulator having a first integrator fitted with a limiter.
Figure 22:
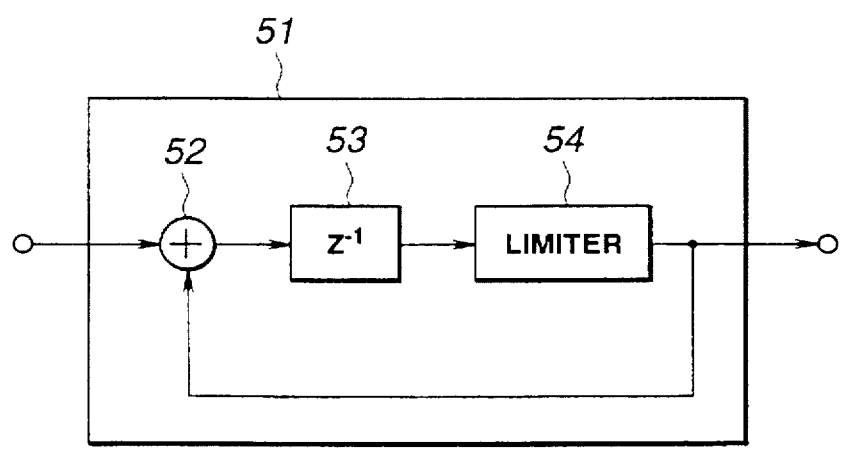
FIG. 22 is a block diagram shoving the inner structure of the first integrator fitted with the limiter shown in FIG. 21.

Also, for preventing oscillation of the ΣΔ modulator 31, the first integrator 11 shown in FIG. 2 may be configured as a first integrator 51 fitted with a limiter, as shown in FIG. 21. This first integrator 51 fitted with the limiter limits the integrated value of the first integrator to a value equal to an integer number times the maximum amplitude level value.

If the limiter function is operating under such a state in which the integrated value of the first integrator exceeds the limiter value, the switching controller 48 clears the cumulative addition value of the cumulative adder 46 to zero.

The first integrator 51 fitted with the limiter is made up of an adder 52, a shifter 53 and a limiter 54, and feeds back an output limited by the limiter 54 to the adder 52.

Figure 23:
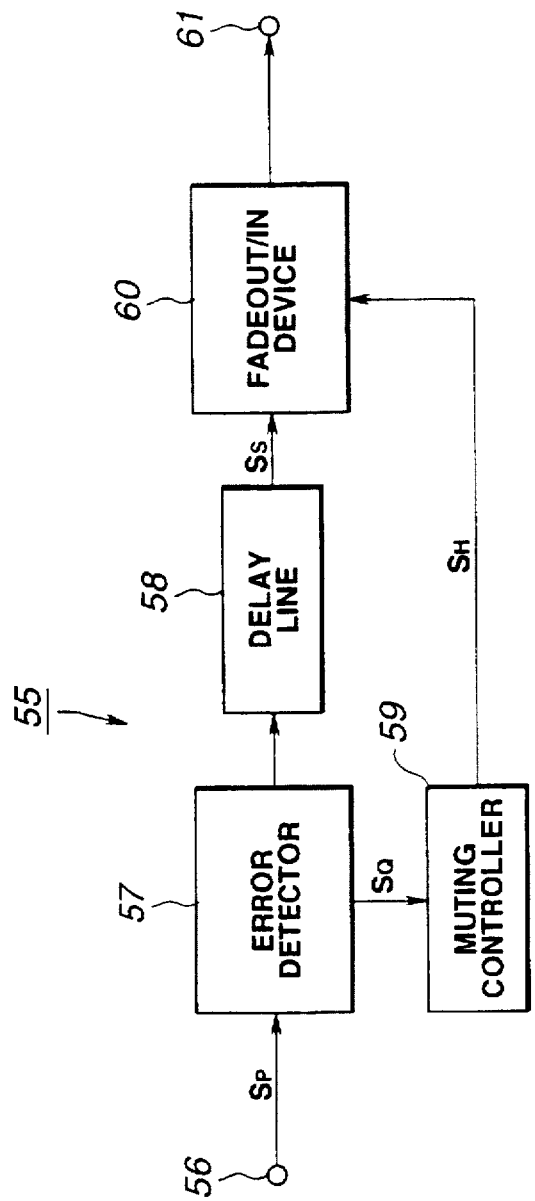
FIG. 23 is a block diagram of a sixth embodiment of the digital signal processing method and apparatus according to the present invention.
Figure 24:
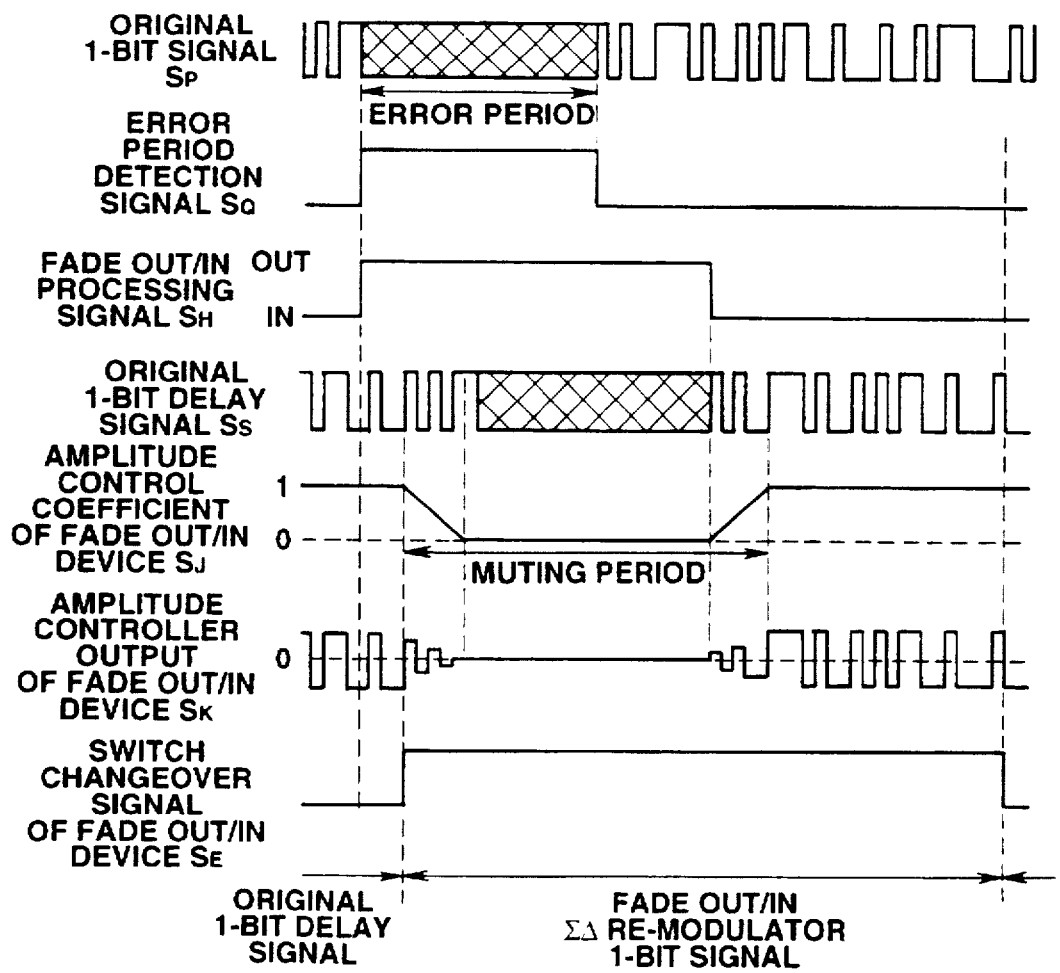
FIG. 24 is a timing chart for illustrating the operation of the sixth embodiment of FIG. 23.

Referring to FIGS. 23 and 24, a sixth embodiment is explained. This sixth embodiment is directed to a digital signal processing device 55 which, if an input original 1-bit signal $S_P$ contains an uncorrectable burst error, fades-out the 1-bit signal directly before the burst error using a fade-in device 60, and fades-in the signal directly after the burst error, thus muting the 1-bit signal during the period of occurrence of the burst error.

This digital signal processing device 55 includes an error detector 57 for detecting the uncorrectable burst error contained in the original 1-bit signal $S_P$ supplied from an input terminal 56, a delay line 58 arranged downstream of the error detector 57 for delaying the original 1-bit signal $S_P$ and a fade-out/fade-in device 60 for fading-out and fading-in the delayed 1-bit signal $S_S$ from the delay line 58. The digital signal processing device 55 also includes a muting controller 59 which, on detection by the error detector 57 of the uncorrectable burst error in the original 1-bit signal $S_P$, immediately fades-out the delayed 1-bit signal lying directly before the uncorrectable burst error in the delayed 1-bit signal $S_S$ from the delay line 58, using the fade/out/in device 60, and fades-in the delayed 1-bit signal immediately after the burst error to the maximum amplitude level using the fade-out/in device 60.

As the above fade-out/in device 60, the digital signal processing device 41 as shown in FIG. 18 may be used. For executing the fade-out processing, the amplitude controller 35 is actuated. In effect, after the switching controller 48 switches the delayed ΣΔ modulated signal from the delay line 3 to the ΣΔ re-modulated signal from the ΣΔ modulator 31, the amplitude controller 35 controls the amplitude level of the level adjustment signal in order to execute the fade-out processing.

For executing the fade-in processing, the amplitude controller 35, level difference detector 42, cumulative adder 46 and the subtraction value control gate 47 are actuated. In effect, after the switching controller 48 switches the ΣΔ re-modulated signal to the delayed ΣΔ modulated signal after the end of subtraction of the cumulative sum in the subtraction value control gate 47 with the aid of the changeover switch 4, the amplitude controller 35, level difference detector 42, cumulative adder 46 and the subtraction value control gate 47 execute the fade-in processing.

The operation of the digital signal processing device 55 is explained by referring to the timing chart of FIG. 24.

If, in a system for transmitting or recording the original 1-bit signal $S_P$, an uncorrectable burst error is produced, the error detector 57 generates an error period detection signal $S_Q$ specifying the error period. On reception of error period detection signal $S_Q$, the muting processor 59 sends a fade-out/in processing signal $S_H$ to the switching controller 48 in the fade-out/in device 60 shown in FIG. 18. In this fade-out/in processing signal $S_H$, the transition has been made from the fade-out/in processing to the fade-out processing. After awaiting the pattern coincidence signal $S_T$ fed from the pattern coincidence detector 28, the switching controller 48 causes the changeover switch 4 to switch from the 1-bit signal $S_A$ to the ΣΔ modulated output $S_B$ of the ΣΔ modulator 31. The 1-bit signal $S_A$ corresponds to the original 1-bit signal $S_P$ delayed by the delay line 58 and then re-delayed by the delay line 3.

In response thereto, the coefficient generator 36 in the amplitude controller 35 in the fade-out/in device 60 immediately causes transition of the coefficient from 1 to 0, and completes the transition before error data during the error period reaches the ΣΔ modulator 31 through the delay line 58. When the error period comes to a close and the error period detection signal $S_Q$ is canceled, the muting controller 59 causes transition of the fade-out/in signal to the fade-in processing side after delay by the delay line 58. In response thereto, the coefficient generator 36 in the amplitude controller 35 immediately causes transition from 0 to 1.

The subtraction value processing controller 45 cumulatively sums the level difference detector output signal $S_L$ from the level difference detector 42 to be cumulatively summed by the cumulative adder 46, as explained with reference to FIG. 19. When the input signal to the ΣΔ modulator 31 again reaches the above-mentioned maximum amplitude level, data D so far accumulated in the cumulative adder 46 is gradually discharged via the subtraction value control gate 47. This data D, as the subtraction value control gate output SN, is subtracted by the subtractor 44 from the maximum amplitude level input signal to the ΣΔ modulator 31 to supply the subtractor output $S_O$ to the ΣΔ modulator 31.

When the cumulative sum value $S_M$ reaches zero through the subtraction period, the switching controller 48 first awaits, after delay by the delay line 31, the oncoming of the pattern coincidence detection signal $S_T$ from the pattern coincidence detector 28, and subsequently causes the changeover switch 4 to switch from the ΣΔ modulator output signal $S_B$ to the 1-bit signal $S_A$. The 1-bit signal SA corresponds to the original 1-bit signal $S_S$ delayed from the ΣΔ modulated signal $S_B$ and further delayed by the delay line 3.

If, when an uncorrectable burst error is produced, the 1-bit output signal of the fade-out/in device 60 is returned via the low-pass filter to an analog audio signal, muting processing, in which the signal level is reduced to a zero level under noise suppression, is realized.

Figure 25:
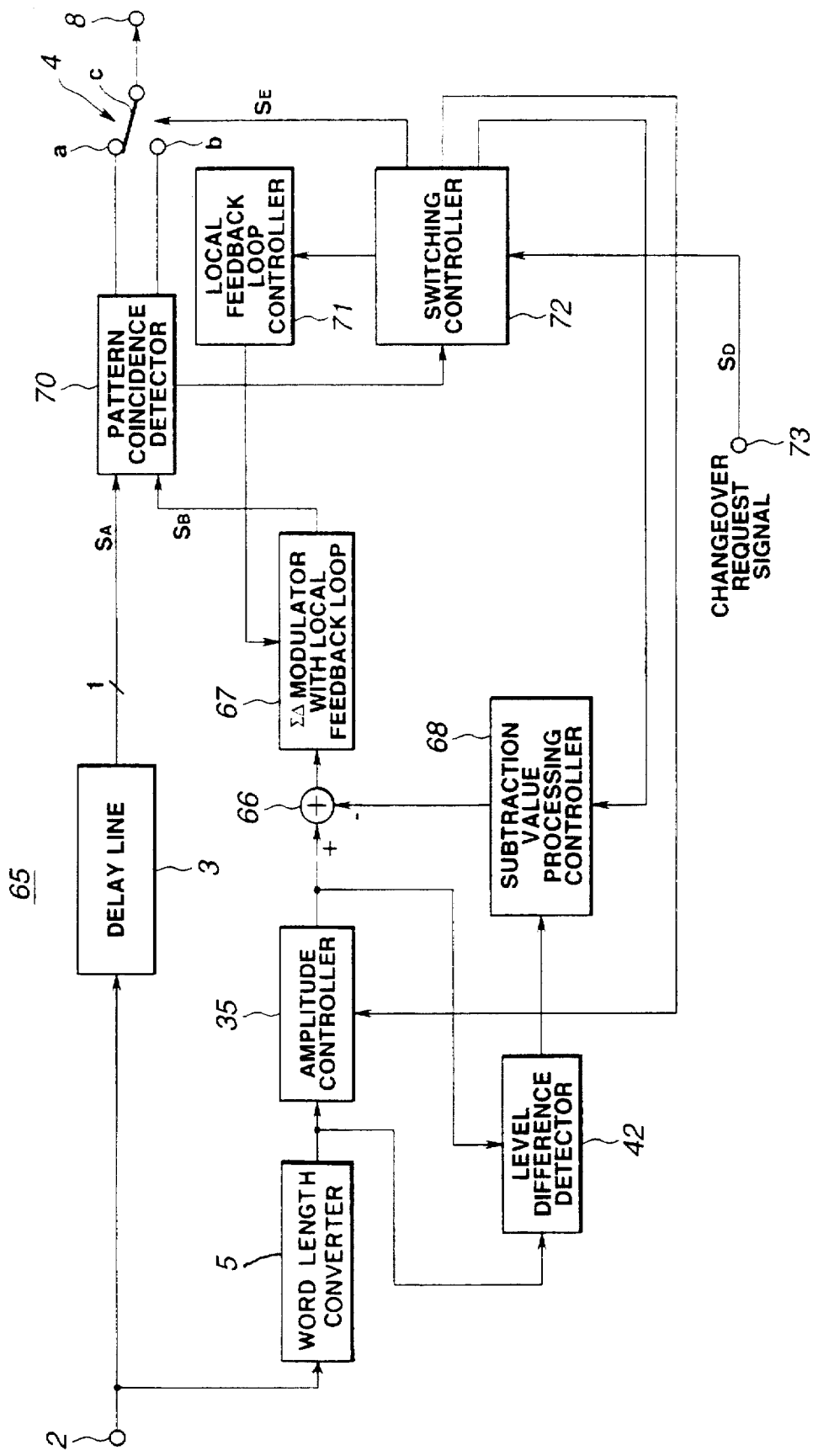
FIG. 25 is a block diagram of a seventh embodiment of the digital signal processing method and apparatus according to the present invention.

Referring to FIGS. 25 to 28, a seventh embodiment is explained. This seventh embodiment is directed to a digital signal processing device 65 switching between the original 1-bit delay signal $S_A$ and the 1-bit signal $S_B$, obtained on ΣΔ re-modulating the amplitude-controlled signal by a as ΣΔ modulator having a local feedback loop 67 (ΣΔ modulator having a local feedback lop), as shown in FIG. 25.

With the present digital signal processing device 65, the ΣΔ modulator having a local feedback loop 67 shown in FIG. 25 is used in place of the ΣΔ modulator 31 of the digital signal processing device 41 of the fifth embodiment.

Figure 26:
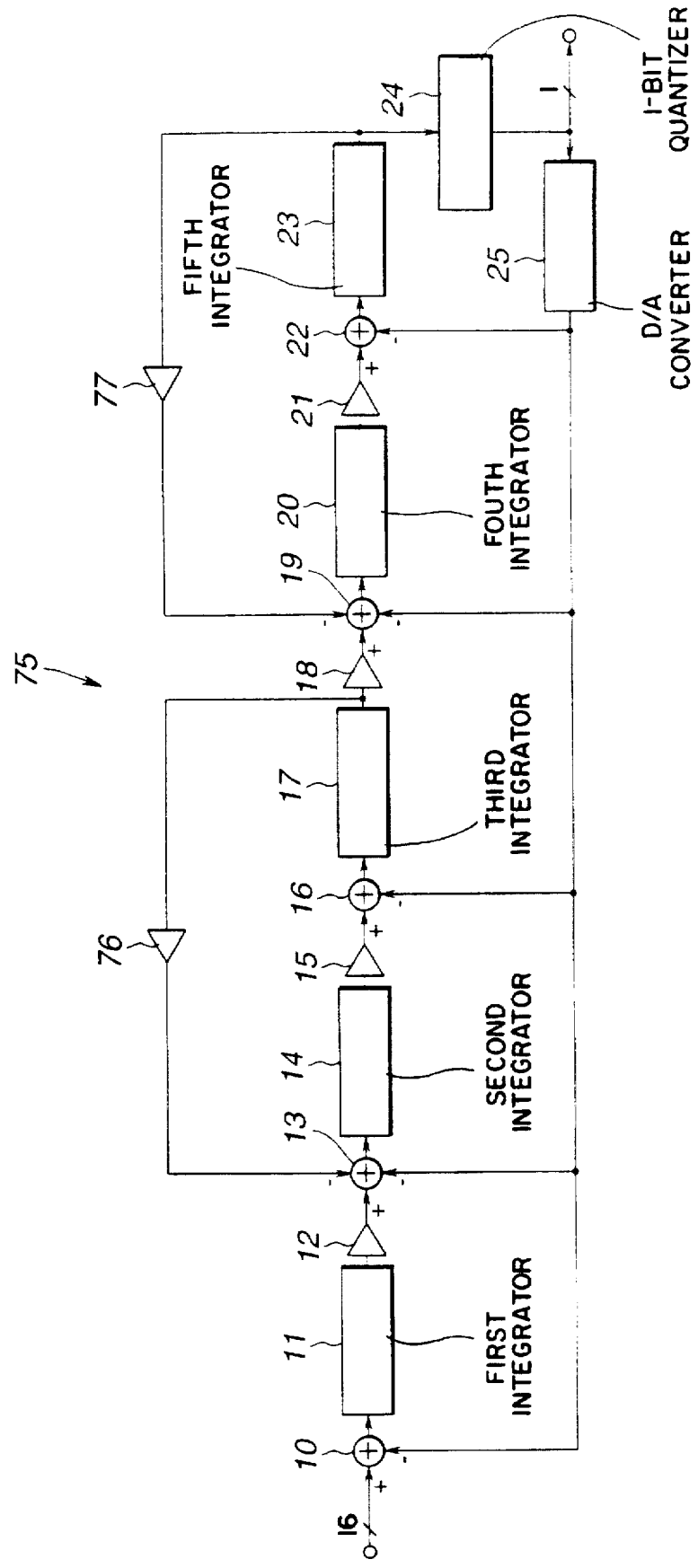
FIG. 26 is a circuit diagram of a ΣΔ modulator having a local feedback loop.

The local feedback loop is a well-known technique. FIG. 26 shows an arrangement in which two local feedback loops having two gain multipliers 76, 77 are applied to a five-order ΣΔ modulator having five integrators shown in FIG. 6, as shown in FIG. 7. With a ΣΔ modulator having the local feedback loop 75, it is possible to optimize the quantization noise components in the audible range for setting a dynamic range to a broader value.

Figure 27:
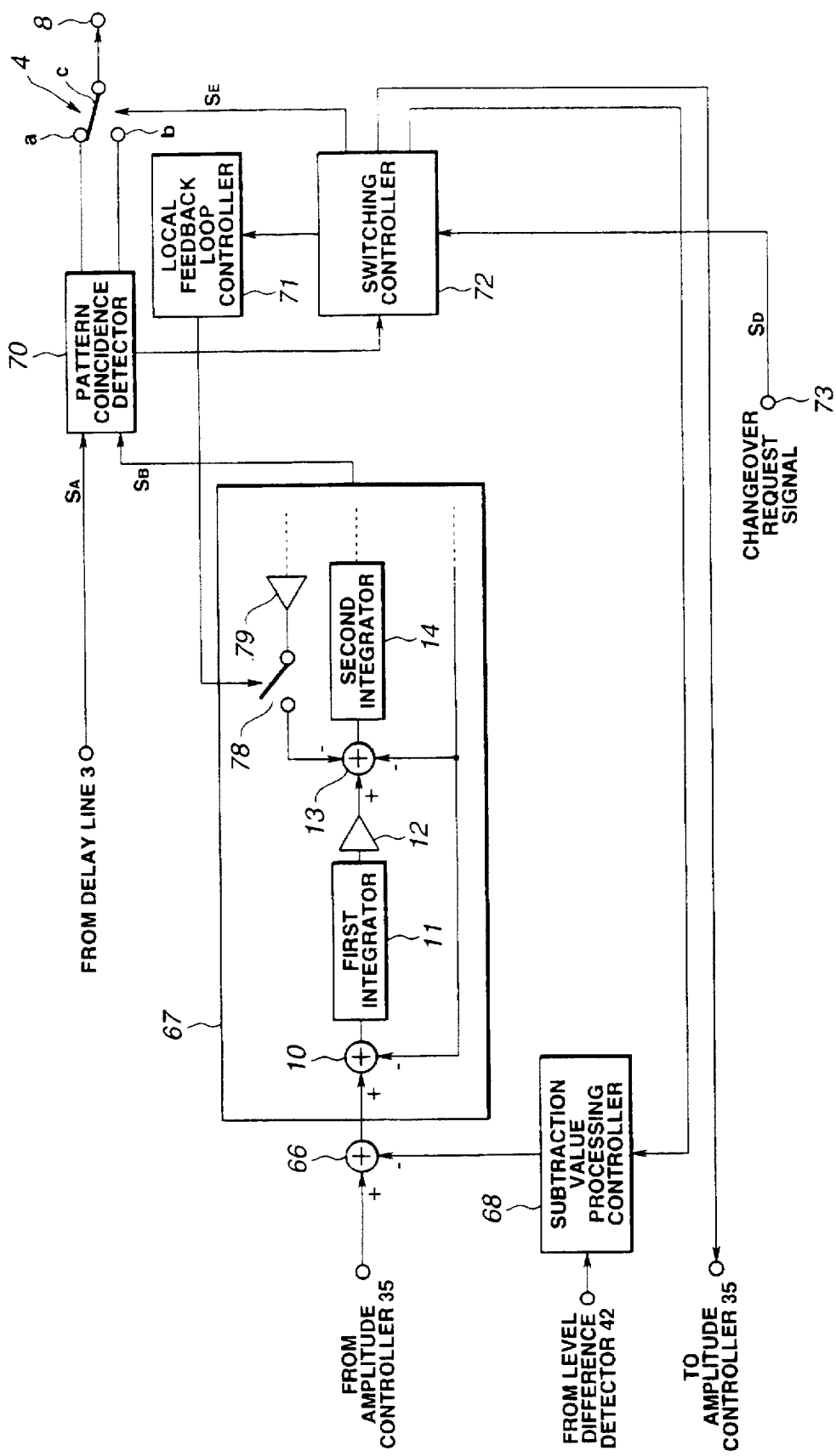
FIG. 27 is a block diagram showing details of essential parts of the seventh embodiment shown in FIG. 25.

In effect, with the digital signal processing device 65 of the present seventh embodiment, a switch 78 shown in FIG. 27 is provided in a feedback loop of the ΣΔ modulator having a local feedback loop 67 for controlling the switching timing by a local feedback loop controller 71.

The above processing is done for suppressing the noise generated on switching between the ΣΔ re-modulated signal obtained by ΣΔ modulator having the local feedback loop 75 and the original 1-bit signal.

That is, the digital signal processing device 65 includes a delay line 3, the word-length converter 5, the amplitude controller 35, the level difference detector 42, an adder 66, the ΣΔ modulator having the local feedback loop 67, the changeover switch 4, a switching controller 72, a subtraction value processing controller 68 for each integrator, a pattern coincidence detector 70 and a local feedback loop controller 71.

Figure 28:
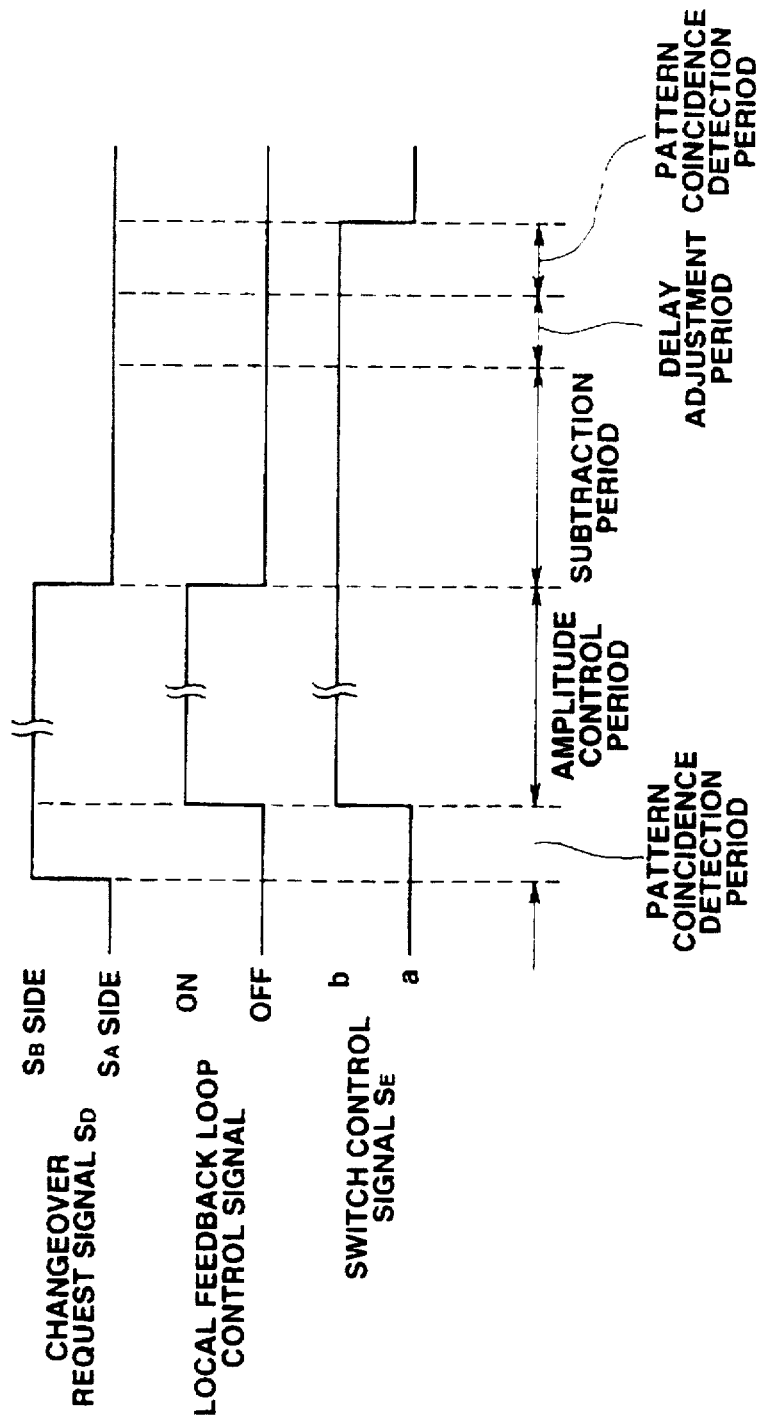
FIG. 28 is a timing chart for illustrating the operation of the seventh embodiment of FIG. 23.

The operation of the digital signal processing device 65 is explained by referring to the timing chart of FIG. 28.

During the time the original 1-bit delay signal $S_A$ is selected by the changeover switch 4, the local feedback loop controller 71 turns the local feedback loop of the ΣΔ modulator having a local feedback loop 67 off so as not to perform local feedback. On reception of a switching request signal $S_D$ for switching from the delayed original 1-bit signal $S_A$ to the ΣΔ re-modulated signal $S_B$, the switching controller 72 first detects the coincidence at the pattern coincidence detector 70 and subsequently causes the changeover switch 4 to switch from the delayed original 1-bit signal to the ΣΔ re-modulated signal $S_B$.

In response thereto, the local feedback loop 71 turns the local feedback loop control signal on and, by turning the switch 78 on, shorts the local feedback loop of the ΣΔ modulator having a local feedback loop 67 on to render local feedback active. On reception of the switching request signal $S_D$ from the ΣΔ re-modulated signal $S_B$ to the delayed original 1-bit signal $S_A$, after the gain is again restored to 1 through the amplitude processing by the amplitude controller 35, the local feedback loop 71 turns the local feedback loop control signal off to turn the local feedback loop of the ΣΔ modulator having a local feedback loop 67 off to stop local feedback.

In response thereto, the switching controller 72 causes the changeover switch 4 to switch from the output $S_B$ of the ΣΔ modulator having a local feedback loop 67 to the original 1-bit signal $S_A$, after passing through the subtraction by the subtraction value processing controller 68 and pattern coincidence detection processing, for realizing the switching free of noise.

Referring to FIGS. 29 to 32, an eighth embodiment is explained. This eighth embodiment is directed to a digital signal processing device 100 switching between two-channel $\Sigma\Delta$ modulated signal, as an input signal obtained by two-channel $\Sigma\Delta$ modulation, and the $\Sigma\Delta$ re-modulated signal obtained from this input signal by a changeover switch as switching means, and executes cross-fading.

This digital signal processing device 100 includes a $\Sigma\Delta$ modulator 115 for setting the gain ratio between the first stage feedback loop and the second stage feedback loop to 16 and for outputting the $\Sigma\Delta$ re-modulated 1-bit signal $S_B$, and a delay line 102 for delaying a $\Sigma\Delta$ modulated signal entered via an input terminal 101 by a first one of the above two channels a pre-set number of samples. This digital signal processing device 100 also includes a word length converter 103 for matching the amplitude level of the $\Sigma\Delta$ modulated signal to the amplitude level of the feedback signal to the first-stage integrator used in a $\Sigma\Delta$ modulator 115 and an amplitude controller 104 for controlling the amplitude level of the a first level-adjusted signal having its amplitude level adjusted by the word length converter 103. The digital signal processing device 100 also includes a delay line 108 for delaying the other $\Sigma\Delta$ modulated signal entered via an input terminal 101 by the second one of the above two channels a pre-set number of samples and a word length converter 109 for matching the amplitude level of the other $\Sigma\Delta$ modulated signal to the amplitude level of the feedback signal to the first-stage integrator used in the $\Sigma\Delta$ modulator 115. The digital signal processing device 100 also includes an amplitude controller 110 for controlling the amplitude level of the second level-adjusted signal having its amplitude level adjusted by the word length converter 109. The digital signal processing device 100 also includes an amplitude control output adjustment unit 105 comprised of a subtraction value processing controller for generating a signal for $\Sigma\Delta$ re-modulation from two input/output signals of the amplitude controller 104 and the amplitude controller 110 and/or the signal in the $\Sigma\Delta$ modulator 115 and for generation and subtraction of subtraction data obtained on the basis of the control processing during the amplitude control period. The digital signal processing device 100 further includes a switching controller 118 for controlling the amplitude controllers 104, 110, $\Sigma\Delta$ modulator 115, amplitude control output adjustment unit 105 and the changeover switch 117.

It s noted that the $\Sigma\Delta$ modulator 115 is a five-order $\Sigma\Delta$ modulator comprised of five integrators configured as shown in FIG. 6, and is of the same configuration as the $\Sigma\Delta$ modulator 6 shown in FIG. 7. Thus the gain ratio of the second-stage feedback loop to the state feedback loop excluding the integrator ahead and at back of the 1-bit quantizer in the $\Sigma\Delta$ modulator 115 is an integer value of 16. The number of delay samples in the delay lines 102 and 108 is set to 16 for correspondence to this gain ratio of 16.

The $\Sigma\Delta$ modulator 115 may be a five-order $\Sigma\Delta$ modulator comprised of five integrators configured as shown in FIG. 9, and may be configured as shown in FIG. 19. In such case, the pre-set number of samples is 15 (=16–1) in correspondence to the gain ratio of 16.

During the time the delayed signals from the delay lines 102 and 108 are selected by switching, the initial value of the integrator enclosed within the $\Sigma\Delta$ modulator 115 is set to 0.

The digital signal processing device 100 also includes a pattern coincidence detection unit1 16 for detecting coincidence between the one and the other $\Sigma\Delta$ modulated signals and the $\Sigma\Delta$ re-modulated signals over plural samples and, based on the control signal obtained by the pattern coincidence detection unit 116 for switching between the one or the other $\Sigma\Delta$ modulated signals $S_A$ and $S_C$ and the $\Sigma\Delta$ re-modulated signals $S_B$.

Figure 30:
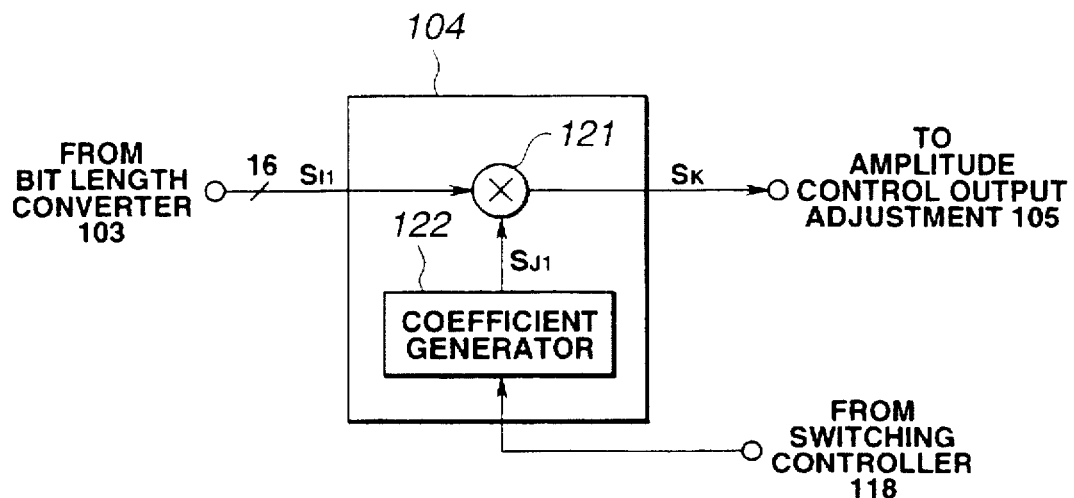
FIG. 30 is a circuit diagram showing a detailed structure of an amplitude controller of a first channel employed in the eighth embodiment.

The amplitude controller 104 is made up of a multiplier 121 and a coefficient generator 122, as shown in FIG. 30, and multiplies a first level-adjusted signal $S_{f1}$ from the bit length converter 103 by a coefficient output $S_{j1}$ from a coefficient generator 122 by the multiplier 121. The amplitude controller 104 then sends an amplitude controller output $S_K$ to the amplitude control output adjustment unit 105.

Figure 31:
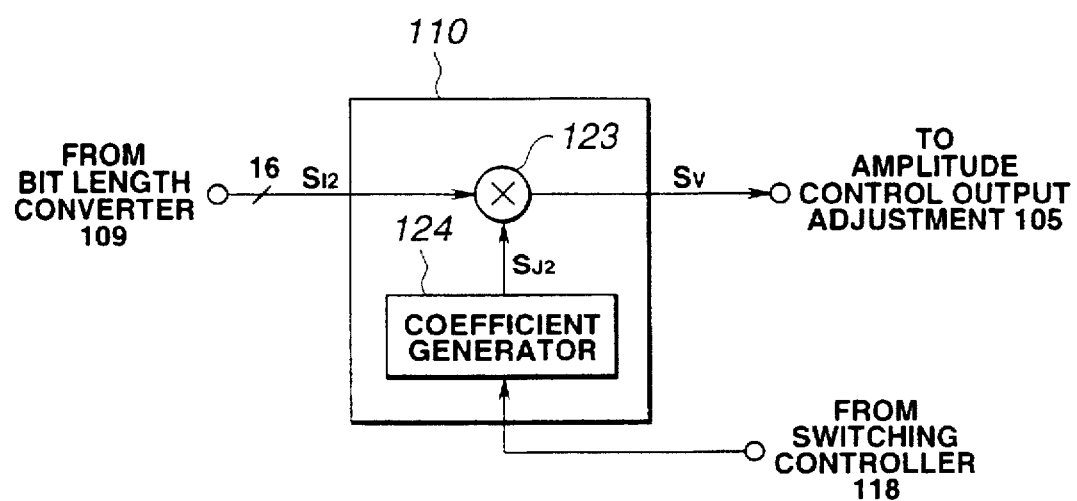
FIG. 31 is a circuit diagram showing a detailed structure of an amplitude controller of a second channel employed in the eighth embodiment.

The amplitude controller 110 is made up of a multiplier 123 and a coefficient generator 124, as shown in FIG. 31, and multiplies a second level-adjusted signal $S_{f2}$ from the bit length converter 109 by a coefficient output $S_{j2}$ from a coefficient generator 124 in the multiplier 123. The amplitude controller 110 then sends an amplitude controller output $S_V$ to the amplitude control output adjustment unit 105.

The subtraction value processing controller in the amplitude control output adjustment unit 105 may be configured in many ways, as will be specifically described in the embodiments as later explained.

Figure 32:
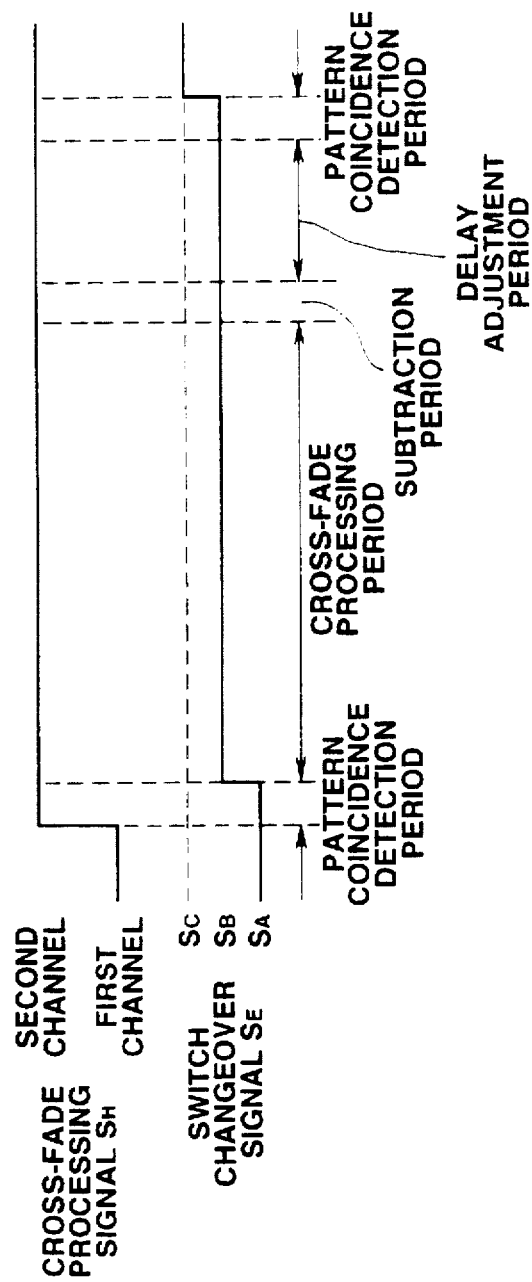
FIG. 32 is a timing chart for switching control of a changeover switch in case a cross-fading signal is supplied to the eighth embodiment.

The cross-fading processing operation, performed by the present digital signal processing device 100, is explained by referring to FIG. 32. FIG. 32 shows, in a timing chart, the switching operation which the switching controller 118 causes the changeover switch 117 to perform when the cross-fading processing signal $S_H$ is supplied to the control signal input terminal 120 of FIG. 29.

On reception of the cross-fading processing signal $S_H$ via the control signal input terminal 120, the switching controller 118 first awaits the pattern coincidence processing by the pattern coincidence detector 116, and subsequently sends the switch changeover signal $S_E$ to the changeover switch 117 in order to switch from the delayed original 1-bit signal $S_A$ of the first channel to the $\Sigma\Delta$ re-modulated signals $S_B$.

At this time, a sum signal $S_X$ by the amplitude control output adjustment unit 105 of the amplitude controller output obtained with the coefficient of the coefficient generator 122 in the amplitude controller 104 set to 1 with the amplitude controller output $S_V$ obtained with the coefficient of the coefficient generator 124 in the amplitude controller 110 set to 0, is supplied to the $\Sigma\Delta$ modulator 115.

The switching controller 118 then causes transition of the coefficient generator output $S_{j1}$ of the coefficient generator 122 in the amplitude controller 104 from 1 to 0, while causing transition of the coefficient generator output $S_{j2}$ of the coefficient generator 124 in the amplitude controller 110 from 0 to 1.

The amplitude control output adjustment unit 105 is fed with a gradually decreasing amplitude controller output $S_K$ and a gradually increasing amplitude controller output $S_V$. The amplitude control output adjustment unit 105 sends a cross-faded addition signal $S_X$ to the $\Sigma\Delta$ modulator 115. On termination of the cross-fading, the subtraction data, obtained on the basis of the control processing during the cross-fading period by the subtraction value processing controller in the amplitude control output adjustment unit 105 is gradually subtracted from the addition signal or from within $\Sigma\Delta$ modulator 115. On termination of the subtraction operation, the amplitude control output adjustment unit 105 first awaits the pattern coincidence processing in the pattern coincidence detector 116 and sends the switch changeover signal $S_E$ to the changeover switch 117 to switch from the ΣΔ re-modulator output $S_B$ to the delayed original 1-bit signal $S_C$ of the second channel.

Thus, if the 1-bit output signal outputted at an output terminal 119 of the digital signal processing device 100 is restored via a low-pass filter to an analog audio signal, the listener can hear the sound cross-faded from the original audio signal of the first channel to the original audio signal of the second channel with noise suppression.

Figure 33:
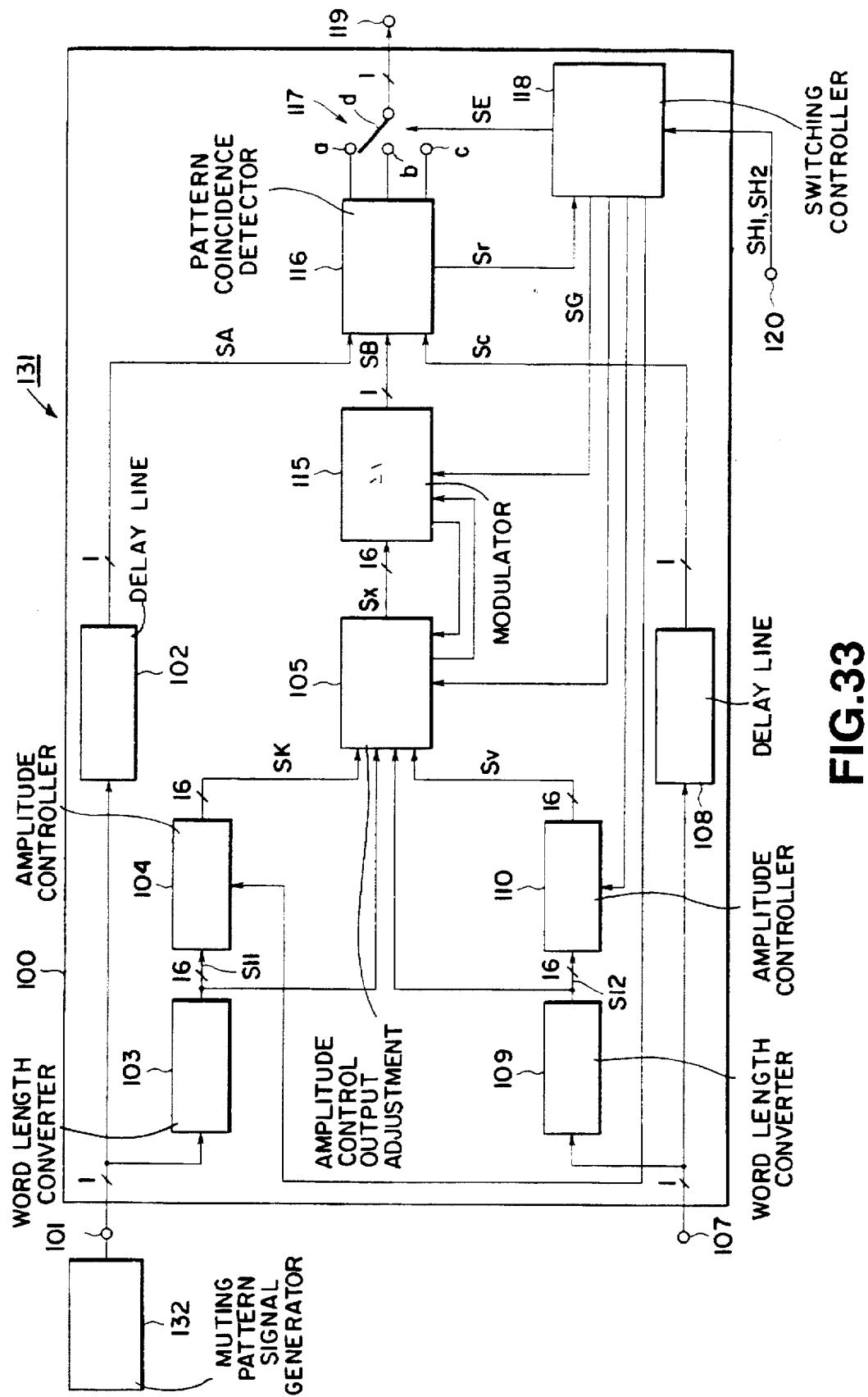
FIG. 33 is a block diagram of a ninth embodiment of the digital signal processing method and apparatus according to the present invention.

Referring to FIG. 33, a ninth embodiment will be explained. This ninth embodiment is directed to a digital signal processing device 131 for realizing fade-in from a muted pattern signal and fade-out to the muted pattern signal by cross-fading a 1-bit muted pattern signal and a 1-bit signal obtained by ΣΔ modulation.

This digital signal processing device 131 has a mute pattern signal generator 132 for generating a mute pattern signal connected to the input terminal 101 of the digital signal processing device 100 of the above-described eighth embodiment. Therefore, parts or components excluding mute pattern signal generator 132 are depicted by the same numerals as those of the eighth embodiment and are not specifically explained.

The operation of the digital signal processing device 131 is explained for the case of performing fade-in processing from a muting processing and for the case of performing muting processing from the fade-out processing.

First, in the case of fade-in processing, the digital signal processing device 131 receiving a fade-in processing signal $S_{H1}$ via control signal input terminal 120 performs cross-fading from the mute pattern signal obtained by the mute pattern signal generator 132 supplied to the input terminal 101 to the ΣΔ modulated signal supplied to the input terminal 107. This cross-fading processing is similar to that of the above-described eighth embodiment and hence is not explained specifically.

Thus, if the 1-bit output signal obtained at the output terminal 119 of the digital signal processing device 131 is restored to the analog audio signal via a low-pass filter, an audio signal fade-in processed from the muted state can be obtained with noise suppression.

Then, for fade-out processing, the digital signal processing device 100 receiving a fade-out processing signal $S_{H2}$ via switching control terminal 120 performs cross-fading processing from the ΣΔ modulated signal supplied to the input terminal 107 to the mute pattern signal obtained by the mute pattern signal generator 132 supplied to the input terminal 101.

This cross-fading processing is similar to that of the above-described eighth embodiment and hence is not explained specifically.

Thus, if the 1-bit output signal obtained at the output terminal 119 of the digital signal processing device 131 is restored to the analog audio signal via a low-pass filter, an audio signal which becomes muted after the fade-out processing is obtained under noise suppression.

Figure 34:
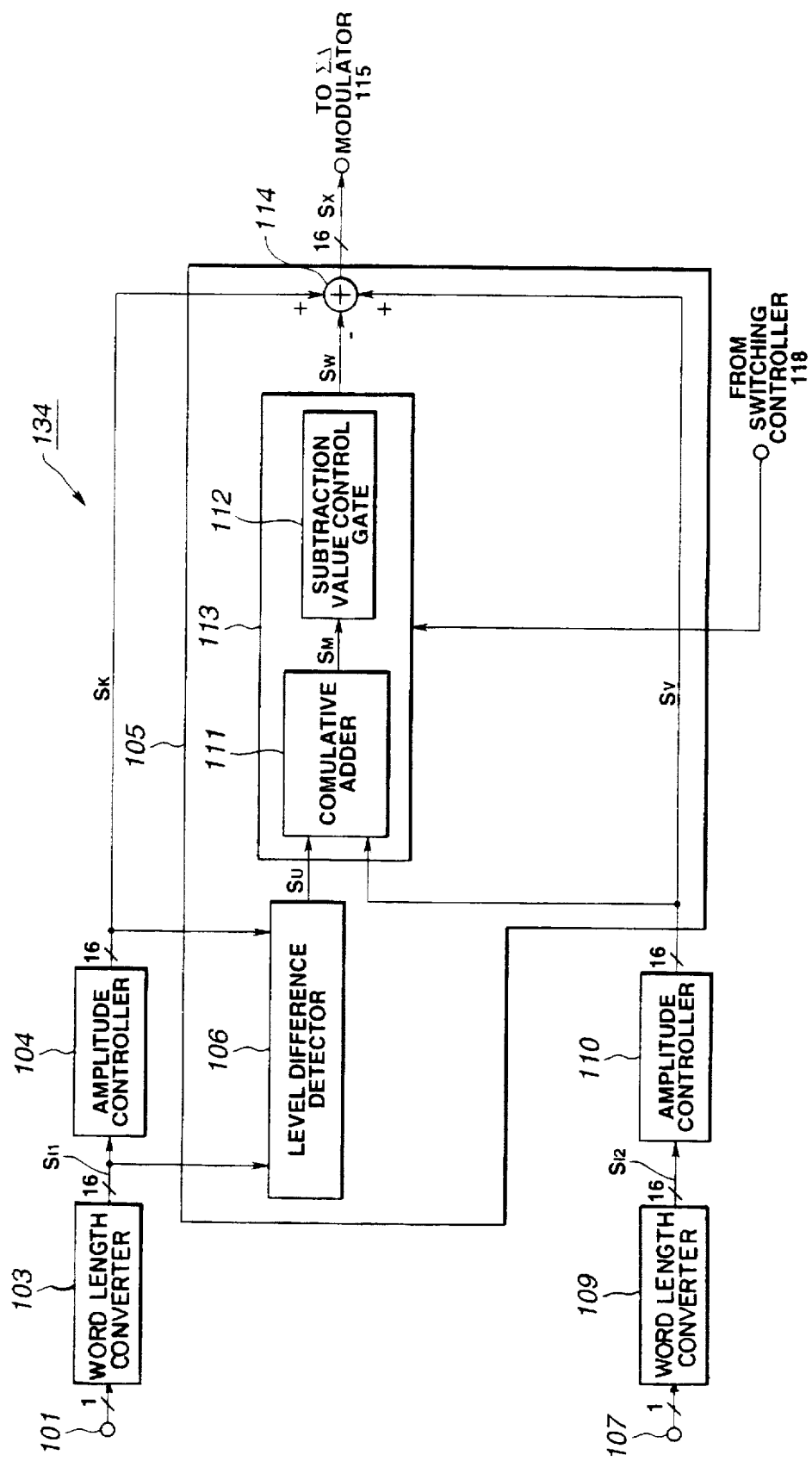
FIG. 34 is a block diagram of a tenth embodiment of the digital signal processing method and apparatus according to the present invention.
Figure 35:
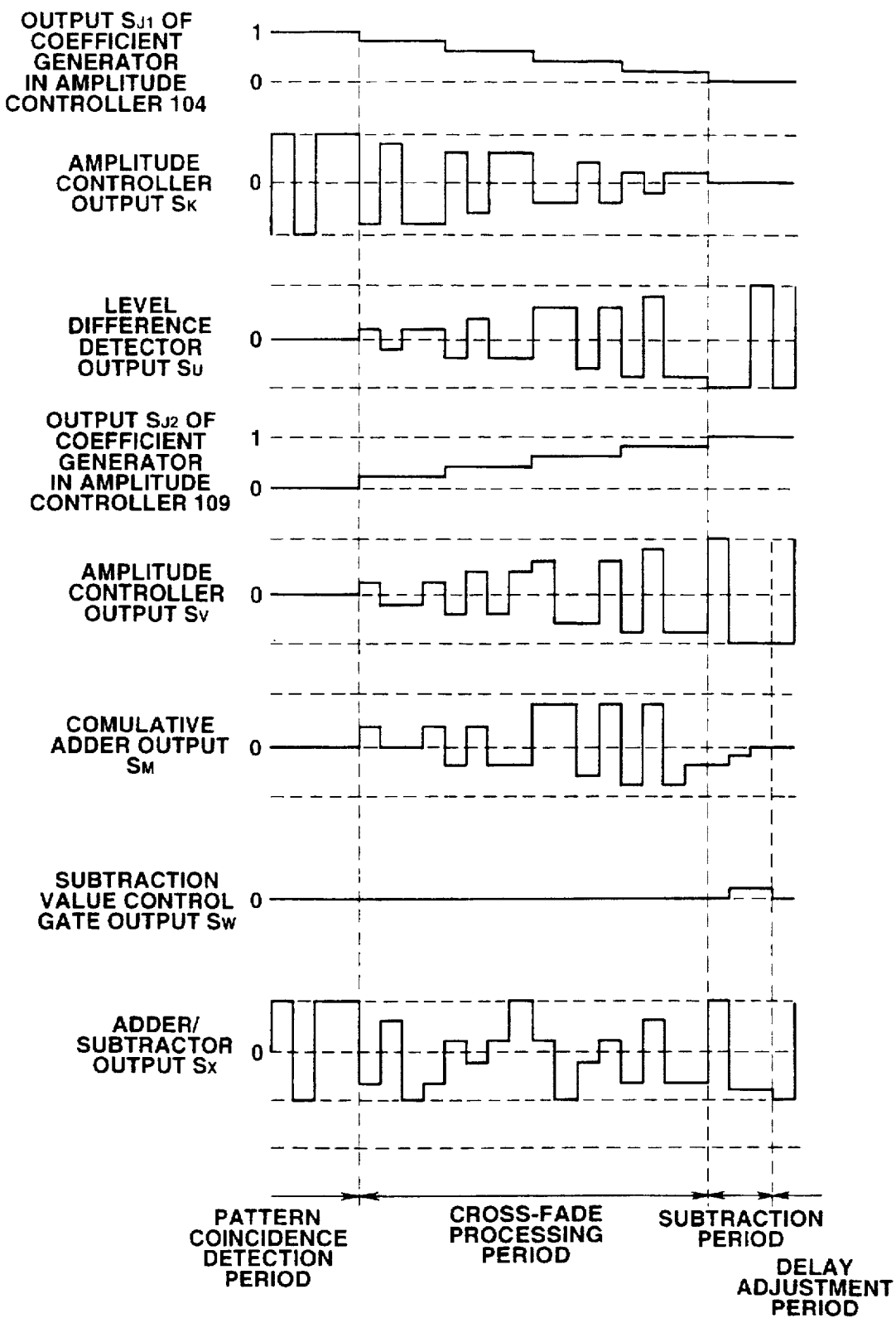
FIG. 35 is a timing chart for illustrating the operation of the tenth embodiment.

Referring to FIGS. 34 and 35, a tenth embodiment is now explained. This tenth embodiment is also a digital signal processing device for switching between two-channel ΣΔ modulated signals as input signals obtained by the two-channel ΣΔ modulation processing, and the ΣΔ re-modulated signal derived from this input signal, and performs cross-fading. This tenth embodiment differs from the eighth embodiment shown in FIG. 29 in arranging the amplitude control output adjustment unit 105 of the digital signal processing device 100 of the eighth embodiment as shown in FIG. 34 and is otherwise the same as the eighth embodiment.

The amplitude control output adjustment unit 105 includes a level difference detector 106 for detecting the difference between the first level adjustment signal from the word length converter 103 and the level of the amplitude control output by the amplitude controller 104, and a cumulative adder 111 for cumulatively adding the level difference $S_U$ from the level difference detector 106 and the amplitude control output $S_V$ for the amplitude level control period for the first and second level-adjusted signals over the amplitude level width length of the first and second level-adjusted signals. The amplitude control output $S_V$ is an amplitude-controlled second level-adjusted signal from the word length converter 109 outputted by the amplitude controller 110. The amplitude control output adjustment unit 105 also includes a subtraction value processing control gate 112 for gradually subtracting the cumulative sum $S_M$ of the cumulative adder 111 from the first and second level-adjusted signals using the adder/subtractor 114. The cumulative adder 111 and the subtraction value processing control gate 112 make up a subtraction value processing controller 113. The amplitude control output adjustment unit 105 is otherwise similar to the arrangement shown in FIG. 29. The timing chart for switching control performed by the switching controller 118 for the changeover switch 117 is similar to that of FIG. 32.

FIG. 35 shows, by an overall timing chart, the cross-fading processing operation by the present digital signal processing device 134.

First, on reception of the cross-fading signal $S_H$ via control signal input terminal 120, a switching controller 118 awaits the pattern coincidence processing by the pattern coincidence detector 116, and subsequently sends a switch changeover signal $S_E$ to the changeover switch 117 to switch from the delayed original 1-bit signal $S_A$ of the first channel to the ΣΔ modulator output $S_B$.

At this time, an addition signal $S_X$ by the adder/subtractor 114 in the amplitude control output adjustment unit 105 of the amplitude controller output $S_K$, obtained with the coefficient of the coefficient generator 122 in the amplitude controller 104 set to 1, and the amplitude controller output $S_V$, obtained with the coefficient of the coefficient generator 124 in the amplitude controller 110 set to 0, are fed to the ΣΔ modulator 115.

The switching controller 118 causes transition of the coefficient generator output $S_{J1}$ of the coefficient generator 122 in the amplitude controller 104 from 1 to 0, while causing transition of the coefficient generator output $S_{J2}$ of the coefficient generator 124 in the amplitude controller 110 from 0 to 1.

During this time, the level difference detector 106 detects the difference $S_U$ between the amplitude level of the level adjustment signal $S_{f1}$ (maximum amplitude level) and the input signal level to the adder/subtractor 114. The switching controller 118 controls the cumulative adder 111 for cumulatively adding the level difference $S_U$ and the output $S_V$ of the amplitude controller 110.

When the coefficient generator outputs $S_{J1}$ and $S_{J2}$ have reached 0 and 1, respectively, the switching controller 118 causes the adder/subtractor 114 to gradually subtract the data SM, accumulated in the cumulative adder 111, from the amplitude controller outputs $S_K$ and $S_V$ via the subtractor control gate 112.

When the cumulative sum value $S_M$ in the cumulative adder 111 reaches 0, the switching controller 118 controls the switching from the ΣΔ modulator output $S_B$ to the delayed original 1-bit signal $S_C$ of the second channel through the pattern coincidence processing following delay of a pre-set number of samples.

For preventing oscillation of the digital signal processing device 134, a first integrator 51 having a limiter shown in FIG. 21 is substituted for the first integrator of the ΣΔ modulator 115, and the limiter value is set to an integer number times the maximum amplitude level width.

If the limiter function is in operation while the integrated value of the first integrator is larger than the above limiter value, control is managed so that the cumulative sum value in the cumulative adder 111 is cleared to zero by the switching controller 118.

Thus, if the 1-bit output signal outputted at an output terminal of the digital signal processing device 134 is restored via a low-pass filter to an analog audio signal, the listener can hear the cross-faded sound from the original audio signal of the first channel to the original audio signal of the second channel with noise suppression.

Figure 36:
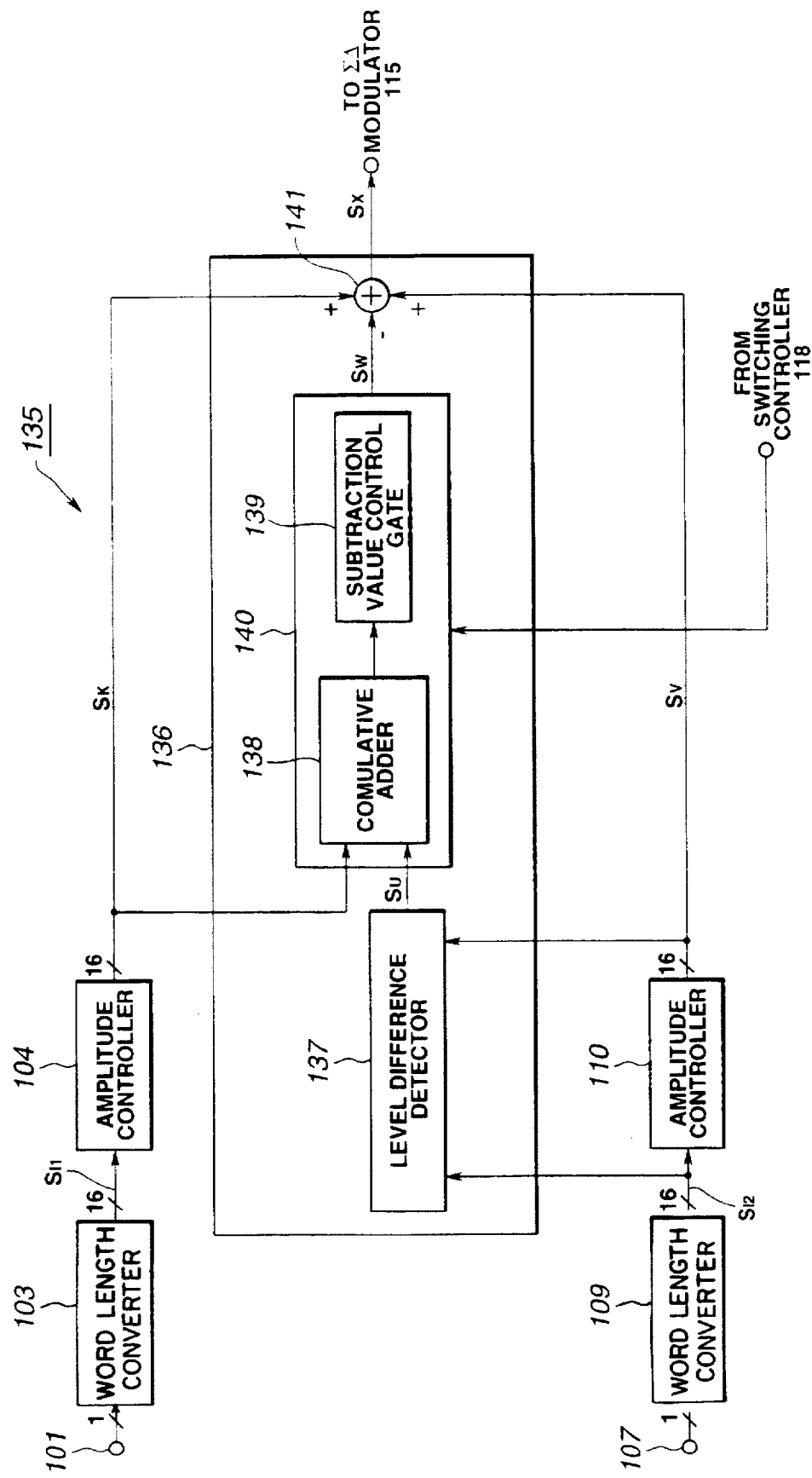
FIG. 36 is a block diagram of an eleventh embodiment of the digital signal processing method and apparatus according to the present invention.
Figure 37:
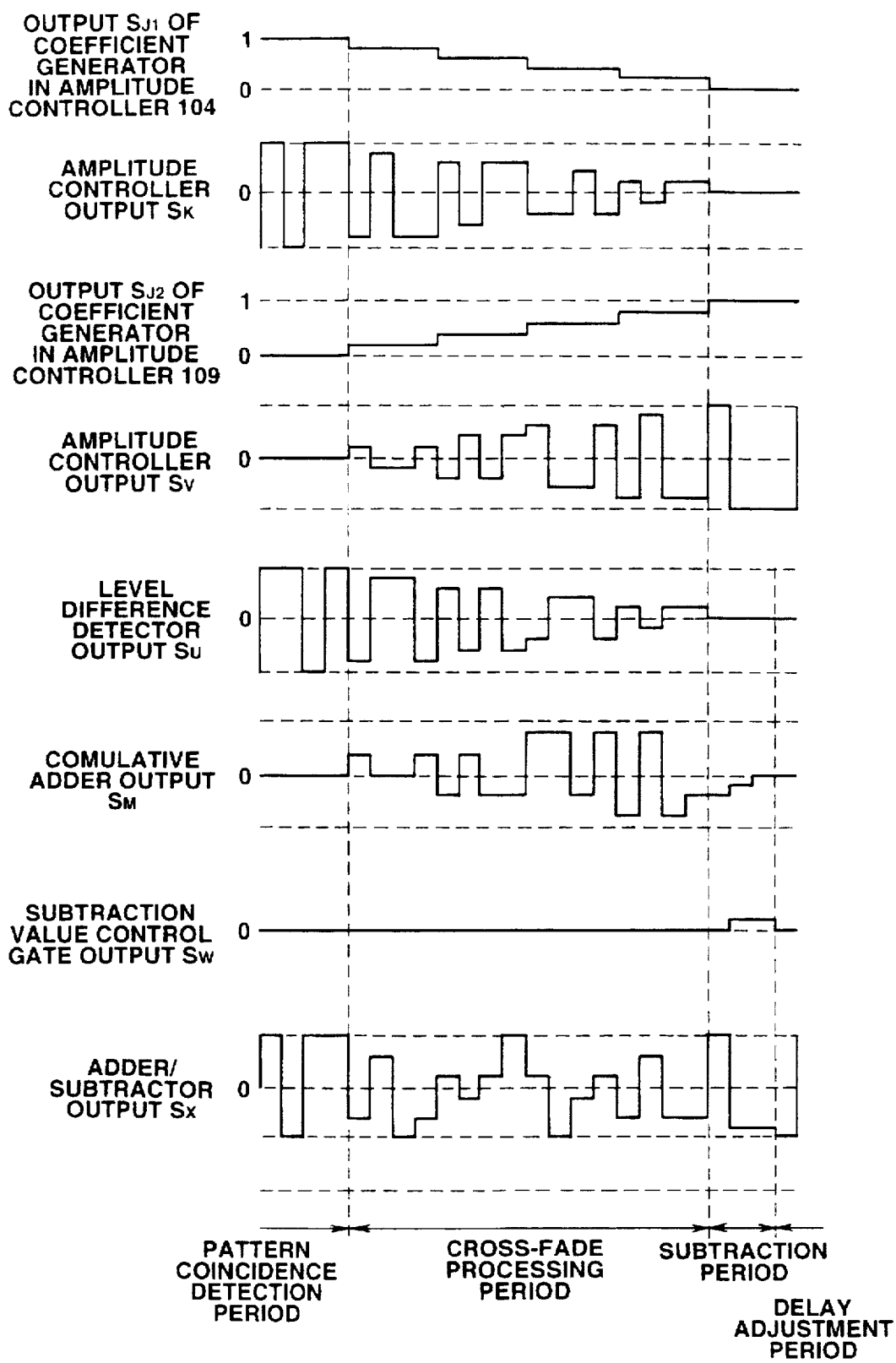
FIG. 37 is a timing chart for illustrating the operation of the eleventh embodiment.

Referring to FIGS. 36 and 37, an eleventh embodiment is now explained. This eleventh embodiment is directed to a digital signal processing device 135 configured for switching between two-channel ΣΔ modulated signal as an input signal obtained by the two-channel ΣΔ modulation processing, and ΣΔ re-modulated signal derived from this input signal, and performs cross-fading. This tenth embodiment differs from the eighth embodiment shown in FIG. 29 in substituting an amplitude control output adjustment unit 136 for the amplitude control output adjustment unit 105 of the digital signal processing device 100 of the eighth embodiment shown in FIG. 29, and is otherwise the same as the eighth embodiment.

The amplitude control output adjustment unit 136 includes a level difference detector 137 for detecting the difference between the above second level adjustment signal and the level following amplitude control by the amplitude controller 110, and a cumulative adder 138 for cumulatively adding the level difference from the level difference detector 137 and the level following control of the amplitude level of the first level adjustment signal by the amplitude controller 104 with the amplitude level width length during the period of amplitude level control of the first and second level-adjusted signals. The amplitude control output adjustment unit 136 also includes a subtraction value control gate 139 for gradually subtracting the cumulative sum of the cumulative adder 138 from the first and second level adjustment signals using the adder/subtractor 141. The cumulative adder 138 and the subtraction value control gate 139 make up a subtraction value processing controller 140. Since the various components of the amplitude control output adjustment unit 136 are similar to those of the amplitude control output adjustment unit 100, the corresponding description is not made.

The cross-fading processing operation performed by the digital signal processing device 135 is explained by referring to the timing chart of FIG. 37. The timing chart for switching control performed by the switching controller 18 is similar to that shown in FIG. 32.

First, the switching controller 118 receiving the cross-fading processing signal via switching control terminal 120 awaits the pattern coincidence processing at the pattern coincidence detector 116 and sends a switch changeover signal $S_E$ to the changeover switch 117 in order to switch from the delayed 1-bit signal $S_A$ of the first channel to the ΣΔ modulator output $S_B$.

To the ΣΔ modulator 115 is sent the addition signal $S_X$ by the adder/subtractor 114 of the amplitude controller output $S$ obtained with the coefficient of the coefficient generator 122 in the amplitude controller 104 set to 1 and the amplitude controller output $S_V$ obtained with the coefficient of the coefficient generator 124 in the amplitude controller 110 set to 0.

The switching controller 118 then causes transition of the coefficient generator output $S_{f1}$ of the coefficient generator 122 in the amplitude controller 104 from 1 to 0, while causing transition of the coefficient generator output $S_{f2}$ of the coefficient generator 124 in the amplitude controller 110 from 0 to 1.

During this time, the level difference detector 137 detects the difference $S_U$ of the input signal level to the adder/subtractor 141 with respect to the amplitude level of the level-adjusted signal $S_{f2}$ (maximum amplitude level). During this time, the switching controller 118 controls the cumulative adder 138 for cumulatively adding the level difference $S_U$ to the output $S_K$ of the amplitude controller 104.

When the coefficient generator output $S_{f1}$ and the coefficient generator output $S_{f2}$ reach 0 and 1, respectively, the switching controller 118 gradually subtracts the data $S_M$ accumulated in the cumulative adder 138 by the adder/subtractor 141 from the amplitude controller output $S_K$ and the amplitude controller output $S_V$ through the subtraction control gate 139.

When the cumulative addition value $S_M$ of the cumulative adder 138 reaches 0, the switching controller 118 controls the switching from the ΣΔ modulator output $S_B$ to delayed original 1-bit delay signal $S_C$ through pattern coincidence processing following delay over a preset number of samples.

For preventing oscillation of the digital signal processing device 135, a first integrator 51 having a limiter 51 shown in FIG. 21 is substituted for the first integrator of the ΣΔ modulator 115, and the limiter value is set to an integer number times the maximum amplitude level width.

If the limiter function is in operation while the integrated value of the first integrator is larger than the above limiter value, control is managed so that the cumulative sum value in the cumulative adder 111 is cleared to zero by the switching controller 118.

Thus, if the 1-bit output signal outputted at an output terminal of the digital signal of the first channel to the digital signal processing device 134 is restored via a low-pass filter to an analog audio signal, the listener can hear the noise-suppressed cross-faded sound cross-faded from the original audio signal of the second channel.

Figure 38:
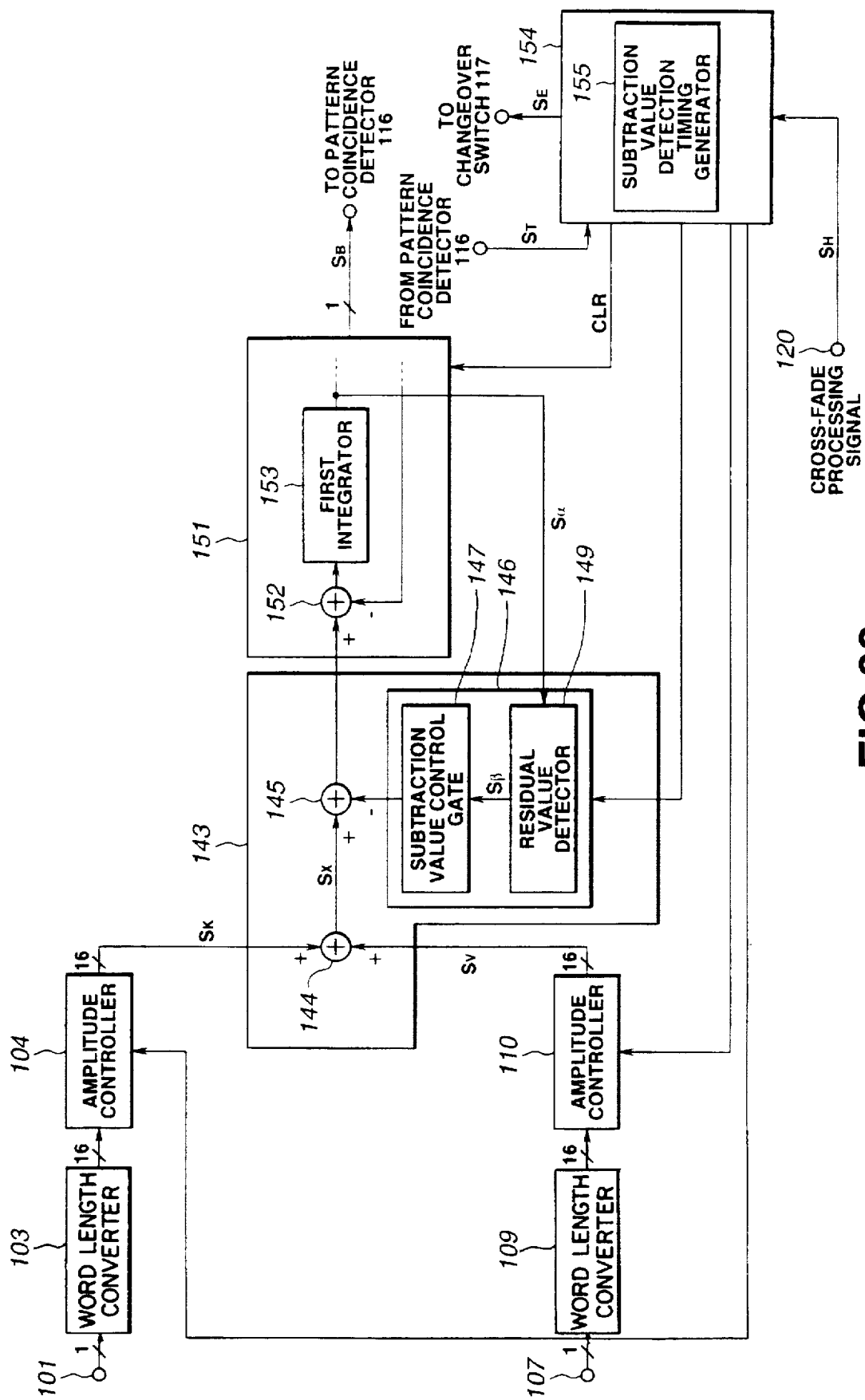
FIG. 38 is a block diagram of a twelfth embodiment of the digital signal processing method and apparatus according to the present invention.

Referring to FIG. 38, a twelfth embodiment is now explained. This twelfth embodiment is directed to a digital signal processing device configured for switching between two-channel ΣΔ modulated signal as an input signal obtained by the two-channel ΣΔ modulation processing, and a ΣΔ re-modulated signal derived from this input signal, by the changeover switch 117 as switching means, and performs cross-fading. This twelfth embodiment differs from the eighth embodiment shown in FIG. 29 in substituting the amplitude control output adjustment unit 143 for the amplitude control output adjustment unit 105 of the digital signal processing device 100 of the eighth embodiment shown in FIG. 29 and in substituting a switching controller 154 for the switching controller 118. The present twelfth embodiment is otherwise the same as the eighth embodiment.

The amplitude control output adjustment unit 143 includes a remainder detector 149 for detecting the remainder of the integrated value $S\alpha$ of a first integrator 153 in the ΣΔ modulator 151 with respect to the maximum amplitude level width (equal to twice the above maximum amplitude level) and a subtraction value detector 147 for gradually subtracting the remainder detected by the remainder detector 149 from the maximum amplitude level signal outputted by the adder 144 using an adder./subtractor 145. The remainder detector 149 and the subtraction value detector 147 make up a subtraction value processing controller 146.

The ΣΔ modulator 151 is configured similarly to the ΣΔ modulator 6 shown in FIG. 7 and is comprised of a first coefficient multiplier connected downstream of a first adder 152 and the first integrator 153. The integrated value outputted by the first integrator 153 is supplied to the remainder detector 149 in the subtraction value processing controller 146.

The switching controller 154 controls the amplitude controllers 104, 110, ΣΔ modulator 151, amplitude control output adjustment unit 143 and the changeover switch 117, and is particularly characterized in that a subtraction value detection timing generator 155, generating a subtraction value detection timing signal, is provided in the subtraction value processing controller 146 in the amplitude output adjustment unit 143.

The operation of the digital signal processing device of the present twelfth embodiment is explained. First, the switching controller 154 receiving the cross-fading processing signal via switching control terminal 120 awaits the pattern coincidence processing at the pattern coincidence detector 116 and sends a switch changeover signal $S_E$ to the changeover switch 117 in order to switch from the delayed 1-bit signal $S_A$ of the first channel to the ΣΔ modulator output $S_B$.

To the ΣΔ modulator 151 is sent the addition signal $S_X$ by the adder 144 of the amplitude controller output $S_K$ obtained with the coefficient of the coefficient generator 122 in the amplitude controller 104 of FIG. 26 set to 1 and the amplitude controller output $S_V$ obtained with the coefficient of the coefficient generator 124 in the amplitude controller 110 set to 0.

The switching controller 154 then causes transition of the coefficient generator output $S_{J1}$ of the coefficient generator 122 in the amplitude controller 104 from 1 to 0, while causing transition of the coefficient generator output $S_{J2}$ of the coefficient generator 124 in the amplitude controller 110 from 0 to 1.

At a point after outputs of the amplitude controller 104 and the amplitude controller 110 become 0 and 1 (maximum amplitude level), respectively, by the cross-fading processing, the subtraction value detection timing generator 155 in the switching controller 154 generates a subtraction value detection timing signal. The subtraction value control gate 147 is responsive to the subtraction value detection timing signal to seize a remainder Sβ from the remainder value detector 149.

The subtraction value control gate 147 is responsive to the subtraction value detection timing signal to seize the remainder Sβ and causes the subtractor 145 to gradually subtract the remainder value from the addition signal $S_X$.

The switching controller 154 controls the switching from the ΣΔ modulator output $S_B$ to the delayed original 1-bit signal $S_C$ of the second channel through the pattern coincidence processing following delay of a pre-set number of samples.

Thus, if the 1-bit output signal outputted at an output terminal of the digital signal of the digital signal processing device 134 of the twelfth embodiment is restored via a low-pass filter to an analog audio signal, cross-fading is realized from the original audio signal to the original audio signal of the second channel with noise suppression.

Figure 39:
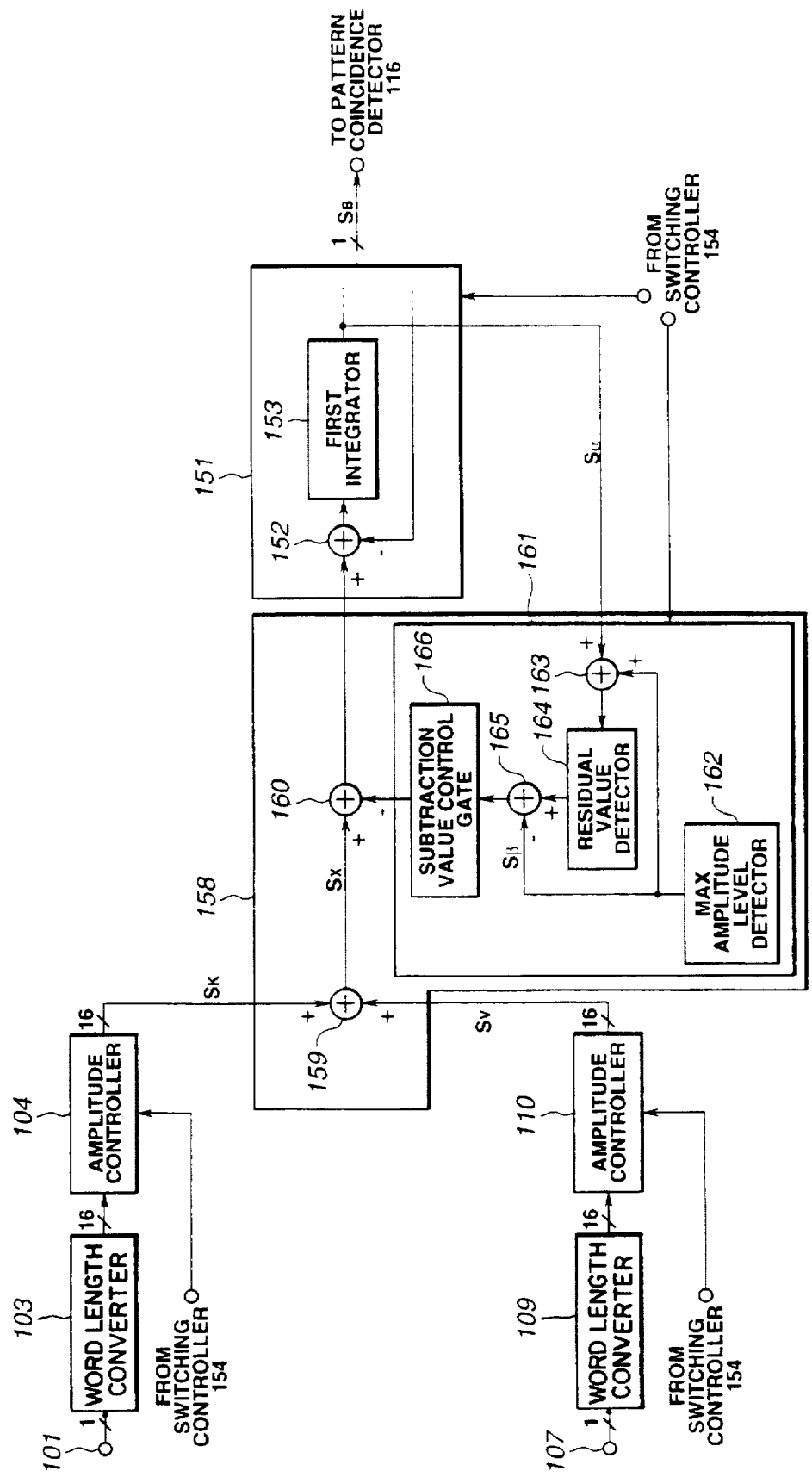
FIG. 39 is a block diagram of a thirteenth embodiment of the digital signal processing method and apparatus according to the present invention.
Figure 40:
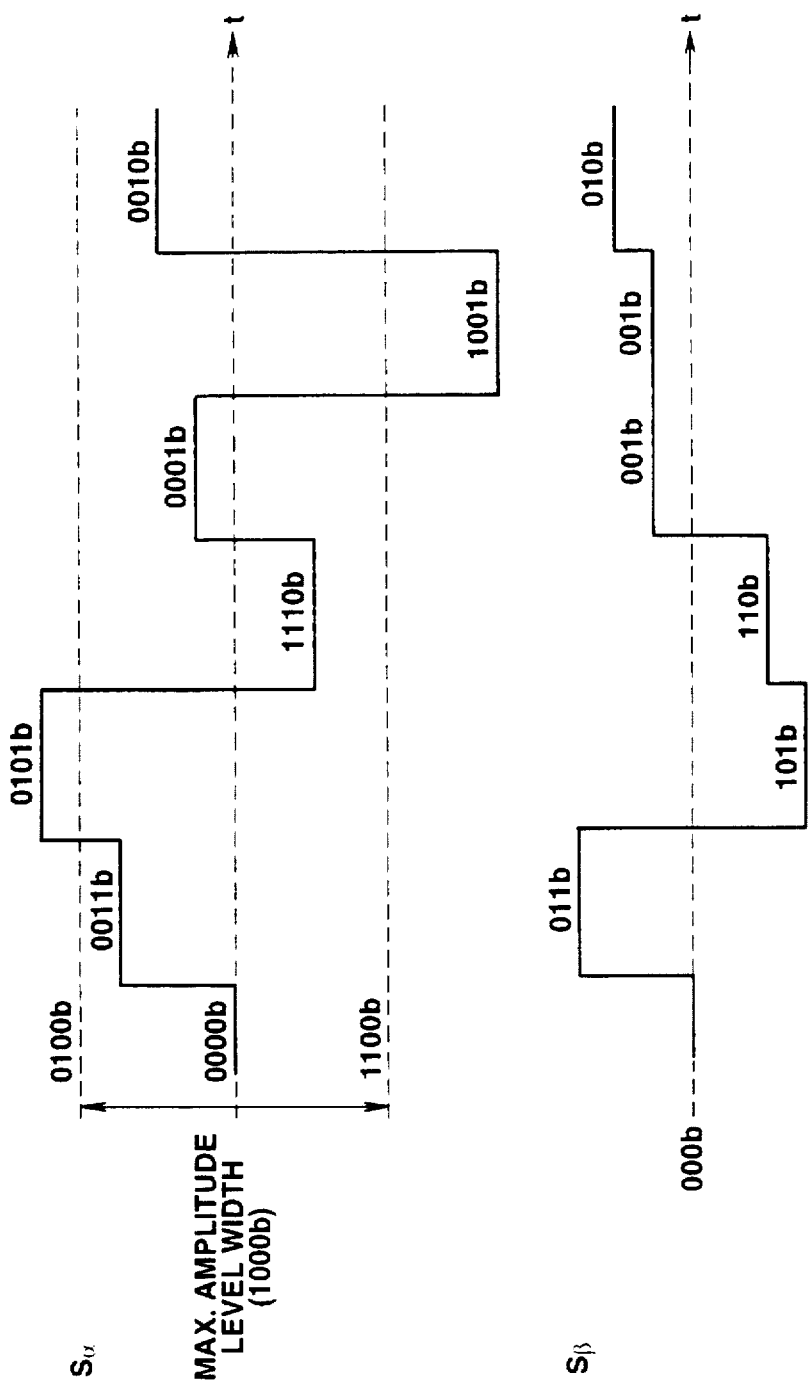
FIG. 40 illustrates signal examples of an integrated value Sαn an amplitude control output adjustment unit and an output Sβ of an adder employed in the thirteenth embodiment for binary number calculation.

Referring to FIGS. 39 and 40, a thirteenth embodiment is now explained. This thirteenth embodiment is directed to a digital signal processing device configured for switching between two-channel ΣΔ modulated signal as an input signal obtained by the two-channel ΣΔ modulation processing, and ΣΔ re-modulated signal derived from this input signal, by a changeover switch as switching means, and performs cross-fading.

Figure 29:
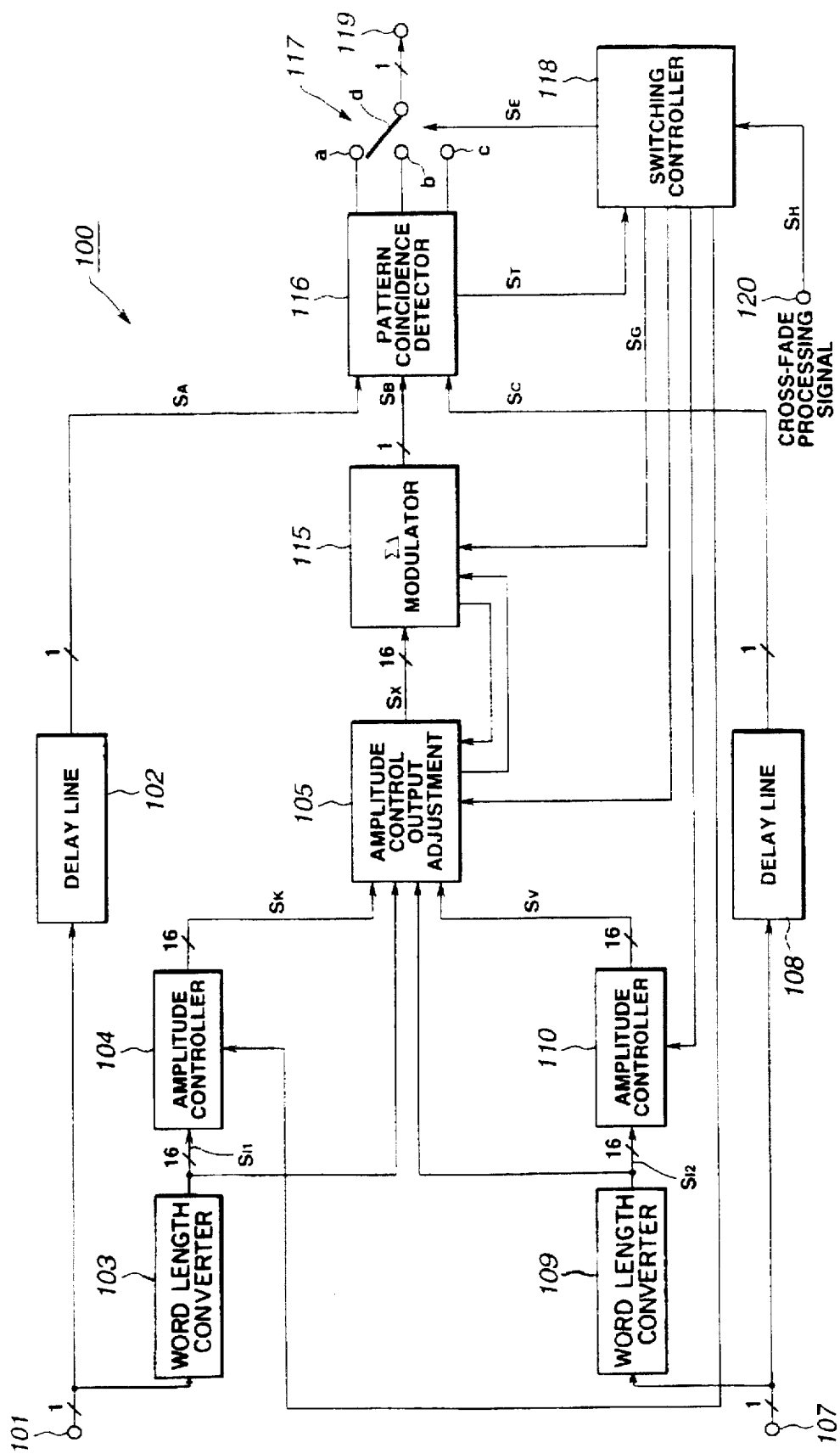
FIG. 29 is a block diagram of an eighth embodiment of the digital signal processing method and apparatus according to the present invention.

This thirteenth embodiment differs from the eighth embodiment shown in FIG. 29 in substituting an amplitude control output adjustment unit 158 for the amplitude control output adjustment unit 105 of the digital signal processing device 100 of the eighth embodiment shown in FIG. 29 and is otherwise the same as the eighth embodiment.

The amplitude control output adjustment unit 158 includes an adder 163 for adding the positive maximum amplitude level from the maximum amplitude level generator 162 to the integrated value Sα of the first integrator 153 in the ΣΔ modulator 151, and a remainder value detector 164 for detecting the remainder value relative to the maximum amplitude level (equal to the above maximum amplitude level) of the addition output of the adder 163. The amplitude control output adjustment unit 158 also includes a subtractor 165 for subtracting the positive maximum amplitude level from the remainder value detected by the remainder value detector 164, and a subtraction value control gate 166 for gradually subtracting the subtraction output of the subtractor 165 from the maximum amplitude level signal outputted by the adder 159 using the adder/subtractor 160. The subtraction output is termed thereinafter as the result of subtraction of the addition remainder value. The adder 163, remainder value detector 164, subtraction value control gate 166 and a maximum amplitude level generator 162 make up a subtraction value processing controller 161.

The operation of the digital signal processing device of the present thirteenth embodiment is explained by referring to FIG. 40 showing signal examples of the integration value Sα and the result of subtraction of the addition remainder value Sβ in the case of binary processing.

First, the switching controller 154 receiving the cross-fading processing signal via switching control terminal 120 awaits the pattern coincidence processing at the pattern coincidence detector 116 and sends a switch changeover signal $S_E$ to the changeover switch 117 in order to switch from the delayed 1-bit signal $S_A$ of the first channel to the ΣΔ modulator output $S_B$.

To the ΣΔ modulator 151 is sent, via a subtractor 160, an addition signal $S_X$ by the adder 159 of the amplitude controller output $S_K$ obtained with the coefficient of the coefficient generator 122 in the amplitude controller 104 of FIG. 30 set to 1 and the amplitude controller output $S_V$ obtained with the coefficient of the coefficient generator 124 in the amplitude controller 110 set to 0.

The switching controller 118 then causes transition of the coefficient generator output $S_{J1}$ of the coefficient generator 122 in the amplitude controller 104 from 1 to 0, while causing transition of the coefficient generator output $S_{J2}$ of the coefficient generator 124 in the amplitude controller 110 from 0 to 1.

At a point after outputs of the amplitude controller 104 and the amplitude controller 110 become 0 and 1 (maximum amplitude level), respectively, by the cross-fading processing, the subtraction value detection timing generator 155 in the switching controller 154 generates a subtraction value detection timing signal. The subtraction value control gate 166 is responsive to the subtraction value detection timing signal to seize the remainder Sβ from the remainder value detector 165.

The result of subtraction of the addition remainder value Sβ is now explained. The first integrator 153 of the ΣΔ modulator 151 outputs an integrated value Sα shown in FIG. 40. It is assumed that the maximum amplitude level width is 1000 (binary) as a power of 2. Then, by detecting the lower 3 bits and recognizing them as a 2's complement, the detection value directly becomes the result of subtraction of the addition remainder value Sβ obtained on subtracting the positive maximum amplitude level from the remainder value corresponding to addition of the positive maximum amplitude level.

By adding the positive maximum amplitude level by the adder 163 to the integrated value Sα as an output of the first integrator 153, detecting the remainder of the addition output from the maximum amplitude level width by the remainder value detector 164 and by subtracting the maximum amplitude level from the remainder by a subtractor 165, the result of subtraction of the addition remainder value Sβ is obtained. This result of subtraction of the addition remainder value Sβ is the lower 3 bits of the integrated value Sα.

The subtraction value control gate 166 seizes the result of subtraction of the addition remainder value Sβ responsive to the subtraction value detection timing signal and gradually subtracts the result Sβ from the addition signal $S_X$.

The switching controller 154 controls switching from the ΣΔ modulator output $S_B$ to the delayed original 1-bit signal $S_C$ of the second channel through the pattern coincidence processing following delay over a pre-set number of samples.

Thus, if the 1-bit output signal outputted at an output terminal of the digital signal processing device of the thirteenth embodiment is restored via a low-pass filter to an analog audio signal, cross-fading from the original audio signal of the first channel to the original audio signal of the second channel with noise suppression is realized.

By using the result of subtraction of the addition remainder value Sβ, obtained on subtracting the maximum amplitude level from the remainder, as a value seized by the subtraction value control gate 166, the time of convergence to zero may be halved for realizing smoother switching.

Figure 41:
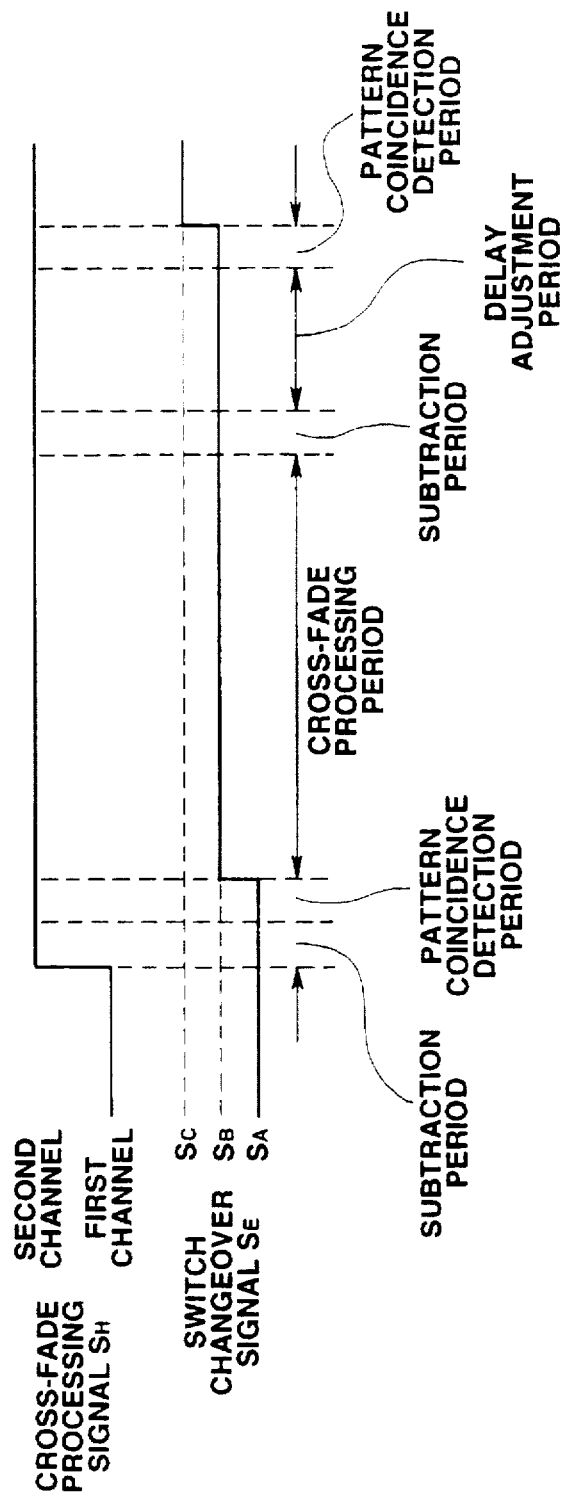
FIG. 41 is a timing chart for illustrating the operation of a fourteenth embodiment of the digital signal processing method and apparatus according to the present invention.
Figure 42:
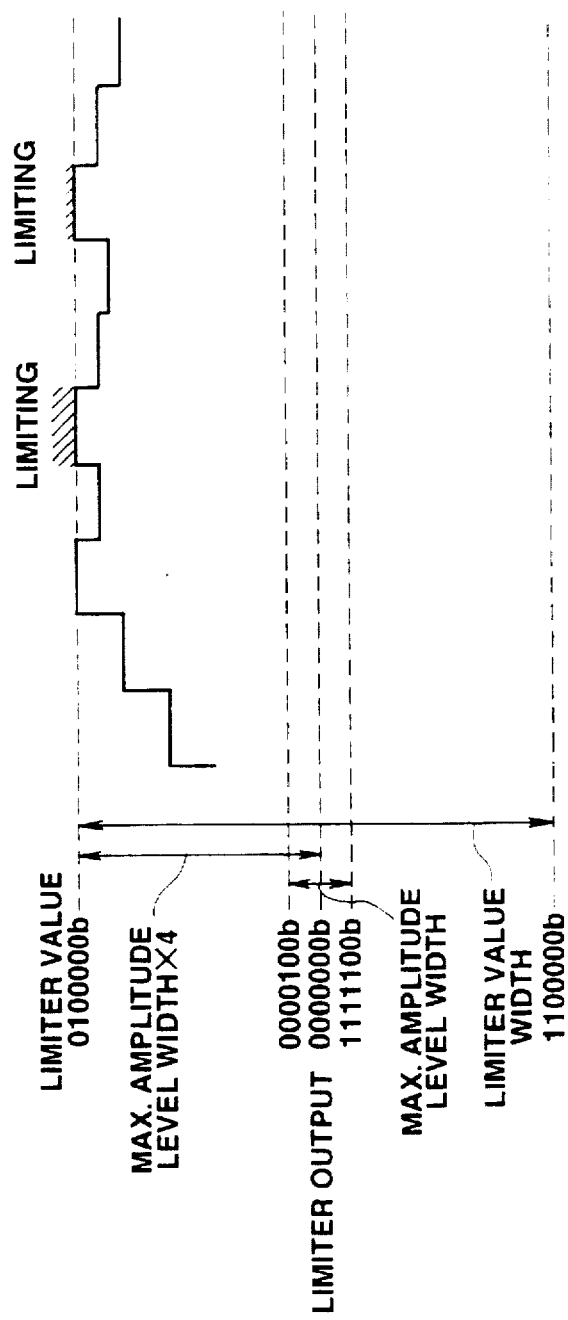
FIG. 42 is a timing chart for illustrating the operation of a digital signal processing method and apparatus as a modification of the fourteenth embodiment according to the present invention.

Referring to FIGS. 41 and 42, a fourteenth embodiment is explained, in which the first integrator 51 having the limiter shown in FIG. 21 is substituted for the first integrator 153 of the ΣΔ modulator 151 in the digital signal processing device of the above-described twelfth embodiment, is explained. This fourteenth embodiment is directed to a digital signal processing device for causing a changeover switch 117, as switching means, to switch between the two-channel ΣΔ modulated signal, as an input signal obtained by the two-channel ΣΔ modulation, and ΣΔ re-modulated signal derived from the input signal, and performs cross-fading. However, there is provided a first integrator having a limiter 151, for preventing dispersion in the ΣΔ modulator 151.

The integrated value Sα, limited by the integrator 51 having the limiter, is supplied to a remainder value detector 149 in the subtraction value controller 146 shown in FIG. 38.

Referring to FIG. 41, the operation of the digital signal processing device according to the fourteenth embodiment is now explained. On reception of the cross-fading signal $S_H$ via control signal input terminal 120, a switching controller 154 shown in FIG. 41 awaits the pattern coincidence processing by the pattern coincidence detector 116, and subsequently sends a switch changeover signal $S_E$ to the changeover switch 117. The changeover switch switches from the delayed original 1-bit signal $S_A$ of the first channel to the ΣΔ modulator output $S_B$. Before this pattern coincidence processing, the digital signal processing device causes the subtraction value control gate 147 to gradually subtract, from the maximum amplitude level signal, the remainder value Sβ from the maximum amplitude level width of the limiter integrated value Sα during the period of selection of the delayed original 1-bit signal, using the subtractor 145.

Subsequently, an addition signal $S_X$ by the adder/subtractor 144 in the amplitude control output adjustment unit 144 of the amplitude controller output $S_K$ obtained with the coefficient of the coefficient generator 122 in the amplitude controller 104 of FIG. 30 set to 1 and the amplitude controller output $S_V$ obtained with the coefficient of the coefficient generator 124 in the amplitude controller 110 set to 0, is fed via subtractor 145 to the ΣΔ modulator 151.

The switching controller 154 causes transition of the coefficient generator output $S_{J1}$ of the coefficient generator 122 in the amplitude controller 104 from 1 to 0, while causing transition of the coefficient generator output $S_{J2}$ of the coefficient generator 124 in the amplitude controller 110 from 0 to 1.

At a point after outputs of the amplitude controller 104 and the amplitude controller 110 become 0 and 1 (maximum amplitude level), respectively, by the cross-fading processing, the subtraction value detection timing generator 155 in the switching controller 154 generates a subtraction value detection timing signal. The subtraction value control gate 147 is responsive to the subtraction value detection timing signal to seize a remainder Sβ from the remainder value detector 149.

The subtraction value control gate 147 is responsive to the subtraction value detection timing signal to seize the remainder Sβ and causes the subtractor 145 to gradually subtract the remainder value from the addition signal $S_X$.

The switching controller 154 controls the switching from the ΣΔ modulator output $S_B$ to the delayed original 1-bit signal $S_C$ of the second channel through the pattern coincidence processing following delay of a pre-set number of samples.

Thus, if the 1-bit output signal outputted at an output terminal of the digital signal of the digital signal processing device 134 of the twelfth embodiment is restored via a low-pass filter to an analog audio signal, there is realized cross-fading from the original audio signal to the original audio signal of the second channel with noise suppression.

A modification of the digital signal processing device according to the fourteenth embodiment is now explained. This modification is directed to a digital signal processing device in which the limit value of the first integrator having the limiter 51 of the ΣΔ modulator 151 is set to a value equal to, for example, four times the maximum amplitude level width. Various components of FIGS. 21 and 38 apply unchanged and hence the corresponding description is not made.

That is, the digital signal processing device according to the present modification has a first integrator 51 having a limiter for limiting the integrated value of the ΣΔ modulator 151 with a limit value of an integer number multiple, such as four times, of the maximum amplitude level width.

The operation of the digital signal processing device according to the present modification is explained by referring to FIG. 42.

If the maximum amplitude level width is 01000 (binary), the limit values of the first integrator having the limiter 51 become 0100000 and 1100000. This sets the remainder from the maximum amplitude level width during operation of the first integrator 51 having the limiter to 0. Thus, with the present modification, subtraction of the remainder value from the maximum amplitude level by the subtraction control gate 147 prior to switching control to the ΣΔ re-modulated 1-bit signal, required with the digital signal processing device according to the fourteenth embodiment, is not required, such that cross-fading from the original audio signal of the first channel to the original audio signal of the second channel under noise suppression is realized even on limiter operation.

29

A fifteenth embodiment, in which the ΣΔ modulator 151 shown in FIG. 21 is substituted for the first integrator 153 of the ΣΔ modulator 151 of the digital signal processing device according to the thirteenth embodiment, is explained. The present fifteenth embodiment is directed to a digital signal processing device having a changeover switch 117 as switching means for switching between the two-channel ΣΔ modulated signal as an input signal obtained by the two-channel ΣΔ modulation and the ΣΔ re-modulated signal derived from the input signal, and executes cross-fading. The present fifteenth embodiment has a first integrator having limiter 51 for preventing dispersion of the ΣΔ modulator 151.

The integrated value Sα, limited by the integrator 51 having the limiter, is supplied to a remainder value detector 163 in the amplitude control output adjustment unit 158 shown in FIG. 39.

On reception of the cross-fading signal $S_H$ via control signal input terminal 120, the switching controller 154 awaits the pattern coincidence processing by the pattern coincidence detector 116, and subsequently sends a switch changeover signal $S_E$ to the changeover switch 117. The changeover switch switches from the delayed original 1-bit signal $S_A$ of the first channel to the ΣΔ modulator output $S_B$. Before this pattern coincidence processing, the digital signal processing device gradually subtracts, from the maximum amplitude level signal entering the ΣΔ modulator 151, the remainder value Sβ from the maximum amplitude level width of the limiter integrated value Sα during the period of selection of the delayed original 1-bit signal, using the subtractor 160.

This result of subtraction of addition remainder value Sβ is obtained by detecting, by the remainder value detector 164, the remainder value from the maximum amplitude level width of an addition signal obtained on adding the positive maximum amplitude level by the adder 163 to the limiter integrated value Sα of first integrator 51 having the limiter, and by subtracting the maximum signal level by the subtractor 165.

Subsequently, an addition signal $S_X$ by the adder 159 of the amplitude controller output $S_K$ obtained with the coefficient generator output $S_{J1}$ of the coefficient generator 122 in the amplitude controller 104 of FIG. 30 set to 1 and the amplitude controller output $S_V$ obtained with the coefficient of the coefficient generator 124 in the amplitude controller 110 set to 0, is fed via subtractor 160 to the ΣΔ modulator 151.

The switching controller 154 causes transition of the coefficient generator output $S_{J1}$ of the coefficient generator 122 in the amplitude controller 104 from 1 to 0, while causing transition of the coefficient generator output $S_{J2}$ of the coefficient generator 124 in the amplitude controller 110 from 0 to 1.

At a point after outputs of the amplitude controller 104 and the amplitude controller 110 become 0 and 1 (maximum amplitude level), respectively, by the cross-fading processing, the subtraction value detection timing generator 155 in the switching controller 154 generates a subtraction value detection timing signal. The subtraction value control gate 166 is responsive to the subtraction value detection timing signal to seize the remainder Sβ.

The subtraction value control gate 166 then gradually subtracts the remainder Sβ from the addition signal $S_X$ by the subtractor 160.

The switching controller 154 controls the switching from the ΣΔ modulator output SB to the delayed original 1-bit signal $S_C$ of the second channel through the pattern coincidence processing following delay of a pre-set number of samples.

30

Thus, if the 1-bit output signal outputted at an output terminal of the digital signal of the digital signal processing device 134 of the twelfth embodiment is restored via a low-pass filter to an analog audio signal, there is realized cross-fading from the original audio signal to the original audio signal of the second channel with noise suppression.

By using the result of subtraction of the addition remainder value Sβ, obtained on subtraction of the positive maximum amplitude level from the remainder value, as the value seized by the subtraction value control gate 151, the time of convergence to zero may be halved for realizing smother switching.

With the digital signal processing device of the present fifteenth embodiment, by setting the limit value of the first integrator having the limiter 151 to an integer number times, such as four times, the maximum amplitude level width, subtraction of the result of subtraction of the addition remainder value Sβ from the maximum amplitude level by the subtraction control gate 166 prior to switching control to the ΣΔ re-modulated 1-bit signal, is not required, such that cross-fading from the original audio signal of the first channel to the original audio signal of the second channel under noise suppression is realized even on limiter operation.

Figure 43:
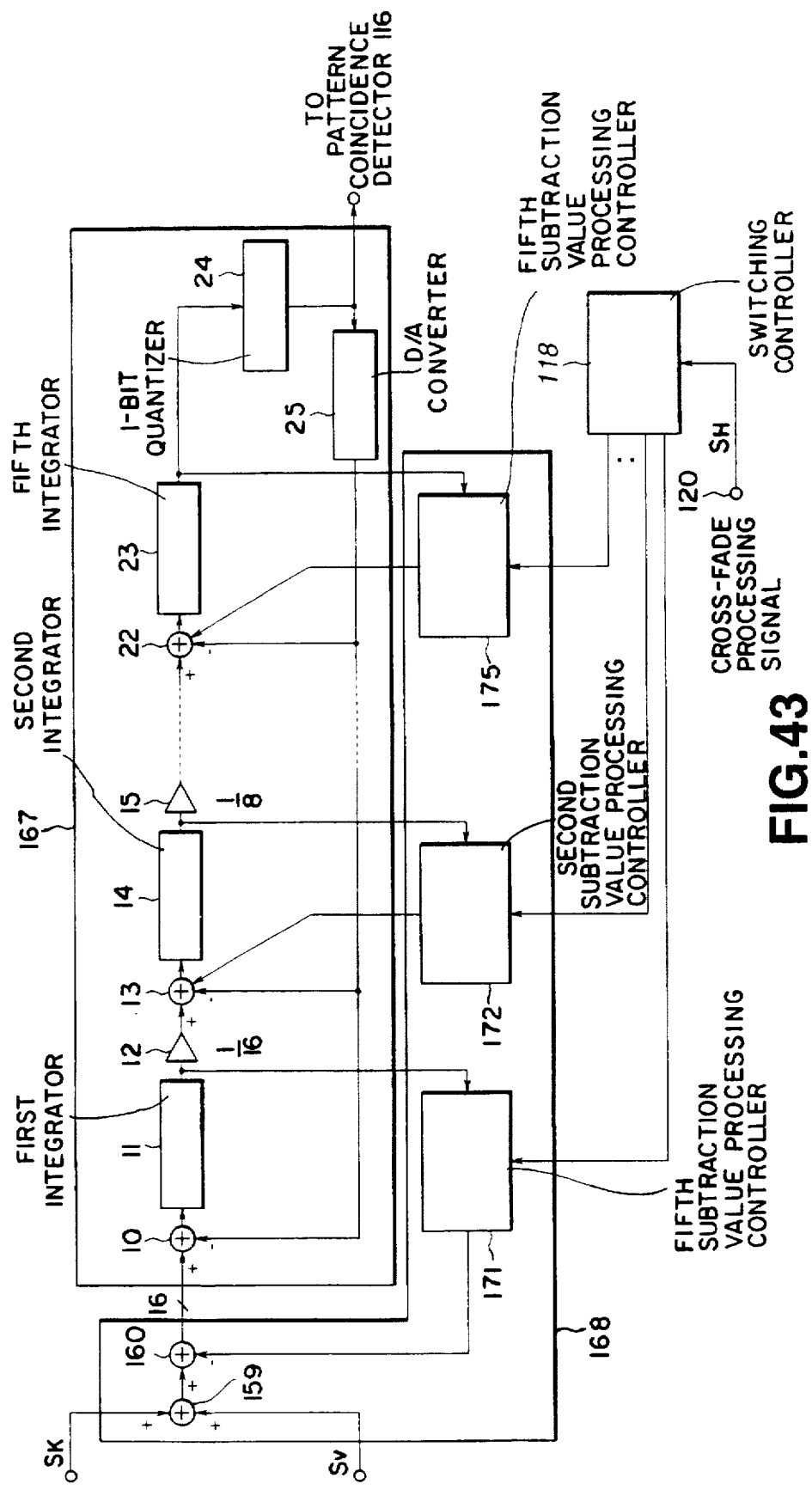
FIG. 43 is a timing chart for illustrating the operation of the sixteenth embodiment of the digital signal processing method and apparatus according to the present invention.
Figure 44:
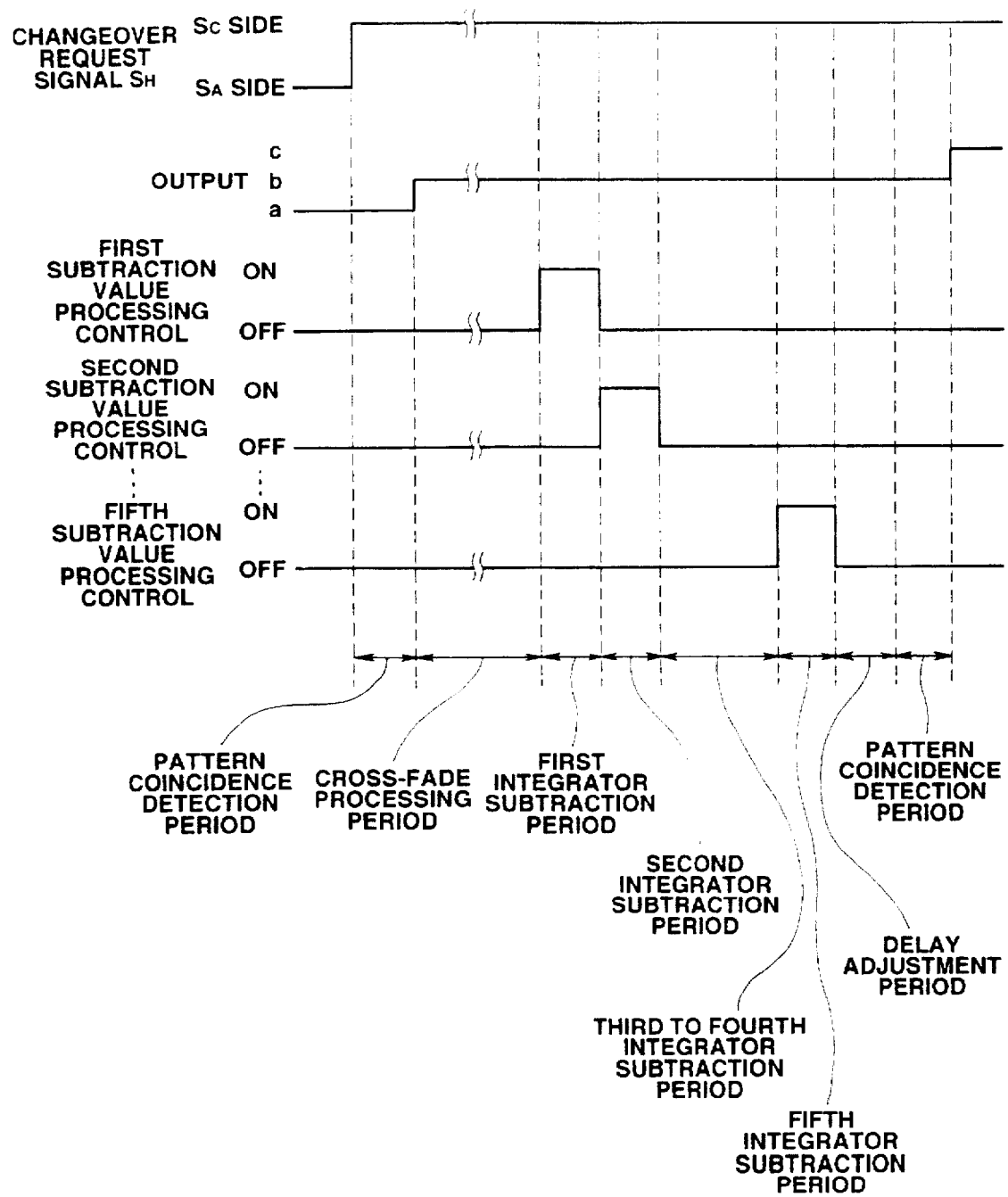
FIG. 44 is a timing chart for illustrating the operation of the sixteenth embodiment of FIG. 43.
Figure 45:
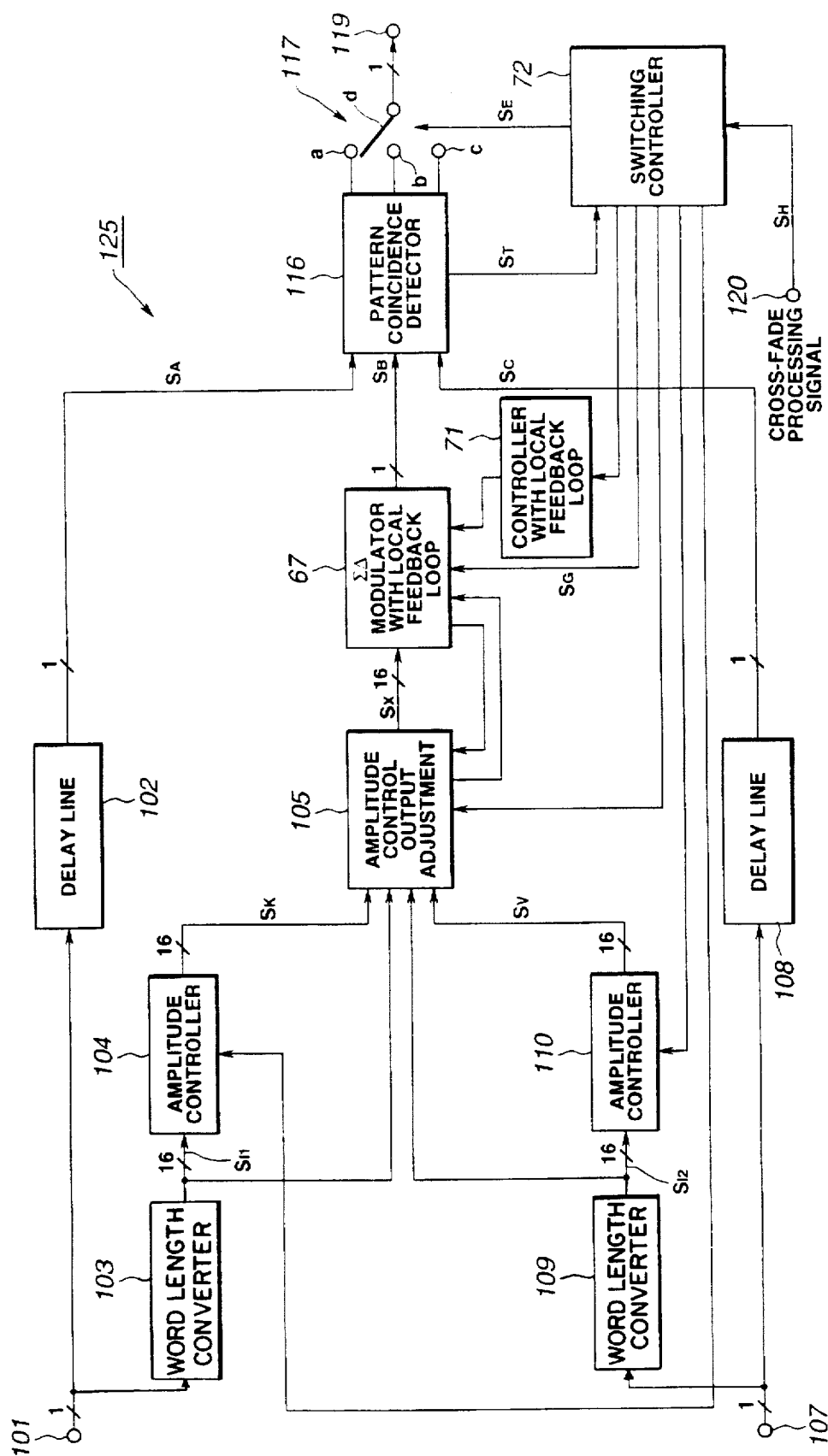
FIG. 45 is a timing chart for illustrating the operation of a digital signal processing method and apparatus according to the seventeenth embodiment according to the present invention.

Referring to FIGS. 43 and 44, a sixteenth embodiment is explained. The present sixteenth embodiment is directed to an arrangement of a switching device for two-channel ΣΔ modulated signal of the eighth embodiment in which, for constructing a subtraction value processing controller within the amplitude control output adjustment unit in FIG. 29, a remainder value detector is provided within the amplitude control output adjustment unit.

Thus the present embodiment is directed to such a device corresponding to the twelfth, thirteenth and fourteenth embodiments in which not only the integrated value of the first integrator but also the integrated values of the second and following integrators are used for controlling the subtraction of the integrated value in the integrator in each ΣΔ modulator in each digital signal processing device.

FIG. 43 shows an illustrative device for controlling the processing of subtraction values for the second and following integrators. Control outputs returned from the second subtraction value processing controller 172 through to the fifth subtraction value processing controller 175 are returned to the adders 13 through to 22 provided ahead of the integrators of the second and following stages of the integrators. In this case, subtraction value processing control occurs sequentially after subtraction processing in the first-stage first subtraction value processing controller 171 completely comes to a close. This is realized by the switching controller 171 supplying pulsed subtraction value processing control signals to the subtraction value processing controllers 171 through to 175 at the timing shown in FIG. 44. For example, in the case of the arrangement shown in FIG. 43, the reference value for detection of the remainder value in the remainder detector in the second subtraction value processing controller 172 is 1/16 of the reference for detection of the first-stage remainder value, while the reference value for detection of the remainder value in the remainder detector in the third subtraction stage is 1/128 (=(1/16)×(1/8)) of the reference for detection of the first-stage remainder.

Moreover, by using the ΣΔ modulator shown in FIG. 43, limiting processing becomes possible for the second and the following stages of the integrators by similar subtraction processing by the integrators with the limiters. In addition, by setting the limit values of the entire integrators to a value equal to an integer number times of the maximum amplitude level value, limiting processing free of subtraction is also realized. This may be applied to the tenth and eleventh embodiments.

Referring to FIG. 17, a seventeenth embodiment is explained. This seventeenth embodiment is directed to a digital signal processing device 125 designed for switching between two-channel ΣΔ modulated signals $S_A$, $S_C$ and a 1-bit signal $S_B$ obtained on ΣΔ re-modulating a signal $S_X$ by a ΣΔ modulator 67 having a local feedback loop shown in FIG. 26. The signal $S_X$, in turn, is obtained by amplitude-controlling these two-channel ΣΔ modulated signals $S_A$, $S_C$. The basic arrangement is similar to that of the digital signal processing device 100 shown in FIG. 29. The arrangement of the ΣΔ modulator and the peripheral circuitry are also shown in FIG. 47.

That is, the present digital signal processing device 125 includes two delay lines 102, 108, two bit length converters 103, 109, two amplitude controllers 104, 110 and an amplitude control output adjustment unit 105. The present digital signal processing device 125 also includes a ΣΔ modulator having a local feedback loop 67, a changeover switch 117, a switching controller 72, subtraction value processing controllers 68, 69 for the integrators, a pattern coincidence detector 116 and a local feedback loop controller 71.

Figure 46:
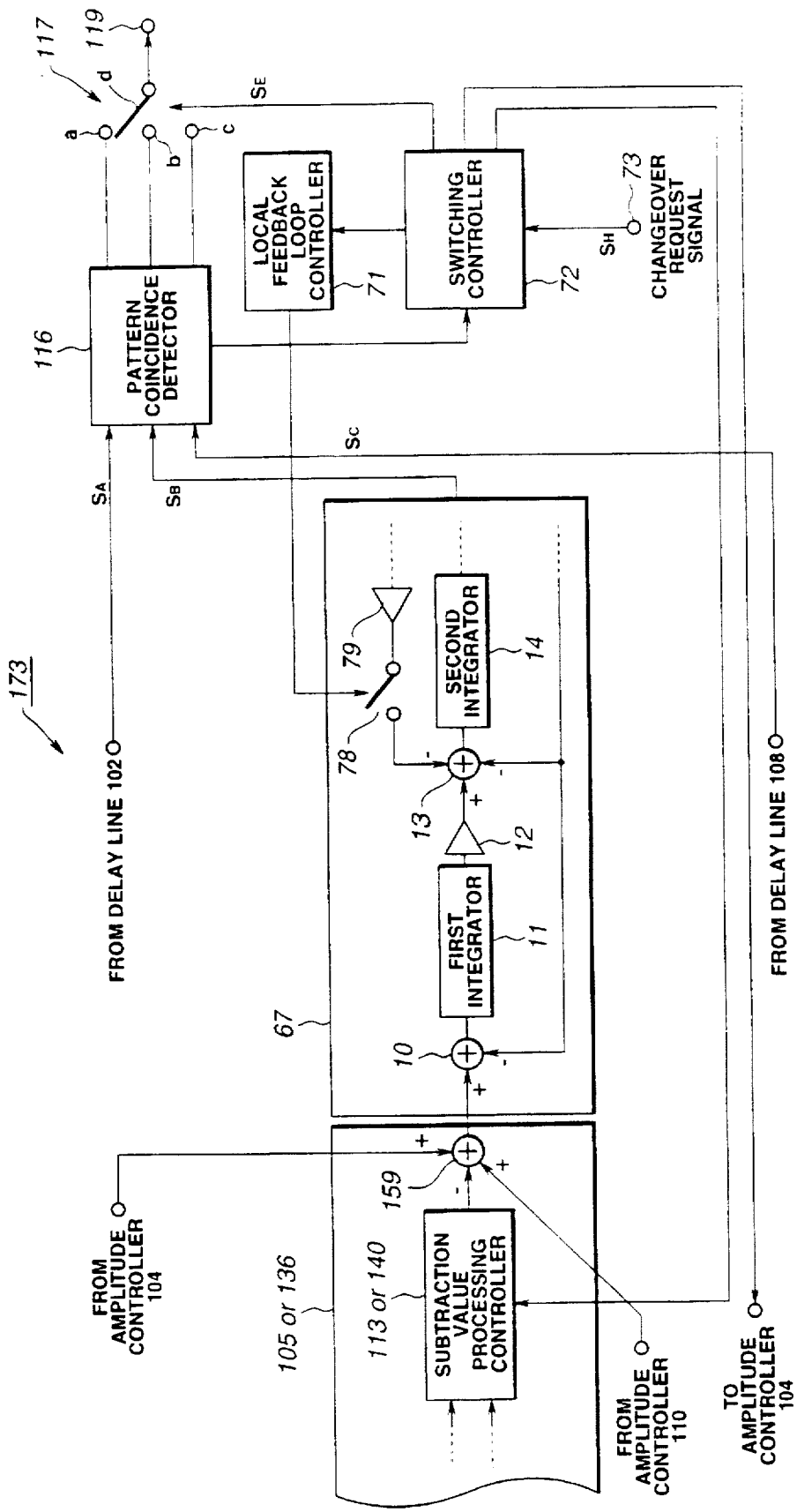
FIG. 46 is a block diagram showing another illustrative embodiment of the structure in the vicinity of a subtraction value calculating controller in an amplitude control output adjustment unit employed in the seventeenth embodiment.
Figure 47:
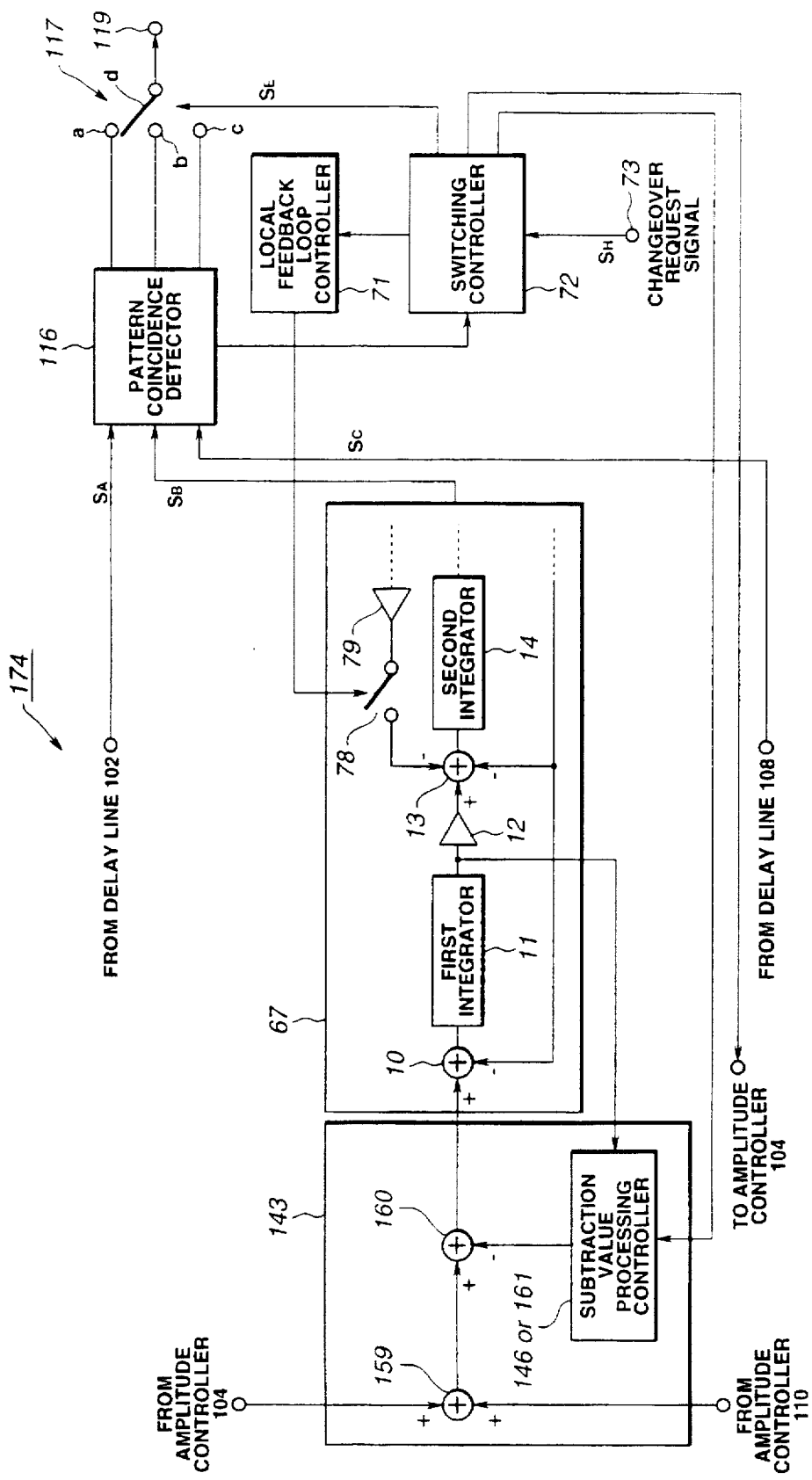
FIG. 47 is a block diagram showing still another illustrative embodiment of the structure in the vicinity of a subtraction value calculating controller in an amplitude control output adjustment unit employed in the seventeenth embodiment.
Figure 48:
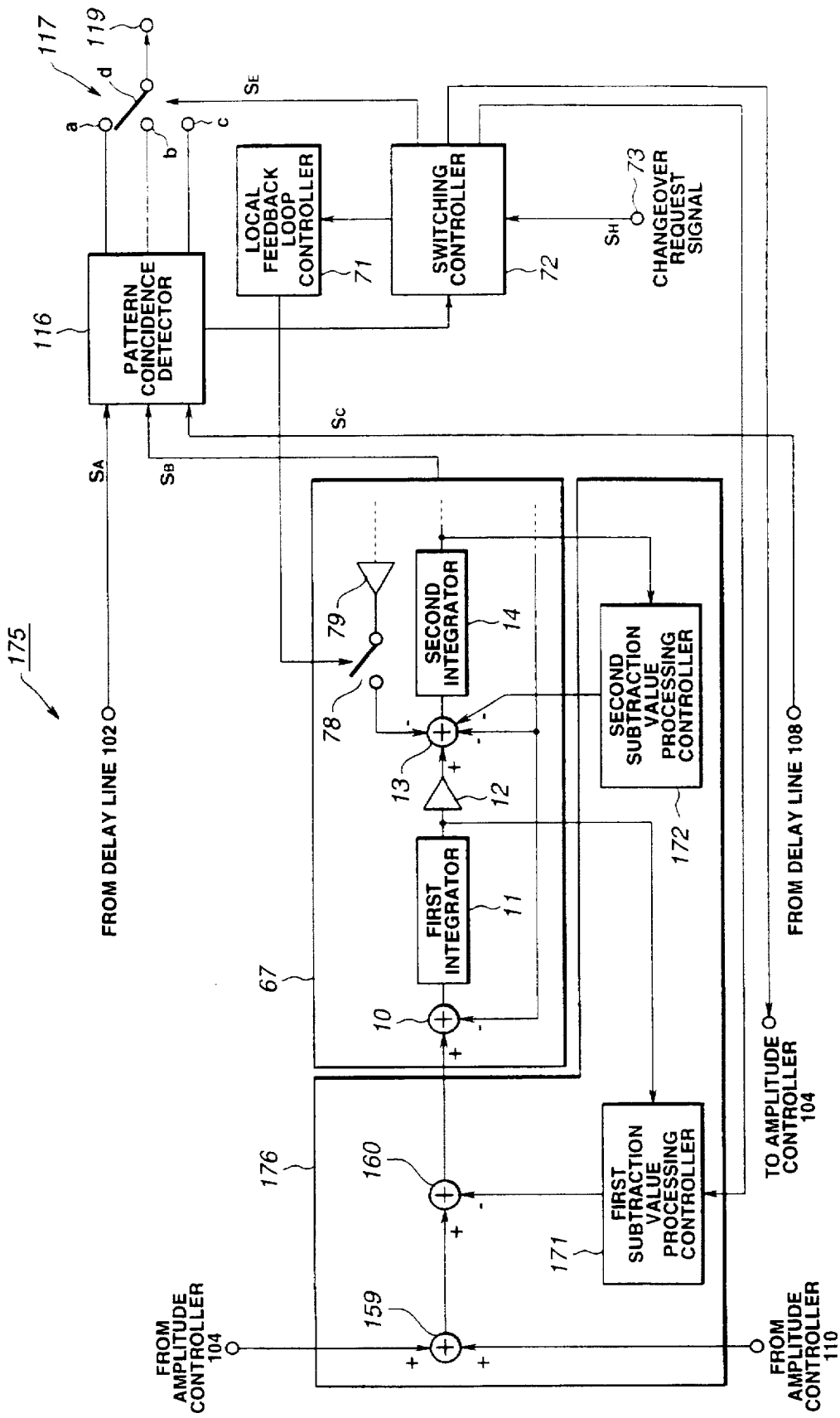
FIG. 48 is a block diagram showing yet another illustrative embodiment of the structure in the vicinity of a subtraction value calculating controller in an amplitude control output adjustment unit employed in the seventeenth embodiment.

The arrangement of the ΣΔ modulator having a local feedback loop 67 and the subtraction value processing controller in the amplitude control output adjustment unit may be configured as the ΣΔ modulator having a local feedback loop 67 in the digital signal processing devices 173, 174 and 175 and the amplitude control output adjustment units 105, 143 and 176 shown in FIGS. 46 to 48. Within the ΣΔ modulator having a local feedback loop 67 is provided a switch 78 for opening/closing the local feedback loop.

Figure 49:
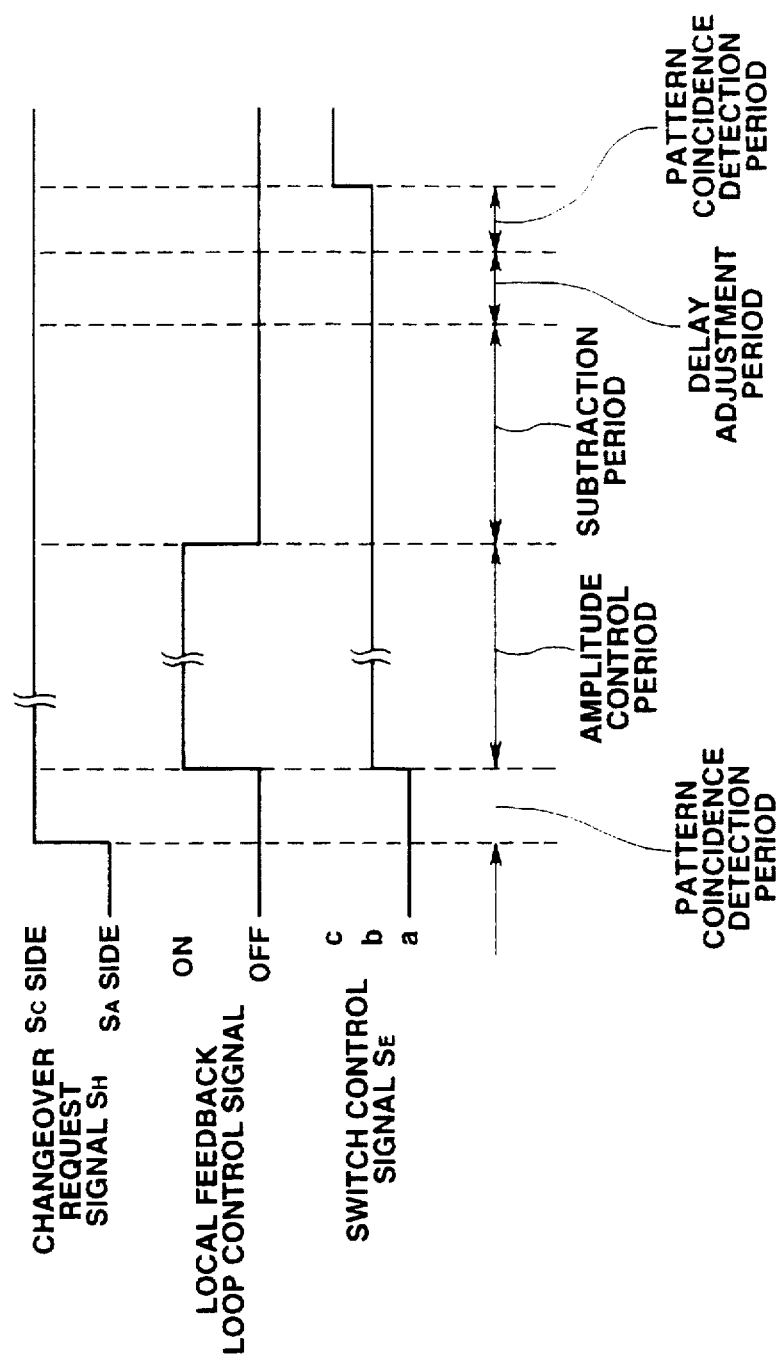
FIG. 49 is a timing chart for illustrating an example of the operation of the seventeenth embodiment of FIG. 45.

The operation of the digital signal processing device 125 is now explained by referring to the timing chart of FIG. 49.

During the time the delayed original 1-bit signal $S_A$ from the delay line 102 is selected by the changeover switch 117, the local feedback loop controller 71 opens the switch 78 for turning off the local feedback loop of the ΣΔ modulator having a local feedback loop 67 to inhibit local feedback. On reception of the switching request signal $S_H$ for switching from the original 1-bit signal $S_A$ from the original 1-bit signal $S_B$, for cross-fading, the switching controller 72 first detects pattern coincidence in the pattern coincidence detector 116 and then receives the switch control signal $S_E$ to cause the changeover switch 117 to switch from the original 1-bit signal $S_A$ to the signal $S_B$ of the ΣΔ modulator having a local feedback loop 67.

In response thereto, the local feedback loop controller 71 turns on the switch 78 to complete the local feedback loop of the ΣΔ modulator having a local feedback loop 67 to activate local feedback. Subsequently, the local feedback loop controller 71 undergoes the amplitude processing by the amplitude controllers 104, 110 to reach respective gain values of 0 and 1, respectively. The local feedback loop controller 71 then receive a switching request to the original 1-bit signal $S_C$ from the ΣΔ re-modulated signal $S_B$ to turn off the switch 78 to open the local feedback loop of the ΣΔ modulator having a local feedback loop 67 to terminate local feedback.

In response thereto, the switching controller 72 receives the switching control signal $S_E$ following subtraction processing by the subtraction value processing controller and the pattern coincidence detection processing, for realization of the noise-free switching, and causes the changeover switch 117 to switch from the ΣΔ re-modulated signal Sβ to the original 1-bit signal $S_C$.

Thus, if the 1-bit output signal derived from the output terminal 119 of the digital signal processing device 125 is restored by a low-pass filter through a low-pass filter, the listener can hear high-quality cross-faded sound from the original audio signal of the first channel to the original audio signal of the second channel.

Figure 50:
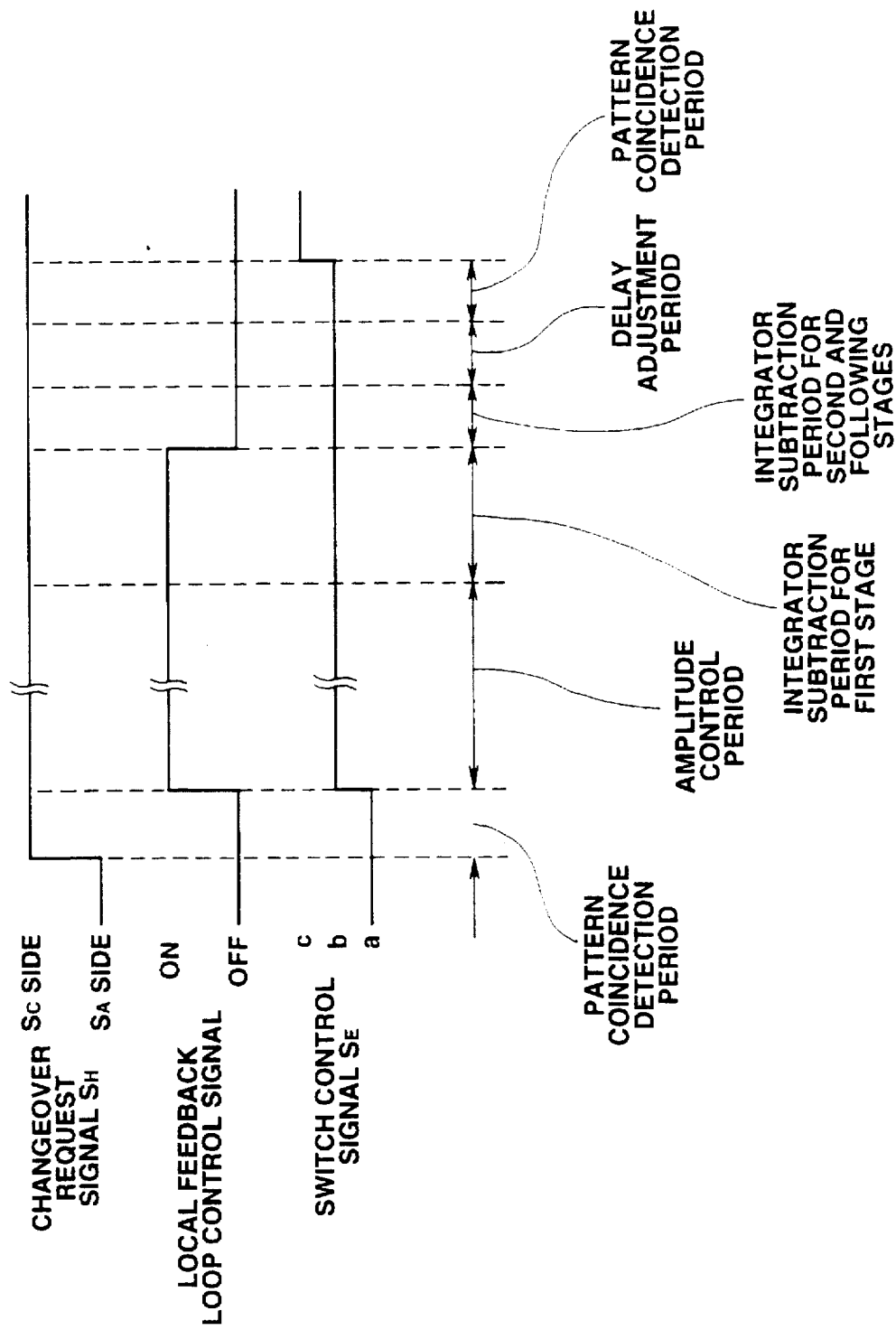
FIG. 50 is a timing chart for illustrating another example of the operation of the seventeenth embodiment of FIG. 45.

FIG. 50 illustrates, by a timing chart, another example of the on-of control by the switch 78 of local feedback of the ΣΔ modulator having a local feedback loop 67 by the local feedback loop controller 71.

The operation up to activation of the local feedback loop is the same as that shown in FIG. 49. After the local feedback loop controller 71 undergoes the amplitude processing by the amplitude controller 104, 110 to reach respective gain values of 0 and 1, respectively, the switching controller 72 receives a switching request to the original 1-bit signal $S_C$ from the ΣΔ re-modulated signal $S_B$ to perform subtraction processing for the first-stage integrator by the subtraction value processing controller or the first subtraction value processing controller 171.

The local feedback loop controller 71 then turns off the local feedback loop control signal and turns off the switch 78 to open the local feedback loop of the ΣΔ modulator having a local feedback loop 67 to terminate local feedback. If the device has second and following stages of the integrators as shown in FIG. 48, the local feedback loop controller 71 sequentially performs subtraction processing for the second and following stages of the integrators by the second and following stages of the subtraction value processing controllers and undergoes the pattern coincidence detection processing to receive the switch control signal SE to switch from the output $S_B$ of the ΣΔ re-modulator having local feedback loop to the original 1-bit signal $S_C$.

The control of the local feedback loop at the timing shown in FIG. 50 is effective for a modulator, as ΣΔ modulator having a local feedback loop 67, in which the local feedback loop is not connected to a point ahead of the initial stage integrator 11, such as a five-order ΣΔ modulator shown for example in FIG. 26. This realizes a ΣΔ re-modulated signal having a local feedback loop until directly before switching.

Figure 51:
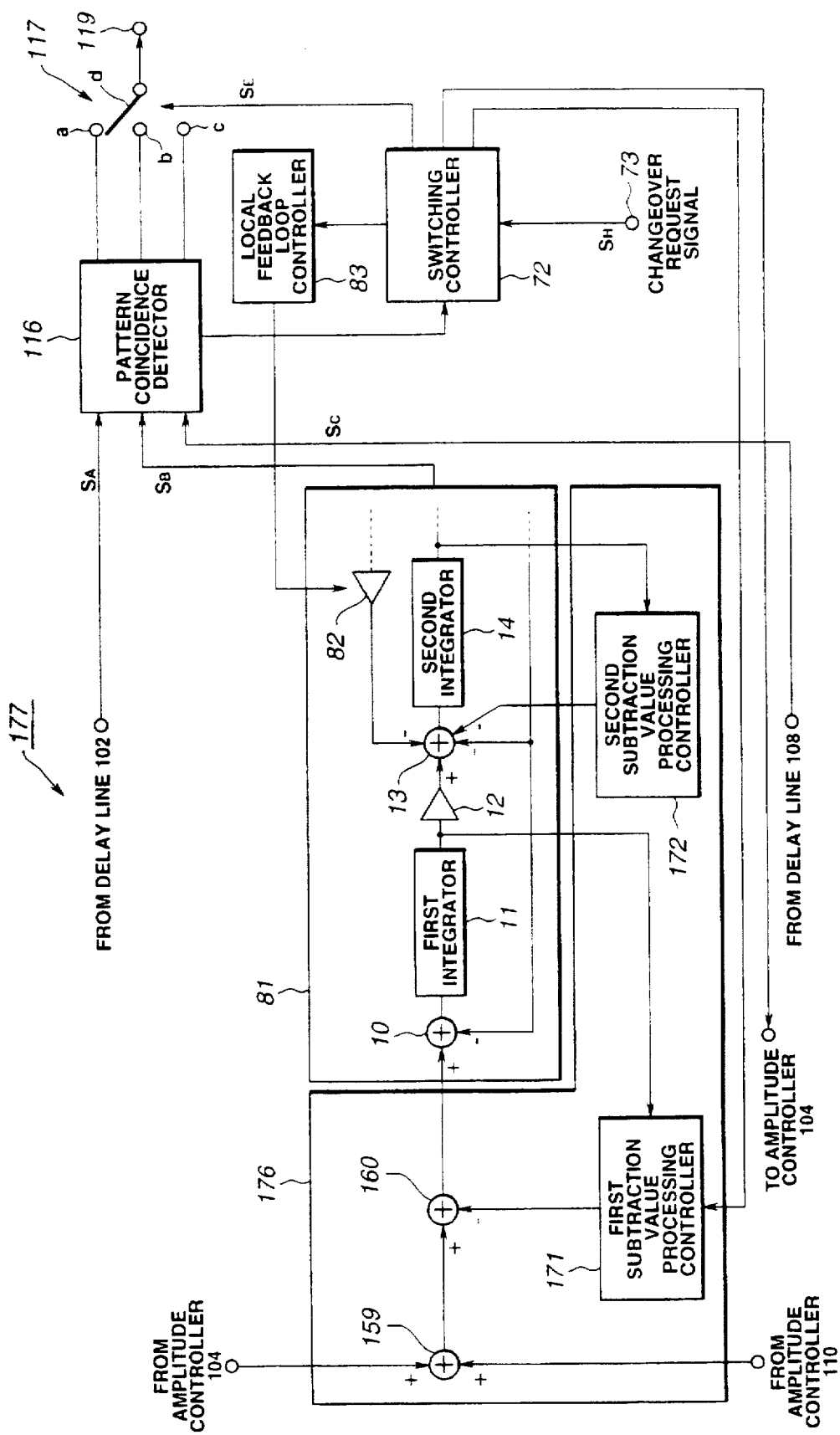
FIG. 51 is a block diagram showing a modification in which the $\Sigma\Delta$ modulator having the local feedback loop employed in the seventeenth embodiment is a $\Sigma\Delta$ modulator having the local feedback loop employing a variable gain multiplier.

The ΣΔ modulator having a local feedback loop 67 may be configured as shown in FIG. 51. That is, the feedback loop gain by the variable gain multiplier 82 of the ΣΔ modulator having a local feedback loop 81 may be variably controlled by the local feedback loop controller 83. Although the exceptional case of the device having plural stages of the subtraction value processing controllers configured as shown in FIG. 48 has been described in the above, this is not to be construed in the limiting sense.

Figure 52:
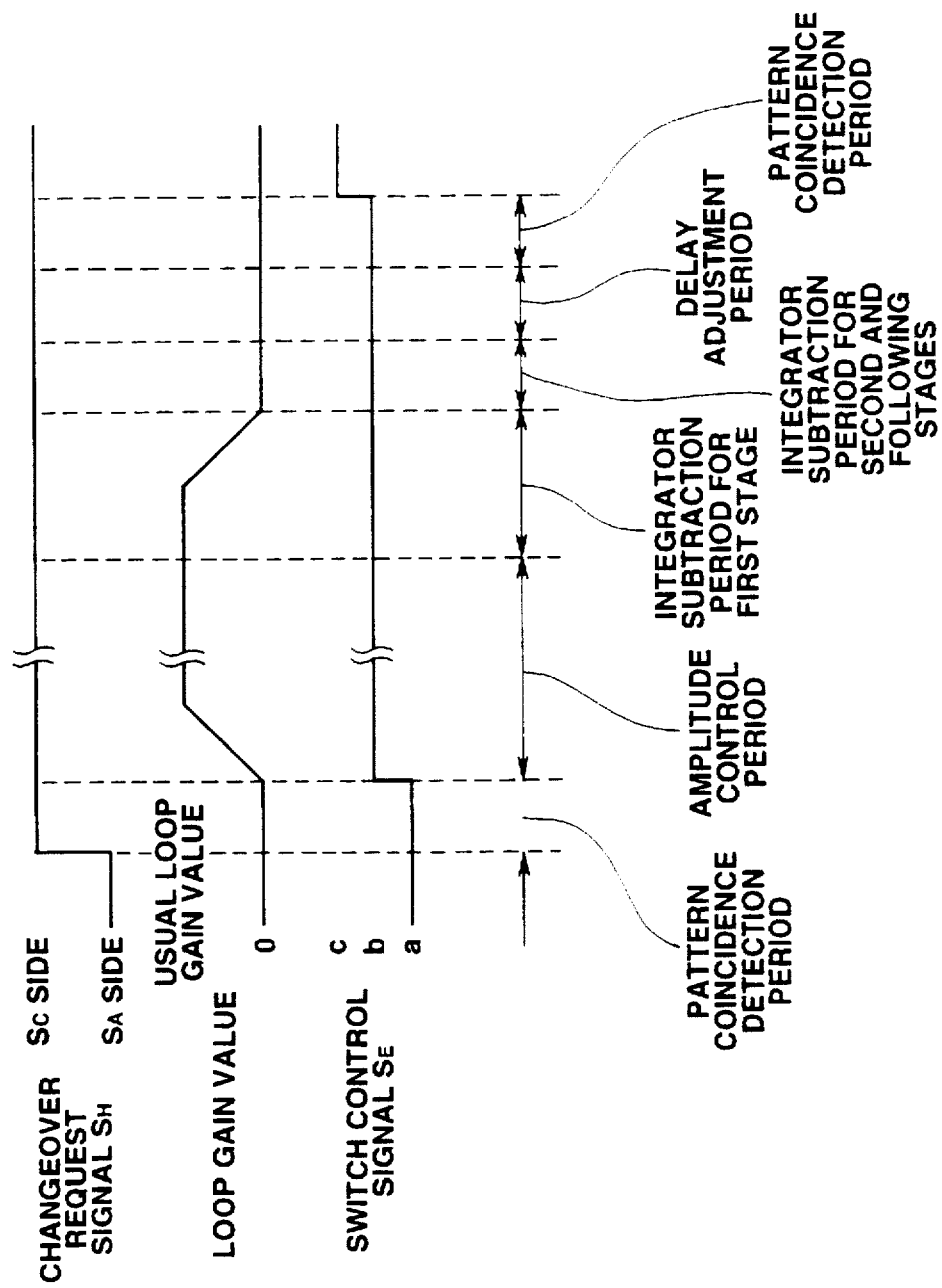
FIG. 52 is a timing chart for illustrating the operation of the modification shown in FIG. 47.

The operation for this case is explained by referring to the timing chart of FIG. 52. During the time the delayed original 1-bit signal is selected by the changeover switch 117, the local feedback loop controller 83 sets the loop gain value sent to the variable gain multiplier 82 of the local feedback loop of the ΣΔ modulator having a local feedback loop 81 to zero without performing local feedback. On reception of the switching request signal $S_H$ from the original 1-bit signal $S_A$ to the signal $S_C$, for cross-fading, the switching controller 72 first detects the pattern coincidence at the pattern coincidence detector 70 and then receives the switching control signal $S_E$ to cause the changeover switch 117 to switch from the original 1-bit signal $S_A$ to the output $S_B$ of the ΣΔ modulator having local feedback loop.

In response thereto, the local feedback loop 83 gradually varies the loop gain value to the variable gain multiplier 82 to a stationary loop gain value for activating the feedback to the ΣΔ modulator having local feedback loop 81. If, after the gain values are restored to 0 and 1 through the amplitude processing performed by the amplitude controllers 104, 110, respectively, the switching controller 72 receives a switching request from the ΣΔ re-modulated signal $S_B$ to the original 1-bit signal $S_C$, the switching controller 72 performs subtraction processing for the first-stage integrator by the subtraction value processing controller or the first subtraction value processing controller 171 for realizing noise-free switching. Simultaneously or with a slight time delay if the local feedback loop is not connected to a point ahead of the first-stage integrator, the local feedback loop controller 83 gradually diminishes the loop gain value to the variable gain multiplier 82 and ultimately to zero for opening the local feedback loop for terminating local feedback. If the device has second and following stages of the subtraction value processing controllers after cessation of the processing and local feedback, the local feedback loop controller 83 receives the switch control signal $S_E$ after sequentially performing subtraction processing for the second and following stage integrators by the second and following stage subtraction value processing controller 172 and the pattern coincidence detection processing to cause the switch 117 to switch from the output $S_B$ of the ΣΔ modulator having local feedback loop 81 to the original 1-bit signal $S_C$.

With the digital signal processing device 65, it is assumed that two local feedback loops are controlled simultaneously by an arrangement in which the five-order ΣΔ modulator has two local feedback loops. However, the same effect may be realized by controlling only the input side feedback loop. The similar effect may also be realized by setting the opening timing of the downstream side local feedback loop so as to be temporally after the end of the subtraction processing for the integrator upstream of the integrator to which is connected the feedback loop.

Although the five-order ΣΔ modulator shown in FIG. 26 is used in the digital signal processing device 65 as the ΣΔ modulator having the local feedback loop, there is no limitation to the number of orders or the number of feedback loops.

The ΣΔ modulator having the local feedback loop may be configured as shown in FIG. 51 for outputting variable loop gain from the local feedback controller 83 to the variable gain multiplier 82.

It is to be noted that the application shown as the switching device for an input obtained by a two-channel ΣΔ modulator can be applied to a device for scanning the amplitude of an input signal obtained by a single-channel ΣΔ modulation.

What is claimed is:

1. A digital signal processing apparatus including switching means for switching between a delayed sigma-delta modulated signal obtained by delaying an input sigma-delta modulated signal, and a sigma-delta re-modulated signal obtained by sigma-delta re-modulation of said input signal, comprising:

input signal delaying means for delaying said input sigma-delta modulated signal by a pre-set number of samples and for outputting said delayed sigma-delta modulated signal;

sigma-delta modulation processing means receiving said input sigma-delta modulated signal and having a plurality of integrators for producing said sigma-delta re-modulated signal;

level adjustment means for matching an amplitude level of said input sigma-delta modulated signal entering said sigma-delta modulation processing means to an amplitude level of a feedback signal fed to a first-stage integrator of said plurality of integrators of said sigma-delta modulation processing means; and switching control means for controlling the switching of said switching means.

2. The digital signal processing apparatus as claimed in claim 1, wherein a gain ratio between a first-stage feedback loop in said sigma-delta modulation processing means and the next-stage feedback loop is an integer, and wherein said pre-set number of samples of said input signal delay means is set based on said gain ratio.

3. The digital signal processing apparatus as claimed in claim 1, further comprising pattern coincidence detection means for detection of coincidence of said delayed sigma-delta modulated signal and the sigma-delta re-modulated signal over a plurality of samples, wherein said switching control means controls said switching means based on a of detection result obtained by said pattern coincidence detection means.

4. The digital signal processing apparatus as claimed in claim 1, wherein said switching control means sets an initial value of an integrator of said sigma-delta modulation processing means to zero directly before input of said input signal and/or during the time said delayed sigma-delta modulated signal from said input signal delaying means is selected by said switching means.

5. The digital signal processing apparatus as claimed in claim 1, further comprising amplitude control means for controlling an amplitude level of a level-adjusted signal having an amplitude level adjusted by said level adjustment means, wherein said switching control means causes said amplitude control means to control said amplitude level of said level-adjusted signal after causing said switching means to switch from said delayed input sigma-delta modulated signal from said input signal delaying means to said sigma-delta re-modulated signal obtained by sigma-delta modulation of said level-adjusted signal.

6. The digital signal processing apparatus as claimed in claim 1, further comprising:

error detection means for detecting an uncorrectable burst error in said sigma-delta modulated signal;

delaying means provided downstream of said error detection means for delaying said sigma-delta modulated signal;

fade-out means for fading out said sigma-delta modulated signal via said delaying means;

fade-in means for fading in said sigma-delta modulated signal via said delaying means; and control means for causing said fade-out means to fade out said sigma-delta modulated signal delayed by said delaying means immediately to a zero level directly before an uncorrectable burst error when said error detection means detects said uncorrectable burst error in said sigma-delta modulated signal, and said control means causing said fade-in means to fade in said sigma-delta modulated signal directly after said burst error up to the maximum amplitude level.

7. The digital signal processing apparatus as claimed in claim 6, wherein said fade-out means includes amplitude control means for controlling an amplitude level of the level-adjusted signal having an amplitude level adjusted by said level adjustment means, and wherein said fade-out means causes said amplitude control means to control said amplitude level of said level-adjusted signal to execute fade-out processing after said switching control means has caused said switching means to switch from said delayed sigma-delta modulated signal to said sigma-delta re-modulated signal.

8. The digital signal processing apparatus as claimed in claim 6, wherein said fade-in means includes:
- amplitude control means for controlling an amplitude level of the level-adjusted signal having an amplitude level adjusted by said level adjustment means;
- level difference detection means for detecting a difference between a maximum amplitude level of the level adjusted signal and an amplitude level of a level-controlled output during the time said amplitude control means controls said amplitude level of said level-adjusted signal;
- cumulative addition means for cumulatively adding said difference from said level difference detection means with a maximum amplitude level width length equal to twice the maximum amplitude level of said level-adjusted signal; and
- subtraction control means for gradually decreasing after amplitude control by said amplitude control means, the cumulative sum of said cumulative addition means from said maximum amplitude level of said level-adjusted signal,
- wherein said switching control means causes said switching means to switch from said sigma-delta re-modulated signal to said delayed sigma-delta re-modulated signal after the end of subtraction of said cumulative sum in said subtraction control means to execute fade-in.

9. The digital signal processing apparatus as claimed in claim 1, further comprising:
- amplitude control means for controlling an amplitude level of a level-adjusted signal having an amplitude level adjusted by said level adjustment means;
- level difference detection means for detecting a difference between a maximum amplitude level of the level-adjusted signal and an amplitude level of the output following amplitude control during the time said amplitude control means is controlling said amplitude level of said level-adjusted signal;
- cumulative addition means for cumulatively adding said difference from said level difference detection means with a maximum amplitude level width length equal to twice the maximum amplitude level of said level-adjusted signal; and
- subtraction control means for gradually subtracting a cumulative sum of said cumulative addition means from said maximum amplitude level of said level-adjusted signal after said amplitude control in said amplitude controlling means, wherein
- said switching control means causes said switching means to switch from said sigma-delta re-modulated signal to said delayed sigma-delta modulated signal after the end of subtraction of said cumulative sum in said subtraction control means.

10. The digital signal processing apparatus as claimed in claim 9, wherein when a first integrator of said sigma-delta modulation processing means includes limiter means for limiting an integrated value of said first integrator with a limiting value equal to an integer number times said maximum amplitude level width, said switching control means clears the cumulative sum of the cumulative addition means to zero during the time said limiter means is operating in a state in which said integrated value is larger than said limiting value.

11. The digital signal processing apparatus as claimed in claim 1, wherein said sigma-delta modulation processing means includes:
- a plurality of stages of serially-connected integrators; and
- a local feedback loop for feeding back an output of a last stage integrator to inputs of preceding stage integrators.

12. A digital signal processing device including switching means for switching between a two-channel sigma-delta modulated input signal, and a sigma-delta re-modulated signal derived from the input signal, comprising:
- sigma-delta modulation processing means having a plurality of integrators for producing said sigma-delta re-modulated signal;
- first input signal delaying means for delaying one of said two channels of said sigma-delta modulated input signal by a pre-set number of samples and for outputting a first delayed sigma-delta modulated signal;
- first level adjustment means for matching an amplitude level of said one of said two channels of said sigma-delta modulated input signal to an amplitude level of a feedback signal to a first-stage integrator of said plurality of integrators of said sigma-delta modulation processing means;
- first amplitude control means for controlling an amplitude level of said first level-adjusted signal having its amplitude level adjusted by said first level adjustment means;
- second input signal delaying means for delaying another one of said two channels of said sigma-delta modulated input signal by a preset number of samples and for outputting a second delayed sigma-delta modulated signal;
- second level adjustment means for matching an amplitude level of said other one of said two channels of said sigma-delta modulated input signal to said amplitude level of said feedback signal to said first-stage integrator of said plurality of integrators of said sigma-delta modulation processing means;
- second amplitude control means for controlling an amplitude level of said second level-adjusted signal having its amplitude level adjusted by said second level adjustment means;
- amplitude control output adjustment means for adjusting outputs of said first amplitude control means and said second amplitude control means; and
- switching control means for controlling said first amplitude control means, said second amplitude control means, said sigma-delta modulation processing means, said amplitude control output adjustment means, and said switching means, wherein
- said switching control means after switching from said one of said two channels of said input sigma-delta modulated signal to said sigma-delta re-modulated signal causes said first amplitude control means, said second amplitude control means, and said amplitude control output adjustment means to control amplitude levels of said one of said two channels of said sigma-delta modulated input signal and said other one of said two channels of said sigma-delta modulated input signal.

13. The digital signal processing apparatus as claimed in claim 12, wherein a gain ratio between an initial-stage feedback loop in said sigma-delta modulation processing means and the next-stage feedback loop is an integer, and wherein said pre-set number of samples of said input signal delay means is set based on said gain ratio.

14. The digital signal processing apparatus as claimed in claim 12, further comprising pattern coincidence detection means for detection of coincidence of said first delayed sigma-delta modulated signal and said sigma-delta re-modulated signal over a plurality of samples, and for detection of coincidence of said second delayed sigma-delta modulated signal and said sigma-delta re-modulated signal over a plurality of samples, wherein said first delayed sigma-delta modulated signal is switched to said sigma-delta re-modulated signal or vice versa based on a control signal obtained by said pattern coincidence detection means, and wherein said second delayed sigma-delta modulated signal is switched to said sigma-delta re-modulated signal or vice versa based on said control signal obtained by said pattern coincidence detection means.

15. The digital signal processing apparatus as claimed in claim 12, wherein said switching control means sets an initial value of an integrator of said sigma-delta modulation processing means to zero directly before input of said input signal and/or during the time said delayed signal from said first and second input signal delaying means is selected by said switching means.

16. The digital signal processing apparatus as claimed in claim 12, wherein said sigma-delta modulation processing means includes:
 a plurality of stages of integrators connected in series; and
 a local feedback loop for feeding back outputs of said plurality of stages of said integrators to inputs of preceding stages of said integrators.

17. The digital signal processing apparatus as claimed in claim 12, wherein said amplitude control output adjustment means includes subtraction means for subtracting a pre-set value from output signals obtained from said first and second amplitude control means.

18. The digital signal processing apparatus as claimed in claim 17, wherein said sigma-delta modulation processing means is comprised of at least one integrator, and wherein said amplitude control output adjustment means detects a remainder from a reference value for each stage of said sigma-delta modulation processing means, and determines a subtraction value in said subtraction means provided in an input stage of said integrator based on said detected remainder value.

19. The digital signal processing apparatus as claimed in claim 18, further comprising limiter means for limiting an integrated value of said at least one integrator in said sigma-delta modulation processing means.

20. The digital signal processing apparatus as claimed in claim 19, wherein when limiter means for limiting an integrated value in a first integrator of said sigma-delta modulation processing means are provided with remainder value detection means for detecting the remainder value from the maximum amplitude level width of a value derived from the limited integrated value of said first stage integrator in said sigma-delta modulation processing means, and subtraction control means for gradually subtracting the detected remainder value from the maximum amplitude level signal; said amplitude control output adjustment means before switching from said first delayed sigma-delta modulated signal to said sigma-delta re-modulated signal gradually subtracts said remainder value from the maximum amplitude level signal entering said sigma-delta modulation precessing means during the period the first delayed sigma-delta modulated signal is selected using said subtraction control means.

21. The digital signal processing apparatus as claimed in claim 20, wherein said remainder value detection means detects a remainder value from the maximum amplitude level width of a value obtained from summing the limited integrated value to the maximum amplitude level, and wherein said subtraction control means gradually subtracts the result of subtraction of the sum remainder obtained on subtracting the maximum amplitude level from the remainder value.

22. The digital signal processing apparatus as claimed in claim 18, wherein when controlling an integrated value of a second stage integrator and following stage integrators in said sigma-delta modulation processing means, said amplitude control output adjustment means causes said remainder value detection means in the pre-set stage to detect a remainder value from the maximum amplitude level width obtained on the basis of a product value ahead of the pre-set stage in said sigma-delta modulation processing means.

23. The digital signal processing apparatus as claimed in claim 22, wherein when gradually subtracting the remainder value detected by said remainder detection means by subtraction means provided at an input stage to said integrator, the subtraction is sequentially controlled beginning from the integrator on the input side, and wherein switching from an output of said sigma-delta modulation processing means to said second delayed sigma-delta modulated signal is performed by said switching means.

24. The digital signal processing apparatus as claimed in claim 17 or 23, wherein said sigma-delta modulation processing means includes:
 a plurality of stages of integrators connected in series;
 a local feedback loop for feeding back outputs of said plurality of stages of integrators to inputs of preceding stage integrators; and
 opening/closure means for said local feedback loop, wherein during the time said switching control means is selecting said first delayed sigma-delta modulated signal said opening/closure means opens said local feedback loop, and wherein when said switching control means selects the sigma-delta modulated signal after said sigma-delta re-modulation said opening/closure means closes said local feedback loops and wherein when the switching control means selects the delayed second sigma-delta modulated signal said opening/closure means opens said local feedback loop before a start of subtraction processing for the integrator to which is fed back the local feedback loop signal.

25. The digital signal processing apparatus as claimed in claim 18, wherein said amplitude control output adjustment means includes:
 remainder value detection means for detecting a remainder value from the maximum amplitude level width in a first-stage integrator of said sigma-delta modulation processing means; and
 subtraction control means for gradually subtracting said detected remainder value from the maximum amplitude level signal, wherein
 said switching control means after switching from said first delayed sigma-delta modulated signal to said sigma-delta re-modulated signal controls the operation of said first amplitude control means, the operation of said second amplitude control means, the operation of said subtraction control means, and causes said switching means to switch from an output of said sigma-delta modulation processing means to said second delayed sigma-delta modulated signal.

26. The digital signal processing apparatus as claimed in claim 25, wherein said remainder value detection means detects a remainder of the sum of the integrated value and the maximum amplitude level from the maximum amplitude level width, and wherein said subtraction control means gradually subtracts from the maximum amplitude level signal the result of subtraction of the addition remainder obtained by subtracting the maximum amplitude level from the remainder.

27. The digital signal processing apparatus as claimed in claim 18, further comprising limiter means for limiting an integrated value of a second and following stage integrators in said sigma-delta modulation processing means.

28. The digital signal processing apparatus as claimed in claim 17, wherein said amplitude control output adjustment means determines a subtraction value for said subtraction means based on an accumulated value of a difference between said amplitude level controlled by said amplitude control means and a maximum amplitude level obtained by said level adjustment means.

29. The digital signal processing apparatus as claimed in claim 28, wherein said amplitude control output adjustment means includes:
   level difference detection means for detecting a difference between said first level-adjusted signal and an output level after amplitude control by said first amplitude control means during the period when said first amplitude control means controls said amplitude level of said first level-adjusted signal;
   cumulative addition means for cumulatively adding said difference from said level difference detection means and said output level after control of the amplitude level of the second level-adjusted signal by the second amplitude control means with the amplitude level width lengths of said first and second level-adjusted signals; and
   subtraction control means for controlling said subtraction means for gradually subtracting the cumulative sum of said cumulative addition means from an output signal of said amplitude control means.

30. The digital signal processing apparatus as claimed in claim 29, wherein said switching control means after switching from said first delayed sigma-delta modulated signal to said sigma-delta re-modulated signal controls the operation of said first amplitude control means, the operation of said second amplitude control means, the operation of said subtraction control means, and causes said switching means to switch from an output of said sigma-delta modulation processing means to said second delayed sigma-delta modulated signal.

31. The digital signal processing apparatus as claimed in claim 30, wherein when limiter means are provided in a first integrator of said sigma-delta modulation processing means for limiting an integrated value of said first integrator to a limiter value equal to an integer number times the maximum level width, said switching control means clears the cumulative sum value of the cumulative addition means to zero during the time said limiter means is operating with an integrated value larger than said limiter value.

32. The digital signal processing apparatus as claimed in claim 28, wherein said amplitude control output adjustment means includes:
   level difference detection means for detecting a difference between said second level-adjusted signal and an output level amplitude-controlled by said second amplitude control means during the period when said second amplitude control means is controlling the amplitude level of said second level adjusted signal; and
   cumulative addition means for cumulatively adding said difference from said level difference detection means and an output level obtained after said first amplitude control means has adjusted the amplitude level of said first level-adjusted means with an amplitude level width lengths of said first and second level adjusted signals.

33. The digital signal processing apparatus as claimed in claim 32, wherein said switching control means after switching from said first delayed sigma-delta modulated signal to said sigma-delta re-modulated signal controls the operation of said first amplitude control means, the operation of said second amplitude control means, the operation of said subtraction control means, and causes said switching means to switch from an output of said sigma-delta modulation processing means to said second delayed sigma-delta modulated signal.

34. The digital signal processing apparatus as claimed in claim 33, wherein when limiter means are provided in a first integrator of said sigma-delta modulation processing means for limiting an integrated value of said first integrator to a limiter value equal to an integer number times the maximum level width, said switching control means clears the cumulative sum value of the cumulative addition means to zero during the time said limiter means is operating with an integrated value larger than said limiter value.

35. The digital signal processing apparatus as claimed in claim 12, wherein when limiter means for limiting the integrated value are provided in an integrator of said sigma-delta modulation processing means, a limiter value of the limiting means is selected to be an integer number times the maximum amplitude level width.

36. The digital signal processing apparatus as claimed in claim 12, further comprising mute pattern signal generating means in one of the two channels.

37. A digital signal processing method including a switching step of switching between a delayed sigma-delta modulated signal obtained by delaying an input sigma-delta modulated signal obtained by a sigma-delta modulation processing and a sigma-delta re-modulated signal obtained by a second sigma-delta conversion processing on the input signal, comprising:
   an input signal delaying step of delaying said input sigma-delta modulated signal by a pre-set number of samples, and outputting said delayed sigma-delta modulated signal;
   a sigma-delta modulating step for producing said sigma-delta re-modulated signal using a plurality of integrators;
   a level adjustment step for matching an amplitude level of said input sigma-delta modulated signal entering said sigma-delta modulating step to an amplitude level of a feedback signal to a first-stage integrator of said plurality of integrators used in said sigma-delta modulating step; and
   a switching control step for controlling said switching step.

38. The digital signal processing method as claimed in claim 37, further comprising an amplitude controlling step for controlling an amplitude level the level-adjusted signal having an amplitude level adjusted in said level adjustment step, wherein said switching control step causes said switching step to switch said delayed sigma-delta modulated signal in the input signal delaying step to said sigma-delta re-modulated signal obtained by sigma-delta modulation of the level-adjusted signal, and wherein said switching control step then causes said amplitude control step to control said amplitude of said level-adjusted signal.

39. A digital signal processing method including a switching step for switching between a two-channel sigma-delta modulated input signal, and a sigma-delta re-modulated signal derived from the input signal, comprising:

a sigma-delta modulation processing step using a plurality of integrators for producing said sigma-delta re-modulated signal;

a first input signal delaying step for delaying one of said two channels of said sigma-delta modulated input signal by a pre-set number of samples and for outputting a first delayed sigma-delta re-modulated signal;

a first level adjustment step for matching an amplitude level of said one of said two channels of said sigma-delta modulated input signal to an amplitude level of a feedback signal to a first-stage integrator of said plurality of integrators of said sigma-delta modulation processing step;

a first amplitude control step for controlling an amplitude level of said first level-adjusted signal having its amplitude level adjusted in said first level adjustment step;

a second input signal delaying step for delaying another one of said two channels of said sigma-delta modulated input signal by a pre-set number of samples and for outputting a second delayed sigma-delta modulated signal;

a second level adjustment step for matching an amplitude level of said other one of said two channels of said sigma-delta modulated input signal to said amplitude level of said feedback signal to said first-stage integrator of said plurality of integrators of said sigma-delta modulation processing step;

a second amplitude control step for controlling an amplitude level of said second level-adjusted signal having an amplitude level thereof adjusted in the second level adjustment step;

an amplitude control output adjustment step for adjusting outputs of said first amplitude control step and said second amplitude control step; and a switching control step for controlling said first amplitude control step, said second amplitude control step, said sigma-delta modulation processing step, said amplitude control output adjustment step, and said switching step, wherein said switching control step after switching from said one of said two channels of said sigma-delta modulated input signal to said sigma-delta re-modulated signal causes said first amplitude control step, said second amplitude control step, and said amplitude control output adjustment step to control amplitude levels of said one of said two channels of said sigma-delta modulated input signal and said other one of said two channels of said sigma-delta modulated input signal.

\* \* \* \* \*